US012282749B2

(12) United States Patent
Ware et al.

(10) Patent No.: US 12,282,749 B2
(45) Date of Patent: Apr. 22, 2025

(54) CONFIGURABLE MAC PIPELINES FOR FINITE-IMPULSE-RESPONSE FILTERING, AND METHODS OF OPERATING SAME

(71) Applicant: Analog Devices, Inc., Wilmington, MA (US)

(72) Inventors: Frederick A. Ware, Los Altos Hills, CA (US); Cheng C. Wang, San Jose, CA (US)

(73) Assignee: Analog Devices, Inc., Wilmington, MA (US)

( * ) Notice: Subject to any disclaimer, the term of this patent is extended or adjusted under 35 U.S.C. 154(b) by 934 days.

(21) Appl. No.: 17/391,082

(22) Filed: Aug. 2, 2021

(65) Prior Publication Data
US 2022/0057994 A1 Feb. 24, 2022

Related U.S. Application Data

(60) Provisional application No. 63/067,979, filed on Aug. 20, 2020.

(51) Int. Cl.
*G06F 7/544* (2006.01)
*H03H 17/00* (2006.01)

(52) U.S. Cl.
CPC .... *G06F 7/5443* (2013.01); *G06F 2207/3884* (2013.01); *G06F 2207/4812* (2013.01); *H03H 2017/0081* (2013.01)

(58) Field of Classification Search
CPC ............. G06F 7/544; G06F 2207/3884; G06F 2207/4812; H03H 2017/0081
(Continued)

(56) References Cited

U.S. PATENT DOCUMENTS 4,958,312 A 9/1990 Ang et al.
6,115,729 A 9/2000 Matheny et al.
(Continued)

FOREIGN PATENT DOCUMENTS

EP 0405726 3/1999
EP 2280341 6/2013
WO WO 2018/126073 7/2018

OTHER PUBLICATIONS

International Bureau of World Intellectual Property Organization (WIPO), International Preliminary Report on Patentability dated Mar. 2, 2023 in International Application No. PCT/US2021/044118, 8 pages.
(Continued)

*Primary Examiner* — Tan V Mai
(74) *Attorney, Agent, or Firm* — DLA PIPER LLP (US)

(57) ABSTRACT

An integrated circuit comprising a plurality MAC pipelines wherein each MAC pipeline includes: (i) a plurality of MACs connected in series and (ii) a plurality of data paths including an accumulation data path, wherein each MAC includes a multiplier to multiply to generate product data and an accumulator to generate sum data. The integrated circuit further comprises a plurality of control/configure circuits, wherein each control/configure circuit connects directly to and is associated with a MAC pipeline, wherein each control/configure circuit includes an accumulation data path which is configurable to directly connect to the accumulation data path of the MAC pipeline to form an accumulation ring when the control/configure circuit is configured in an accumulation mode, and an output data path configurable to directly connect to the output of the accumulation data path of the MAC pipeline when the control/configure circuit is configured in an output data mode.

14 Claims, 50 Drawing Sheets

(58) Field of Classification Search
USPC .......................................................... 708/200
See application file for complete search history.

(56) References Cited

U.S. PATENT DOCUMENTS

| | | | |
|---|---|---|---|
| 6,148,101 | A | 11/2000 | Tanaka et al. |
| 6,298,366 | B1 | 10/2001 | Gatherer et al. |
| 6,538,470 | B1 | 3/2003 | Langhammer et al. |
| 7,107,305 | B2 | 9/2006 | Deng et al. |
| 7,299,342 | B2 | 11/2007 | Nilsson et al. |
| 7,346,644 | B1 | 3/2008 | Langhammer et al. |
| 7,698,358 | B1 | 4/2010 | Langhammer et al. |
| 8,051,124 | B2 | 11/2011 | Salama et al. |
| 8,266,199 | B2 | 9/2012 | Langhammer et al. |
| 8,645,450 | B1 | 2/2014 | Choe et al. |
| 8,751,551 | B2 | 6/2014 | Streicher et al. |
| 8,788,562 | B2 | 7/2014 | Langhammer et al. |
| 9,600,278 | B1 | 3/2017 | Langhammer |
| 11,314,504 | B2 | 4/2022 | Ware et al. |
| 2003/0172101 | A1 | 9/2003 | Liao et al. |
| 2005/0144215 | A1 | 6/2005 | Simkins et al. |
| 2007/0239967 | A1 | 10/2007 | Dally et al. |
| 2008/0211827 | A1 | 9/2008 | Donovan et al. |
| 2009/0094303 | A1 | 4/2009 | Katayama |
| 2014/0019727 | A1 | 1/2014 | Zhu et al. |
| 2014/0281370 | A1 | 9/2014 | Kahn |
| 2017/0011288 | A1 | 1/2017 | Brothers et al. |
| 2017/0115958 | A1 | 4/2017 | Langhammer |
| 2017/0116693 | A1 | 4/2017 | Rae et al. |
| 2017/0214929 | A1 | 7/2017 | Susnow et al. |
| 2017/0315778 | A1 | 11/2017 | Sano |
| 2017/0322813 | A1 | 11/2017 | Langhammer |
| 2017/0344876 | A1 | 11/2017 | Brothers |
| 2018/0052661 | A1 | 2/2018 | Langhammer |
| 2018/0081632 | A1 | 3/2018 | Langhammer |
| 2018/0081633 | A1 | 3/2018 | Langhammer |
| 2018/0157961 | A1 | 6/2018 | Henry et al. |
| 2018/0189651 | A1 | 7/2018 | Henry et al. |
| 2018/0300105 | A1 | 10/2018 | Langhammer |
| 2018/0314492 | A1 | 11/2018 | Fais et al. |
| 2018/0321909 | A1 | 11/2018 | Langhammer |
| 2018/0321910 | A1 | 11/2018 | Langhammer et al. |
| 2018/0341460 | A1 | 11/2018 | Langhammer |
| 2018/0341461 | A1 | 11/2018 | Langhammer |
| 2019/0042191 | A1 | 2/2019 | Langhammer |
| 2019/0042244 | A1 | 2/2019 | Henry et al. |
| 2019/0042544 | A1 | 2/2019 | Kashyap et al. |
| 2019/0079728 | A1 | 3/2019 | Langhammer et al. |
| 2019/0196786 | A1 | 6/2019 | Langhammer |
| 2019/0243610 | A1 | 8/2019 | Lin et al. |
| 2019/0250886 | A1 | 8/2019 | Langhammer |
| 2019/0286417 | A1 | 9/2019 | Langhammer |
| 2019/0310828 | A1 | 10/2019 | Langhammer et al. |
| 2019/0324722 | A1 | 10/2019 | Langhammer |
| 2019/0340489 | A1 | 11/2019 | Mills |
| 2019/0392297 | A1 | 12/2019 | Lau et al. |
| 2020/0004506 | A1 | 1/2020 | Langhammer et al. |
| 2020/0026493 | A1 | 1/2020 | Streicher et al. |
| 2020/0076435 | A1 | 3/2020 | Wang |
| 2020/0097799 | A1 | 3/2020 | Divakar et al. |
| 2020/0174750 | A1 | 6/2020 | Langhammer |
| 2020/0202198 | A1 | 6/2020 | Lee et al. |
| 2020/0310818 | A1 | 10/2020 | Ware et al. |
| 2020/0326939 | A1 | 10/2020 | Ware et al. |
| 2020/0326948 | A1 | 10/2020 | Langhammer |
| 2020/0401414 | A1 | 12/2020 | Ware et al. |
| 2021/0073171 | A1* | 3/2021 | Master ................. G06F 7/523 |
| 2021/0081211 | A1 | 3/2021 | Wang |
| 2021/0103630 | A1 | 4/2021 | Ware et al. |
| 2021/0132905 | A1 | 5/2021 | Ware et al. |
| 2021/0173617 | A1 | 6/2021 | Ware et al. |
| 2021/0326286 | A1 | 10/2021 | Ware et al. |
| 2022/0027152 | A1 | 1/2022 | Ware et al. |

OTHER PUBLICATIONS

International Search Report and Written Opinion of International Searching Authority re: re: PCT/US2020/024808, mailed Dec. 30, 2021, 11 pages.

Zhao et al., "A Fast Algorithm for Reducing the Computation Complexity of Convolutional Neural Networks", Algorithms 2018, 11, 159; doi:10.3390/a11100159; www. Mdpi.com/journal/algorithms, 11 pages, Oct. 2018.

Liang Yun, et al., "Evaluating Fast Algorithms for Convolutional Neural Networks on FPGAs", IEEE Transactions on Computer-Aided Design of Integrated Circuits and Systems, vol. 39, No. 4, Feb. 5, 2019, 14 pages (Note: The date identified on the article attached is Mar./Apr. 2020).

Priyanka Nain, "Multiplier-Accumulator (MAC) Unit", IJDACR, vol. 5, Issue 3, Oct. 2016, 4 pages.

Jebashini et al., "A Survey and Comparative Analysis of Multiply-Accumulate (MAC) Block for Digital Signal Processing Application on ASIC and FPGA", Journal of Applied Science, vol. 15, Issue 7, pp. 934-946, Jul. 2015.

Agrawal et al., "A 7nm 4-Core AI Chip with 25.6TFLOPS Hybrid FP8 Training, 102.4TOPS INT4 Inference and Workload-Aware Throttling", ISSCC, pp. 144-145, 2021.

Linley Gwennap, "IBM Demonstrates New AI Data Types", Microprocessor Report, Apr. 2021.

Choi et al., "Accurate and Efficient 2-Bit Quantized Neural Networks", Proceedings of $2^{nd}$ SysML Conf, 2019, 12 pages.

Sun et al., "Hybrid 8-bit Floating Point (HFP8) Training and Inference for Deep Neural Networks", NeurIPS 2019, 10 pages.

"NVidia A100 Tensor Core GPU Architecture", v1.0, 2020, 82 pages.

Papadantonakis et al., "Pipelining Saturated Accumulation", IEEE, vol. 58, No. 2, pp. 208-219, Feb. 2009.

* cited by examiner

In one embodiment, each single m-MAC execution pipeline has its own L0 SRAM memory, and each 16 x m-MAC cluster includes a shared L1 SRAM memory. The shift-in and shift-out paths of each m-MAC execution pipeline is coupled to the L2 SRAM memory. The L2 memory also couples to the L1/L0 memories. In one embodiment m=64, as illustrated.

A network-on-chip (NOC) couples the L2 memory to the PHY (physical interface) for the L3 memory (external DRAM component(s)). The NOC also couples to a PCIe PHY which, in turn, couples to an external host. Notably, in one embodiment, the NOC also couples to GPIO input/output PHYs, which allow multiple X1 components to be operated concurrently.

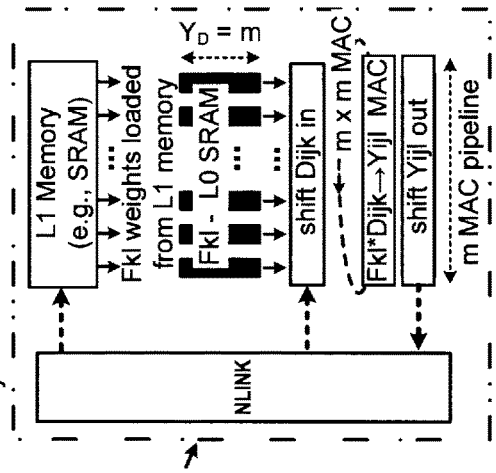

Real FIR filter (general expression – real D/F/Y)

$$Y[u] = \sum_{v=0}^{vmax} (F[vmax-v] * D[u-v])$$

Definition of signal values

D[u] = real input values for u={0,1,...umax}
Y[u] = real output values for u={0,1,...umax}
F[v] = real filter values for v={0,1,...vmax}

FIG. 3B

Real FIR filter (4-tap exemplary embodiment – i.e., Vmax = 3)

Complex FIR filter (general expression -- complex D/F/Y)

$$Y[u] = \sum_{v=0}^{vmax} (F[vmax-v] * D[u-v]) - (G[vmax-v] * E[u-v])$$

$$Z[u] = \sum_{v=0}^{vmax} (F[vmax-v] * E[u-v]) + (G[vmax-v] * D[u-v])$$

Definition of signal values $D[u] + i*E[u]$ = complex input values for $u=\{0,1,...umax\}$
$Y[u] + i*Z[u]$ = complex output values for $u=\{0,1,...umax\}$
$F[v] + i*G[v]$ = complex filter values for $v=\{0,1,...vmax\}$
$i = \sqrt{(-1)}$

FIG. 3D

Complex FIR filter (2-tap exemplary embodiment -- i.e., Vmax = 1):

$Y[u] = (F[1] * D[u]) - (G[1] * E[u]) + (F[0] * D[u-1]) - (G[0] * E[u-1])$
$Z[u] = (F[1] * E[u]) + (G[1] * D[u]) + (F[0] * E[u-1]) + (G[0] * D[u-1])$

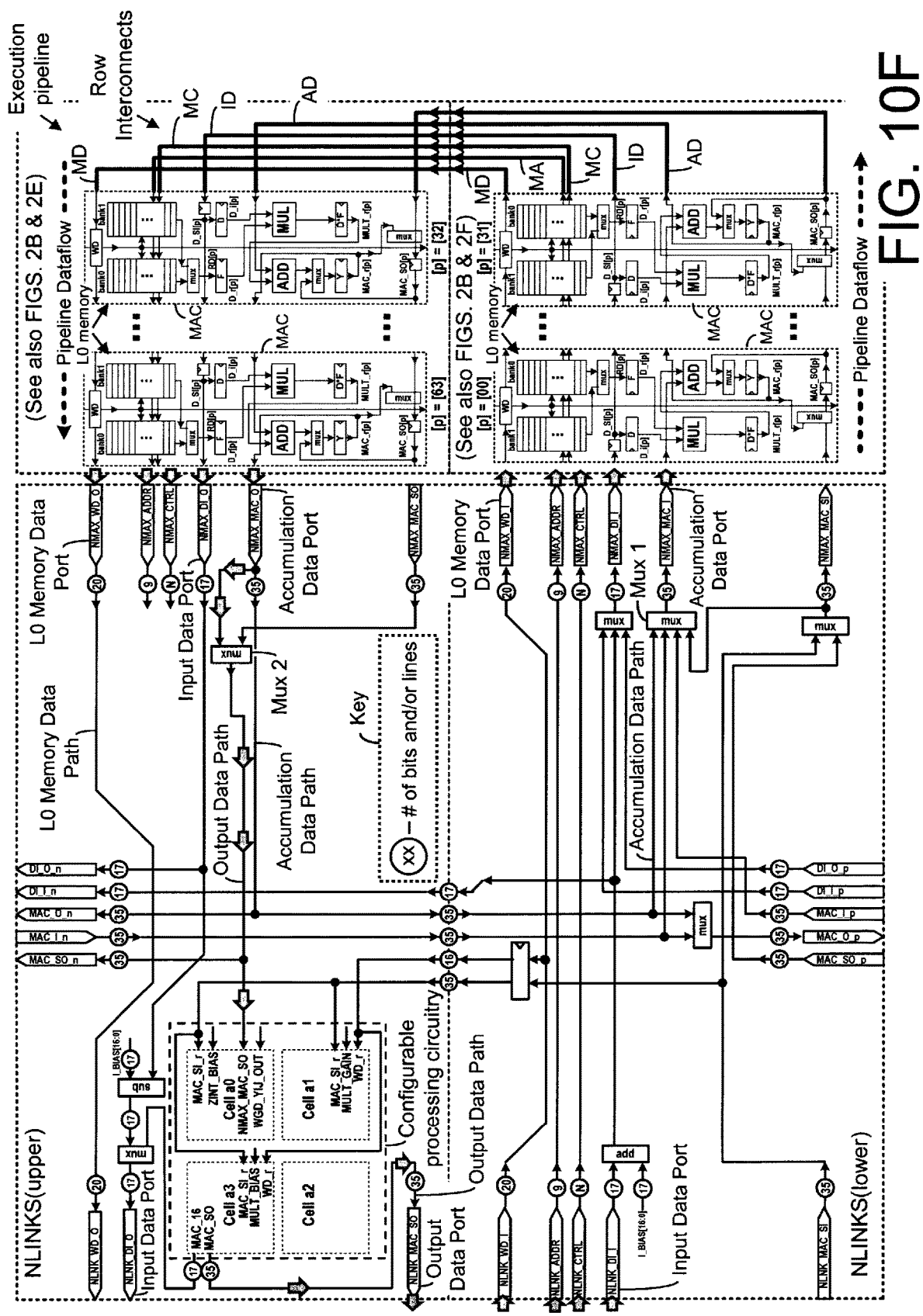

CONFIGURABLE MAC PIPELINES FOR FINITE-IMPULSE-RESPONSE FILTERING, AND METHODS OF OPERATING SAME

RELATED APPLICATION

This non-provisional application claims priority to and the benefit of U.S. Provisional Application No. 63/067,979, entitled "Configurable MAC Pipelines for Finite-Impulse-Response Filtering, and Methods of Operating Same", filed Aug. 20, 2020. The '979 provisional application is hereby incorporated herein by reference in its entirety.

INTRODUCTION

There are many inventions described and illustrated herein. The present inventions are neither limited to any single aspect nor embodiment thereof, nor to any combinations and/or permutations of such aspects and/or embodiments. Importantly, each of the aspects of the present inventions, and/or embodiments thereof, may be employed alone or in combination with one or more of the other aspects of the present inventions and/or embodiments thereof. All combinations and permutations thereof are intended to fall within the scope of the present inventions.

In one aspect, the present inventions are directed to one or more integrated circuits having a plurality of multiplier-accumulator circuits, connected in a data processing pipeline (e.g., a linear pipeline), to process input data (e.g., image data) using finite-impulse-response (FIR) filtering techniques. In one embodiment, a plurality of multiplier-accumulator circuits are connected in series to perform a plurality of pipelined multiply and accumulate operations to filter two dimensional image data via a filter processing mode (e.g., one dimensional FIR filtering). The multiplier-accumulator circuits of the FIR filter may be configured/connected into a pipeline or may be a subset of a larger pipeline of multiplier-accumulator circuits whereby the input and/or output of the FIR filter is intermediate of the larger multiplier-accumulator circuit pipeline. Notably, multiplier-accumulator circuits may be referred to herein, at times, as "MACs" or "MAC circuits" or, singly or in singular form, "MAC" or "MAC circuit".

In one embodiment, the characteristics of the finite-impulse-response filter, when enabled, activated and/or employed, for example, in the data processing operation, are fixed (e.g., at manufacture). In another embodiment, the characteristics of the finite-impulse-response filter are programmable—for example, the number of taps of the filter may be programmed, in situ (i.e., during normal operation of the integrated circuit) and/or at or during power-up, start-up, initialization, re-initialization, configuration, re-configuration or the like. In addition, the number of multiplier-accumulator circuits implemented or employed in the FIR filter may also be programmable. In one embodiment, memory (e.g., a configuration register) may store the FIR filter configuration characteristics, including—for example, the number of taps of the image processing of, for example, the multiplier-accumulator circuit pipeline, and the number and/or specific ones of multiplier-accumulator circuits of one or more pipelines to be employed in the FIR filter. Such memory may be programmed at or during power-up, start-up, initialization, re-initialization and/or in situ. In one embodiment, the FIR filter includes 4, 8, 16, etc. taps and employs 4, 8, 16, etc. multiplier-accumulator circuits.

Notably, by way of background, a tap is a coefficient/delay pair of the filter. The number of taps of an FIR filter may impact, among other things, the stopband attenuation of the filter, smoothness or amount of ripple of the response, and the narrowness of the filter response. In operation, an FIR filter having more taps typically often translates to more stopband attenuation, less ripple of the filter response, and a narrower filter. Moreover, the number of taps may impact the amount of memory required to implement the FIR filter, the number of calculations necessary/performed by the multiplier-accumulator circuits, and the amount of "filtering" or attenuation of the FIR filter is capable of implementing or performing. In addition, the "impulse response" of a FIR filter may be, at least in part, determined by the filter coefficients used in the multiply operations performed by the multiplier-accumulator circuit. Such filter coefficients may be stored in memory and provided to the multiplier-accumulator circuitry during operation.

In one embodiment, the present inventions are directed to FIR filter configuration circuitry to program, configure and/or control a plurality of separate multiplier-accumulator circuits or rows/banks of interconnected (in series) multiplier-accumulator circuits to filter input data (e.g., image data) via multiply and accumulate operations (e.g., in a linear pipeline architecture) and generate and output a FIR filtered data (e.g., image data). The filter configuration circuitry may configure and/or re-configure the MAC processing pipeline to provide a FIR filter to filter image data, for example, in situ (i.e., during normal operation of the integrated circuit) and/or at or during power-up, start-up, initialization, re-initialization, configuration, re-configuration or the like. As noted above, in one embodiment, memory (e.g., a configuration register) may store filter configuration data, including the characteristics of the filter implementing the image processing of, for example, the MAC pipeline. Such memory may be fixed or programmable/re-programmable, for example, multi-time programmable, at or during power-up, start-up, initialization, re-initialization and/or in situ.

Notably, the present inventions may employ any multiplier-accumulator circuit now known or later developed. Indeed, the present inventions may employ one or more the multiplier-accumulator circuits that are described and illustrated in the exemplary embodiments of FIGS. 1A-1C of U.S. patent application Ser. No. 16/545,345 and U.S. Provisional Patent Application No. 62/725,306, and the text associated therewith. Here, the multiplier-accumulator circuitry described and/or illustrated in the '345 and '306 applications facilitate concatenating the multiply and accumulate operations, and reconfiguring the circuitry thereof and operations performed thereby. The plurality of multiplier-accumulator circuits may also include a plurality of registers (including a plurality of shadow registers) wherein the circuitry also controls such registers to implement or facilitate the pipelining of the multiply and accumulate operations performed by the multiplier-accumulator circuits to increase throughput of the multiplier-accumulator execution or processing pipelines in connection with processing the related data (e.g., image data). The '345 and '306 applications are incorporated by reference herein in their entirety.

Notably, the MAC processing or execution pipelines may be organized from or disposed on one or more integrated circuits. In one embodiment, the integrated circuit is a discrete field programmable gate array (FPGA) or embedded FPGA (herein after collectively "FPGA" unless indicated otherwise). Briefly, an FPGA is an integrated circuit that is configured and/or reconfigured (hereinafter, unless stated otherwise, collectively "configured" or the like (e.g., "configure" and "configurable")) by a user, operator, customer and/or designer before and/or after manufacture. The FPGA may include programmable logic components (often called "logic cells", "configurable logic blocks" (CLBs), "logic array blocks" (LABs), or "logic tiles"—hereinafter collectively "logic tiles")).

In one embodiment of the present inventions, one or more (or all) logic tiles of an FPGA include a plurality of multiplier-accumulator circuits to implement multiply and accumulate operations, for example, in a pipelining manner. The control/configure circuitry may be included in or may include a switch interconnect network in the logic tiles. The switch interconnect network may be configured as a hierarchical and/or mesh interconnect network. The logic tiles may include data storage elements associated with the switch interconnect network, input pins and/or look-up tables (LUTs) that, when programmed, determine the configuration and/or operation of the switches/multiplexers and, among other things, the communication between circuitry (e.g., logic components) within a logic tile (including the MAC circuits and/or MAC processing pipelines) and/or between circuitry of multiple logic tiles (e.g., between MAC circuits and/or MAC processing pipelines of a plurality of logic tiles).

In one embodiment, the switch interconnect network may provide a connection to/from logic circuitry of the associated logic tile or a different logic tile to/from multiplier-accumulator circuits (individually) of the multiplier-accumulator circuits of the processing or execution pipelines. In this way, MAC circuits and/or MAC processing pipelines of a plurality of logic tiles may be employed, for example, concurrently, to processes related data (e.g., related image data). Indeed, such connections may be configurable and/or re-configurable—for example, in situ (i.e., during normal operation of the integrated circuit) and/or at or during power-up, start-up, initialization, re-initialization, configuration, re-configuration or the like. In one embodiment, the switch interconnect network may employ one or more embodiments, features and/or aspects of the interconnect network described and/or illustrated in the '345 and '306 applications. Moreover, the switch interconnect network may interface with and/or include one or more embodiments, features and/or aspects of the interface connector described and/or illustrated in the '345 and '306 applications (See, e.g., FIGS. 7A-7C of the '345 application; notably, certain details of the NLINKS circuits described and illustrated herein may correlate to circuitry described and/or illustrated in the '345 and '306 applications which is referred to as NLINX (e.g., NLINX conductors, NLINX interface, NLINX interface connector, etc.)). As mentioned above, the '345 and '306 applications are hereby incorporated by reference herein in their entirety.

Notably, the integrated circuit(s) may be, for example, a processor, controller, state machine, gate array, system-on-chip (SOC), programmable gate array (PGA) and/or FPGA and/or a processor, controller, state machine and SoC including an embedded FPGA. A field programmable gate array or FPGA means both a discrete FPGA and an embedded FPGA.

Briefly, with reference to FIG. 1A, in one embodiment, the multiplier-accumulator circuitry in the execution pipeline is configured in a linearly connected pipeline architecture. In this embodiment, Dijk data is "fixed" in place during execution and Yijl data "rotates" during execution of the multiply and accumulate operations. The "m×m" Fkl filter weights (in this embodiment, filter weights) are distributed across L0 memory (in one exemplary embodiment, m=64 such that 64 L0 SRAMs are employed—wherein one L0 SRAM is associated with, and in one embodiment (including this illustrative embodiment), is dedicated to each MAC processing circuit of the MAC processing circuits of the pipeline). In each execution cycle, m Fkl values will be read from memory and provided/output to the MAC elements or circuits. The multiplier-accumulator circuit is illustrated in schematic block diagram form in Inset A.

The Dijk data values may be stored in the processing element during the m execution cycles after being loaded from the Dijk shifting chain/path which is connected to $D_{MEM}$ memory (here, L2 memory—such as SRAM). Further, during multiply and accumulate processing, via the m MACs, the Yijlk MAC values are rotated through all m MAC processing elements/circuits during the m execution cycles after being loaded from the Yijk shifting chain/path (see $Y_{MEM}$ memory), and will be unloaded with the same shifting chain/path. Again, in one exemplary embodiment, m=64.

Further, in this exemplary embodiment, "m" (e.g., 64 in one embodiment) MAC processing circuits in the execution pipeline operate concurrently whereby the multiplier-accumulator processing circuits perform m×m (e.g., 64×64) multiply-accumulate operations in each m (e.g., 64) cycle interval (here, a cycle may be nominally 1 ns). Thereafter, a next set of input pixels/data (e.g., 64) is shifted-in and the previous output pixels/data is shifted-out during the same m cycle interval (e.g., 64). Notably, each m cycle interval (e.g., 64) processes a Dd/Yd (depth) column of input and output pixels/data at a particular (i,j) location (the indexes for the width Dw/Yw and height Dh/Yh dimensions). Them cycle execution interval (e.g., 64) is repeated for each of the Dw*Dh depth columns for this stage. In this exemplary embodiment, the filter weights or weight data are loaded into memory (e.g., the L1/L0 SRAM memories) from, for example, an external memory or processor before the stage processing started (see, e.g., the '345 and '306 applications). In this particular embodiment, the input stage has Dw=512, Dh=256, and Dd=128, and the output stage has Yw=512, Yh=256, and Yd=64. Note that only 64 of the 128 Dd input are processed in each 64×64 MAC execution operation.

With continued reference to FIG. 1A, the method implemented by the configuration illustrated may accommodate arbitrary image/data plane dimensions (Dw/Yw and Dh/Yh) by simply adjusting the number of iterations of the basic m×m MAC accumulation operation that are performed. The loop indices "I" and "j" are adjusted by control and sequencing logic circuitry to implement the dimensions of the image/data plane. Moreover, the method may also be adjusted and/or extended to handle a Yd column depth larger than the number of MAC processing elements (e.g., 64 in this illustrative example) in the execution pipeline. In one embodiment, this may be implemented by dividing the depth column of output pixels into blocks (e.g., 64), and repeating the MAC accumulation of FIG. 1A for each of these blocks.

Indeed, the method intimated in FIG. 1A may be further extended to handle a Dd column depth smaller or larger than the number of MAC processing elements/circuits (64 in one exemplary embodiment) in the execution pipeline. In the context of larger than the number of MAC circuits, this may be implemented, in one embodiment, by initially performing a partial accumulation of a first block of 64 data of the input pixels Dijk into each output pixel Yijl. Thereafter, the partial accumulation values Yijl are read (from the memory $Y_{mem}$) back into the execution pipeline as initial values for a continuing accumulation of the next block of 64 input pixels Dijk into each output pixel Yijl. The memory which stores or holds the continuing accumulation values (e.g., L2 memory) may be organized, partitioned and/or sized to accommodate any extra read/write bandwidth to support the processing operation.

With reference to FIG. 1B, in one embodiment, a plurality of multiplier-accumulator circuits (e.g., 64) are configured in a linear multiplier-accumulator execution or processing pipeline. Each multiplier-accumulator circuit (labeled "MAC x") may include one or more "local" memory/register banks (two are depicted), which are associated with and dedicated to a particular multiplier-accumulator circuit, to store a plurality of different sets of filter weights, to be employed in connection with the multiply operations associated with the processing a given set of input data.

In the illustrated embodiment, multiplier-accumulator circuit includes two memory/register banks (e.g., L0 memory such as SRAM) that are independent banks such that in each execution cycle, one of the banks for each MAC may be read (using the shared read address bus), placing the read data (here, filter weights or coefficients) on an associated RD[p] signal line that is input into the multiplexer (often times referred to as "mux"). The read data is moved/written into the F register (D_r[p]) to be used in the execution cycle. The F register (D_r[p]) is written with a new filter weights (Fkl value) for each execution cycle. That is, during the execution cycle, the other memory/register bank (i.e., the bank that is not being read from) is available to store filter weights via write operations (using a WA address bus that, in one embodiment, is shared/common between the memory/register banks).

With continued reference to FIG. 1B, each multiplier-accumulator circuit (which, in this exemplary embodiment, may also be referred to as "processing element" or "MAC processor") includes the shifting chain (D_SI[p]) for the data input (Dijk data). In one embodiment, during the processing, the next Dijk data is shifted in while the current Dijk data is used in the current set of execution cycles. The current Dijk data is stored in the D_i[p] register during the current set of execution cycles without changing.

Further, each multiplier-accumulator circuit includes a shifting chain (MAC_SO[p]) for preloading the Yijl sums (initial accumulation values). The next set of Yijl sums are shifted in while the current set of Yijl sums are calculated/generated during the current set of execution cycles. In this embodiment, each multiplier-accumulator circuit also uses the shifting chain (MAC_SO[p]) for unloading or outputting the Yijl sum. The previous Yijl sums are shifted out while the current Yijl sums are generated in the current set of execution cycles. Notably, the concurrent use of the Yijl shifting chain (MAC_SO[p]) both preloading and unloading will be discussed in more detail below.

In each execution cycle, the filter weight (Fkl value) in the D_r[p] register is multiplied by the Dijk value in the D_i[p] register, via multiplier circuit of the MACs, and the result is output to the MULT_r[p] register. In the next pipeline cycle this product (i.e., D*F value) is added to the Yijl accumulation value in the MAC_r[p-1] register (in the previous multiplier-accumulator circuit) and the result is stored in the MAC_r[p] register. This execution process is repeated for the current set of execution cycles. Notably, the Yijl accumulation values move (rotate) during the current set of execution cycles.

With reference to FIG. 1C, the integrated circuit may include a plurality of multi-bit MAC execution pipelines which are organized as one or more clusters of a processing component. Here, the component may include "resources" such as a bus interfaces (e.g., a PHY and/or GPIO) to facilitate communication with circuitry external to the component and memory (e.g., SRAM and DRAM) for storage and use by the circuitry of the component. For example, with reference to FIG. 1C, in one embodiment, four clusters are included in the component (labeled "X1") wherein each cluster includes a plurality of multi-bit MAC execution pipelines (for example, in this illustrative embodiment 16 64-MAC execution pipelines). Notably, one MAC execution pipeline (which in this illustrative embodiment includes m MAC circuits) of FIG. 1A is illustrated at the lower right for reference purposes.

With continued reference to FIG. 1C, the memory hierarchy in this exemplary embodiment includes an L0 memory (e.g., SRAM) that stored filter weights or coefficients to be employed by multiplier-accumulator circuits in connection with the multiplication operations implemented thereby. In one embodiment, each MAC execution pipeline includes an L0 memory to store the filter weights or coefficients associated with the data under processing by the circuitry of the MAC execution pipeline. An L1 memory (a larger SRAM resource) is associated with each cluster of MAC execution pipelines. These two memories may store, retain and/or hold the filter weight values Fijklm employed in the multiply and accumulation operations.

Notably, the embodiment of FIG. 1C may employ an L2 memory (e.g., an SRAM memory that is larger than the SRAM of L1 or L0 memory). A network-on-chip (NOC) couples the L2 memory to the PHY (physical interface) to provide connection to an external memory (e.g., L3 memory—such as, external DRAM component(s)). The NOC also couples to a PCIe PHY which, in turn, couples to an external host. The NOC also couples to GPIO input/output PHYs, which allow multiple X1 components to be operated concurrently. The control/configure circuit (referred to or labeled, at times, as "control/configure circuit", "NLINKS", or "NLINKS circuit") connects to multiplier-accumulator circuitry (which includes a plurality (in one exemplary embodiment, 64) multiplier-accumulator circuits or MAC processors) to, among other things, configure the overall execution pipeline by providing or "steering" data between one or more MAC pipeline(s), via programmable or configurable interconnect paths. In addition, the ontrol/configure circuit may configure the interconnection between the multiplier-accumulator circuitry and one or more memories—including external memories (e.g., L3 memory, such as external DRAM)—that may be shared by one or more (or all) of the clusters of MAC execution pipelines. These memories may store, for example, the input image pixels Dijk, output image pixels Yijl (i.e., image data processed via the circuitry of the MAC pipeline(s), as well as filter weight values Fijklm employed in connection with such data processing.

Notably, although the illustrative or exemplary embodiments described and/or illustrated a plurality of different memories (e.g., L3 memory, L2 memory, L1 memory, L0 memory) which are assigned, allocated and/or used to store certain data and/or in certain organizations, one or more of other memories may be added, and/or one or more memories may be omitted and/or combined/consolidated—for example, the L3 memory or L2 memory, and/or the organizations may be changed. All combinations are intended to fall within the scope of the present inventions.

Moreover, in the illustrative embodiments set forth herein (text and drawings), the multiplier-accumulator circuitry and/or multiplier-accumulator pipeline is, at times, labeled in the drawings as "NMAX", "NMAX pipeline", "MAC", or "MAC pipeline".

With continued reference to FIG. 1C, the integrated circuit(s) include a plurality of clusters (e.g., two, four or eight) wherein each cluster includes a plurality of MAC execution pipelines (e.g., 16). Each MAC execution pipeline may include a plurality of separate multiplier-accumulator circuits (e.g., 64) to implement multiply and accumulate operations. In one embodiment, a plurality of clusters are interconnected to form a processing component (such component is often identified in the figures as "X1" or "X1 component") that may include memory (e.g., SRAM, MRAM and/or Flash), a switch interconnect network to interconnect circuitry of the component (e.g., the multiplier-accumulator circuits and/or MAC execution pipeline(s) of the X1 component) and/or circuitry of the component with circuitry of one or more other X1 components. Here, the multiplier-accumulator circuits of the one or more MAC execution pipelines of a plurality of clusters of a X1 component may be configured to concurrently process related data (e.g., image data). That is, the plurality of separate multiplier-accumulator circuits of a plurality of MAC pipelines may concurrently process related data to, for example, increase the data throughput of the X1 component.

Notably, the X1 component may also include interface circuitry (e.g., PHY and/or GPIO circuitry) to interface with, for example, external memory (e.g., DRAM, MRAM, SRAM and/or Flash memory).

With reference to FIG. 2A, in one exemplary configuration, the control/configure or NLINKS circuit (which, in one embodiment, is dedicated to the associated MAC execution pipeline) connects to the execution pipeline via a plurality of ports including (i) the DI_I, MAC_SI, DI_O, MAC_SO ports, which connect the execution pipeline to memory that is external to the pipeline (e.g., L2 memory such as SRAM), and (ii) the MAC_I, MAC_O ports which connect the plurality of multiplier-accumulator circuits (or the two rows of multiplier-accumulator circuits) into ring configuration or architecture. In this exemplary embodiment, the control/configure or NLINKS circuit is configured to be an interface for an associated MAC execution pipeline to, for example, provide input data to execution pipeline (e.g., from memory) and receive the output/processed data from the execution pipeline (e.g., to output to memory). Moreover, in this particular embodiment, the control/configure or NLINKS circuit is not configured to interface or interact with control/configure or NLINKS circuit(s) and/or adjacent execution pipelines.

Notably, a "port" is a physical point of entry to and/or exit from the control/configure or NLINKS circuit; all physical forms of entry to or exit from the control/configure or NLINKS circuit are intended to fall within the scope of the present invention (for example, a conductor or metal routing in/of an integrated circuit).

With reference to FIGS. 2A, 2B, 2E and 2F, the execution pipeline in this embodiment includes a plurality of multiplier-accumulator circuits (labeled "MAC") that are connected in series to form a linear pipeline including a plurality of rows that are interconnected, via row interconnects. In operation, the execution pipeline receives input data at DI_I (see NLINKS(lower)), processes the data via concatenating the multiply and accumulate operations, and outputs processed data at MAC_SO (see NLINKS(upper)). In one embodiment, the control/configure or NLINKS circuit configures two rows of multiplier-accumulator circuits into ring configuration or architecture via connecting the MAC_I, MAC_O ports, and thereby the processing operations of the plurality of multiplier-accumulator circuits of the execution pipeline.

With reference to FIGS. 2A-2F, the signals traversed on the L0 Memory data, address and control paths in the NLINKS circuit and execution pipeline denote the control and address information that manages and controls the execution sequences of the processing. The control and address signals are generated by control logic circuitry (not illustrated—and which, in one embodiment, is external to the NLINKS and execution pipeline). In addition, such control logic also manages or controls write data (i.e., the filter weights) and write sequences in relation to each L0 memory (e.g., SRAM) which is associated with and dedicated to the multiplier-accumulator circuits in the execution pipeline. The write data (filter weights) is read from memory external to the execution pipeline (L1 memory—e.g., SRAM) (see, e.g., FIGS. 1A and 1B). Notably, a sequence to write data into one of the banks of each L0 memory associated with the multiplier-accumulator circuits is performed/completed before the execution process using the filter weights associated with that sequence is initiated.

With continued reference to FIGS. 2A-2F, the signals traversed on the Input Data Path in the NLINKS circuit and execution pipeline denote input data (e.g., image data) applied to or received by the MAC pipeline and processed by/in an execution sequence. The input data may be stored in L2 memory (e.g., SRAM) and provided (i.e., read from memory) to the NLINKS circuit via the control logic circuitry (not illustrated). In one embodiment, this input data are provided to the pipeline in sets or groups (e.g., 64 element groups or sets wherein each element is 17 bits in size/length). A set or group of input data is shifted in serially through the DI_I port and loaded into the pipeline in parallel to the D register in each of the multiplier-accumulator circuits of the execution pipeline. The end of the serial path is the DI_O output port in the NLINKS circuit (see "Input Data Port" in NLINKS(upper)). The input data path in the NLINKS(upper) may not be used in this illustrative pipeline architecture/configuration.

The accumulation data paths in the NLINKS circuit and execution pipeline denote the ongoing MAC accumulation values generated by multiplier-accumulator circuits during the execution sequence. In each cycle, each multiplier-accumulator circuit multiplies a filter weight value (from L0 memory) by the (static) value in the D register, adds the total to its accumulation register Y, and passes Y to the right for the next cycle. The Y accumulation values (here, 64) rotate counter-clockwise, and at the end of each cycle interval (e.g., 64-cycle interval) the accumulation values are loaded into the output shift register MAC_S. Note that the Accumulation Data Ports (MAC_O port and MAC_I port) in the NLINKS circuit, and the data path therebetween, are configured and enabled to allow the Y value to be rotated through each of the MACs of the execution pipeline (see also FIG. 1B).

With continued reference to FIGS. 2A-2F, the signal lines between the Output Data Ports of the NLINKS circuit and the signals on the output data path in the NLINKS circuit and execution pipeline denote output data generated by an execution sequence (the accumulation operation with prior results in a MAC pipeline and one associated NLINKS circuit (notably, "Shift MAC_Sx within single pipeline" refers to the output data path corresponding to the accumulation operation with prior results)). The output data are parallel loaded from the accumulation registers Y (here, 64) into the MAC_SO registers (here, 64). In one embodiment, this output data may be written to memory external to the NLINKS circuit and execution pipeline (e.g., L2 memory (SRAM)) via the control logic circuitry (not illustrated). In one embodiment, the output data are returned as 64 element groups, with each element 35 bits in length/size. A group of output data is shifted out and may, thereafter, be stored in memory serially through the Output Data Port (MAC_SO port). The serial bus (MAC_SO and MAC_SI) may also be used to preload initial accumulation values/totals before initiation of the first execution cycle (i.e., first multiply and accumulate operation) of each execution sequence. These initial accumulation values are provided (e.g., serially shifted in) to the NLINKS circuit and execution pipeline via the MAC_SI port and loaded in parallel to the Y register in each MAC of the execution pipeline (see also FIG. 1B). In one exemplary embodiment, the initial accumulation data are 35 bits in size/length.

The MAC processing or execution pipeline may be any size or length (e.g., 16, 32, 64, 96 or 128 multiplier-accumulator circuits). Indeed, in one embodiment, the size or length of the pipeline may be configurable or programmable (e.g., one-time or multiple times—such as, in situ (i.e., during operation of the integrated circuit) and/or at or during power-up, start-up, initialization, re-initialization, configuration, re-configuration or the like). For example, the MAC pipelines (each pipeline including a plurality of multiplier-accumulator circuits) may be interconnected into larger execution or processing pipelines as described and/or illustrated in U.S. Non-Provisional application Ser. No. 17/212,411 and U.S. Provisional Application No. 63/012,111; as noted above, the '411 and '111 applications are incorporated by reference herein in its entirety. In one embodiment, the circuitry configures and controls a plurality of separate multiplier-accumulator circuits or rows/banks of interconnected (in series) multiplier-accumulator circuits (referred to, at times, as clusters) to pipeline multiply and accumulate operations.

In another embodiment, the interconnection of the pipeline or pipelines are configurable or programmable to provide different forms of pipelining. (See, e.g., the '411 and '111 applications). Here, the pipelining architecture provided by the interconnection of the plurality of multiplier-accumulator circuits may be controllable or programmable. In this way, a plurality of multiplier-accumulator circuits may be configured and/or re-configured to form or provide the desired processing pipeline(s) to process data (e.g., image data)—which may be operations in addition to and/or different from the FIR filtering operations. For example, with reference to the '411 and '111 applications, in one embodiment, control/configure circuitry may configure or determine the multiplier-accumulator circuits, or rows/banks of interconnected multiplier-accumulator circuits are connected (in series) to perform the multiply and accumulate operations and/or the linear pipelining architecture or configuration implemented via connection of multiplier-accumulator circuits (or rows/banks of interconnected multiplier-accumulator circuits). Thus, in one embodiment, the control/configure circuitry configures or implements an architecture of the execution or processing pipeline by controlling or providing connection(s) between multiplier-accumulator circuits and/or rows of interconnected multiplier-accumulator circuits.

In yet another embodiment, the one or more integrated circuits include a plurality of components or X1 components (e.g., 2, 4, . . . ), wherein each component includes a plurality of the clusters having a plurality of MAC execution pipelines. For example, in one embodiment, one integrated circuit includes a plurality of components or X1 components (e.g., 4 clusters) wherein each cluster includes a plurality of execution or processing pipelines (e.g., 16, 32 or 64) which may be configured or programmed to process, function and/or operate concurrently to process related data (e.g., image data) concurrently. In this way, the related data is processed by each of the execution pipelines of a plurality of the clusters concurrently to, for example, decrease the processing time of the related data and/or increase data throughput of the X1 components.

In one embodiment, the present inventions may also be employed or implemented in the concurrent and/or parallel processing techniques of the multiplier-accumulator execution or processing pipelines (and methods of operating such circuitry) which increase throughput of the pipelines, as described and/or illustrated in U.S. patent application Ser. No. 16/816,164 and U.S. Provisional Patent Application No. 62/831,413; both of which are incorporated by reference herein in their entirety. Here, a plurality of execution or processing pipelines of one or more clusters of a plurality of the X1 components may be interconnected to process data (e.g., image data). In one embodiment, one or more clusters of a plurality of the X1 components may be configured to implement the FIR filtering operations, according to the present inventions. In addition, one or more clusters of a plurality of the X1 components may be configured to implement other data processing operations. For example, in one embodiment, such execution or processing pipelines may be interconnected in a ring configuration or architecture to concurrently process related data. In this embodiment, a plurality of MAC execution pipelines of one or more (or all) of the clusters of a plurality of X1 components (which may be integrated/manufactured on a single die or multiple dice) may be configured to implement the FIR filtering operations and other MAC execution pipelines of one or more (or all) of the clusters of a plurality of X1 components may be interconnected in a ring configuration or architecture (wherein a bus interconnects the components) to processing, for example, related data.

In addition thereto, or in lieu thereof, a plurality of MAC execution pipelines of one or more (or all) of the clusters of each X1 component are configured to process (e.g., FIR filtering operations) one or more stages of an image frame such that circuitry of each X1 component processes one or more stages of each image frame of a plurality of image frames. In another embodiment, a plurality of MAC execution pipelines of one or more (or all) of the clusters of each X1 component are configured to process (e.g., FIR filtering operations) one or more portions of each stage of each image frame such that circuitry of each X1 component is configured to process a portion of each stage of each image frame of a plurality of image frames. In yet another embodiment, a plurality of MAC execution pipelines of one or more (or all) of the clusters of each X1 component are configured to process (again, e.g., FIR filtering operations) all of the stages of at least one entire image frame such that circuitry of each X1 component is configured to process all of the stage of at least one image frame. Here, each X1 component is configured to process all of the stages of one or more image frames such that the circuitry of each X1 component processes a different image frame.

As mentioned above, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated in detail separately herein.

BRIEF DESCRIPTION OF THE DRAWINGS

The present inventions may be implemented in connection with embodiments illustrated in the drawings hereof. These drawings show different aspects of the present inventions and, where appropriate, reference numerals, nomenclature, or names illustrating like circuits, architectures, structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

Notably, the configurations, block/data width, data path width, bandwidths, data lengths, values, processes, pseudo-code, operations, and/or algorithms described herein and/or illustrated in the FIGURES, and text associated therewith, are exemplary. Indeed, the inventions are not limited to any particular or exemplary circuit, logical, block, functional and/or physical diagrams, number of multiplier-accumulator circuits employed in an execution pipeline, number of execution pipelines employed in a particular processing configuration, organization/allocation of memory, block/data width, data path width, bandwidths, values, processes, pseudo-code, operations, and/or algorithms illustrated and/or described in accordance with, for example, the exemplary circuit, logical, block, functional and/or physical diagrams. Moreover, although the illustrative/exemplary embodiments include a plurality of memories and/or memory levels (e.g., L3 memory, L2 memory, L1 memory, L0 memory) which are assigned, allocated and/or used to store certain data (e.g., filter weights) and/or in certain organizations. Indeed, the organizations of the memories may be changed and one or more of memories may be added, and/or one or more memories may be omitted and/or combined/consolidated with other memories—for example, (i) the L3 memory or L2 memory and/or (ii) the L1 memory or L0 memory. Again, the inventions are not limited to the illustrative/exemplary embodiments set forth herein.

Figure 1A:
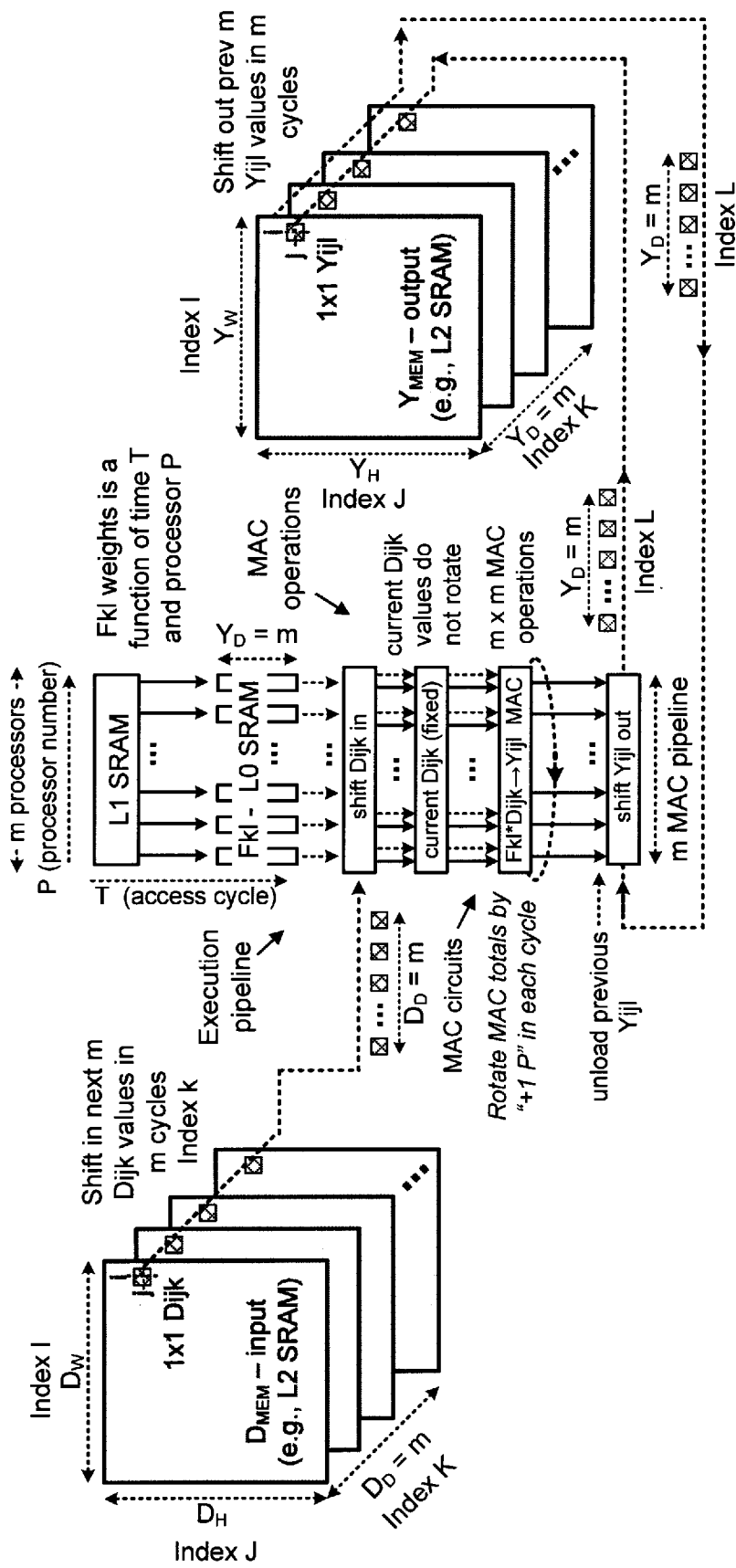
Figure 1A:
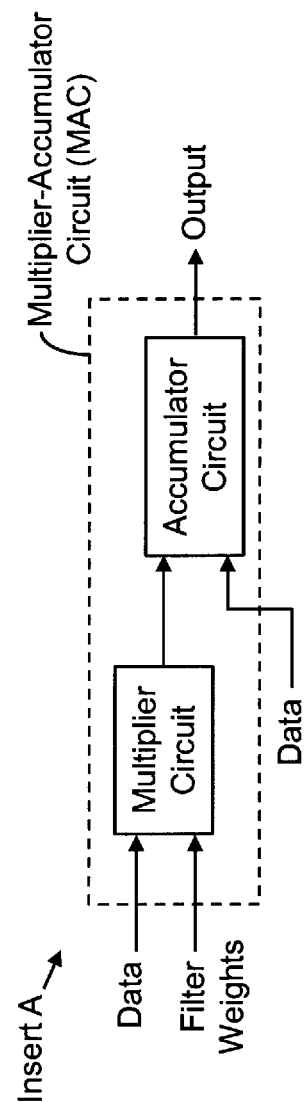
Figure 1B:
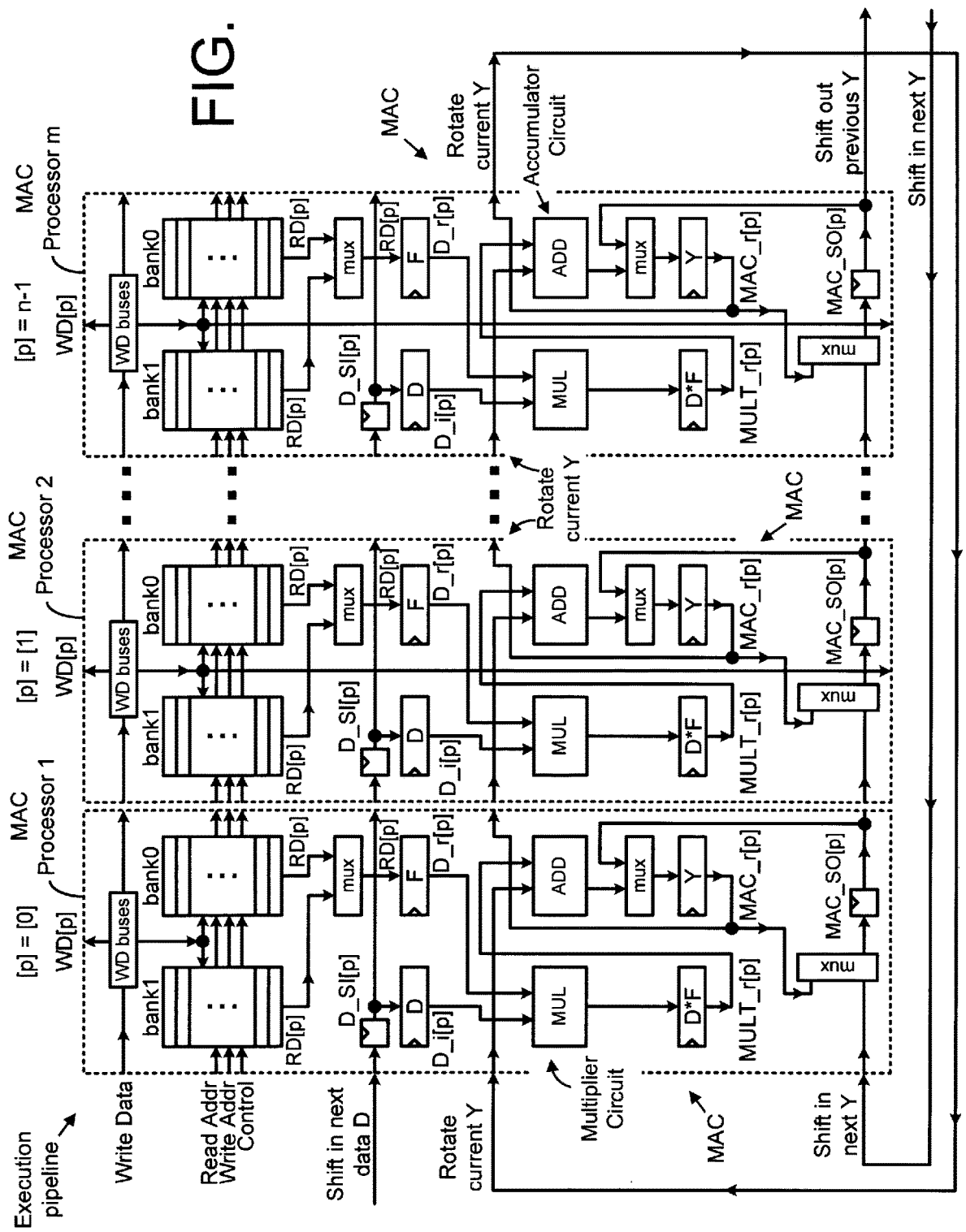
Figure 1C:
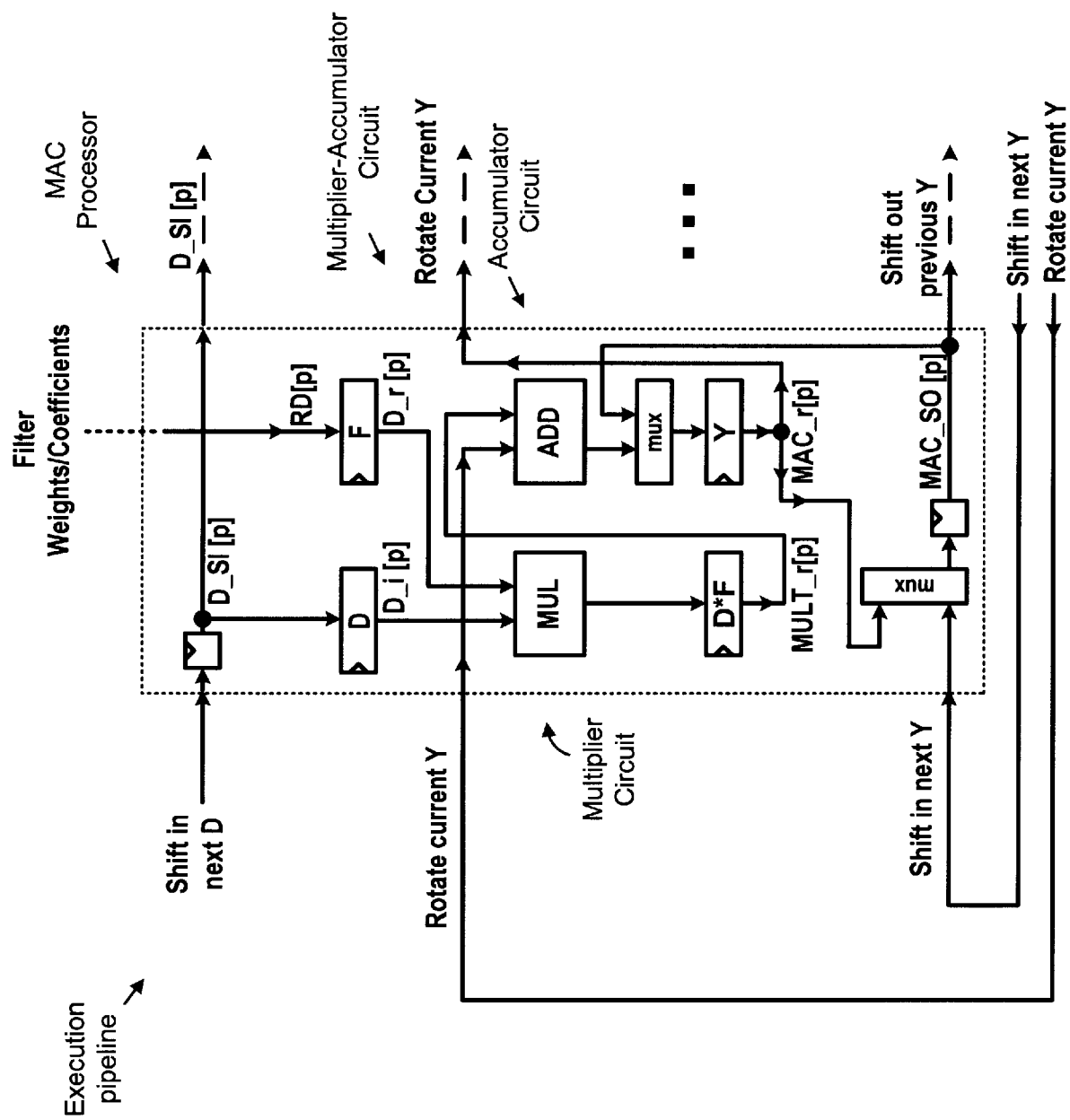
Figure 2A:
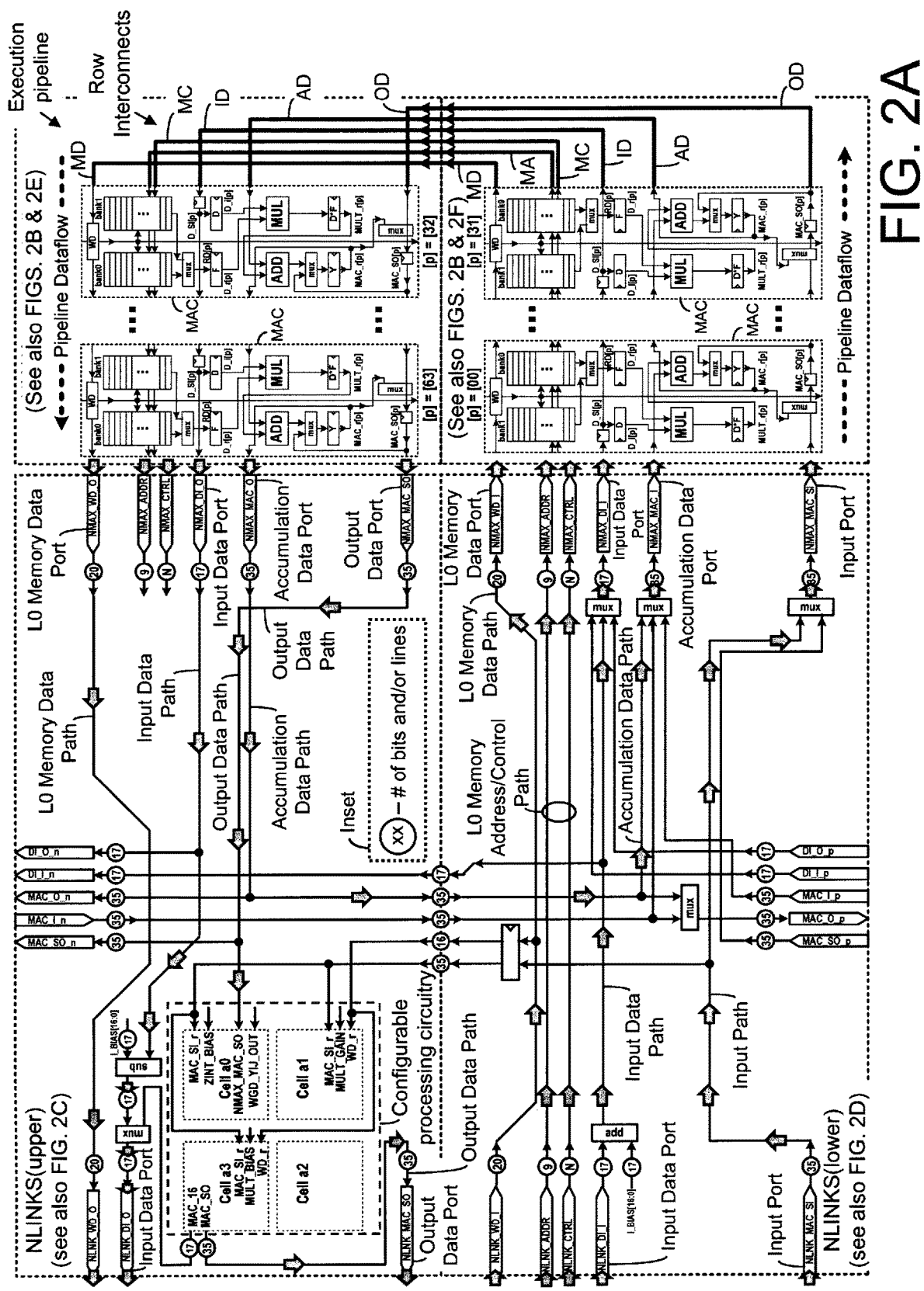
Figure 2B:
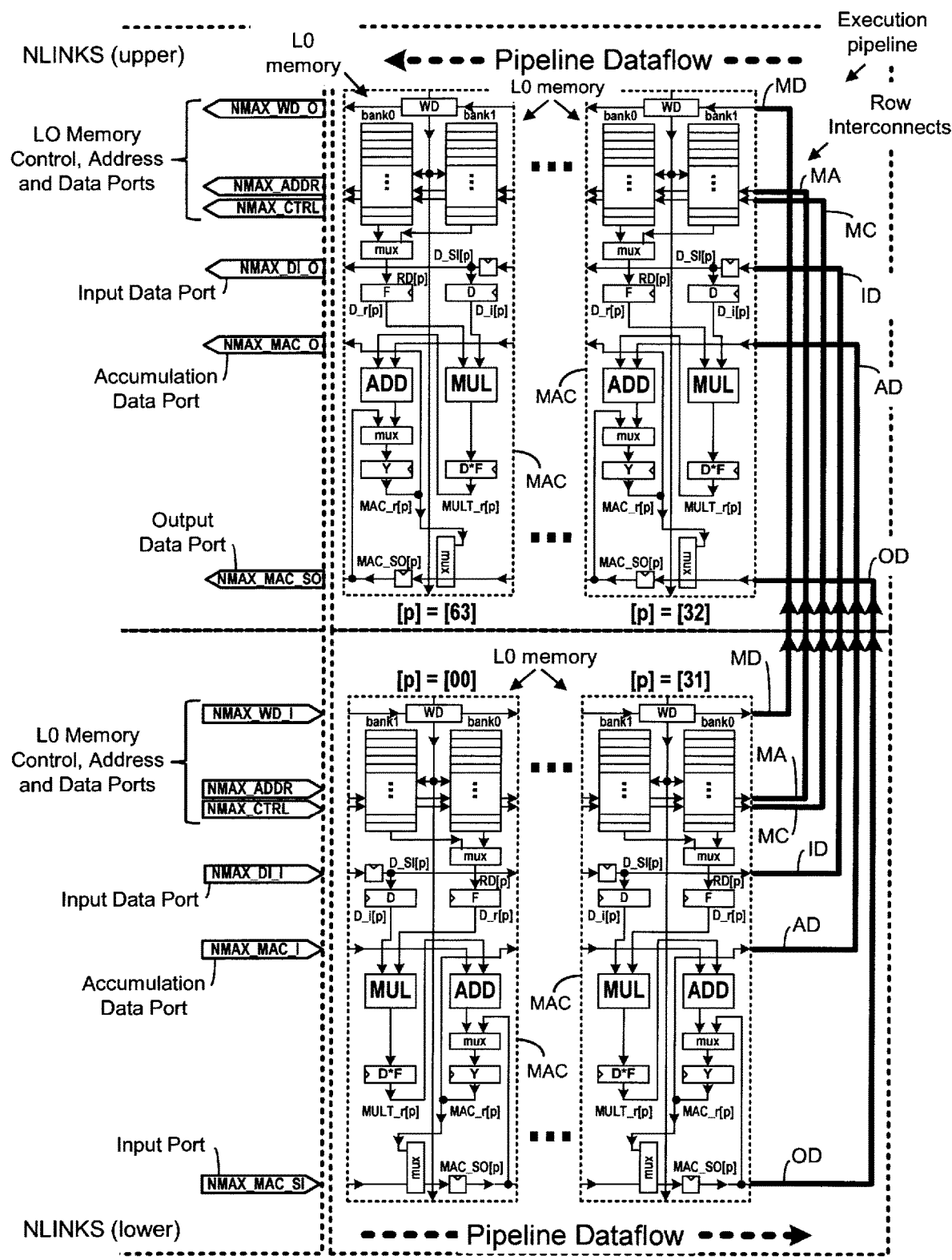
Figure 2C:
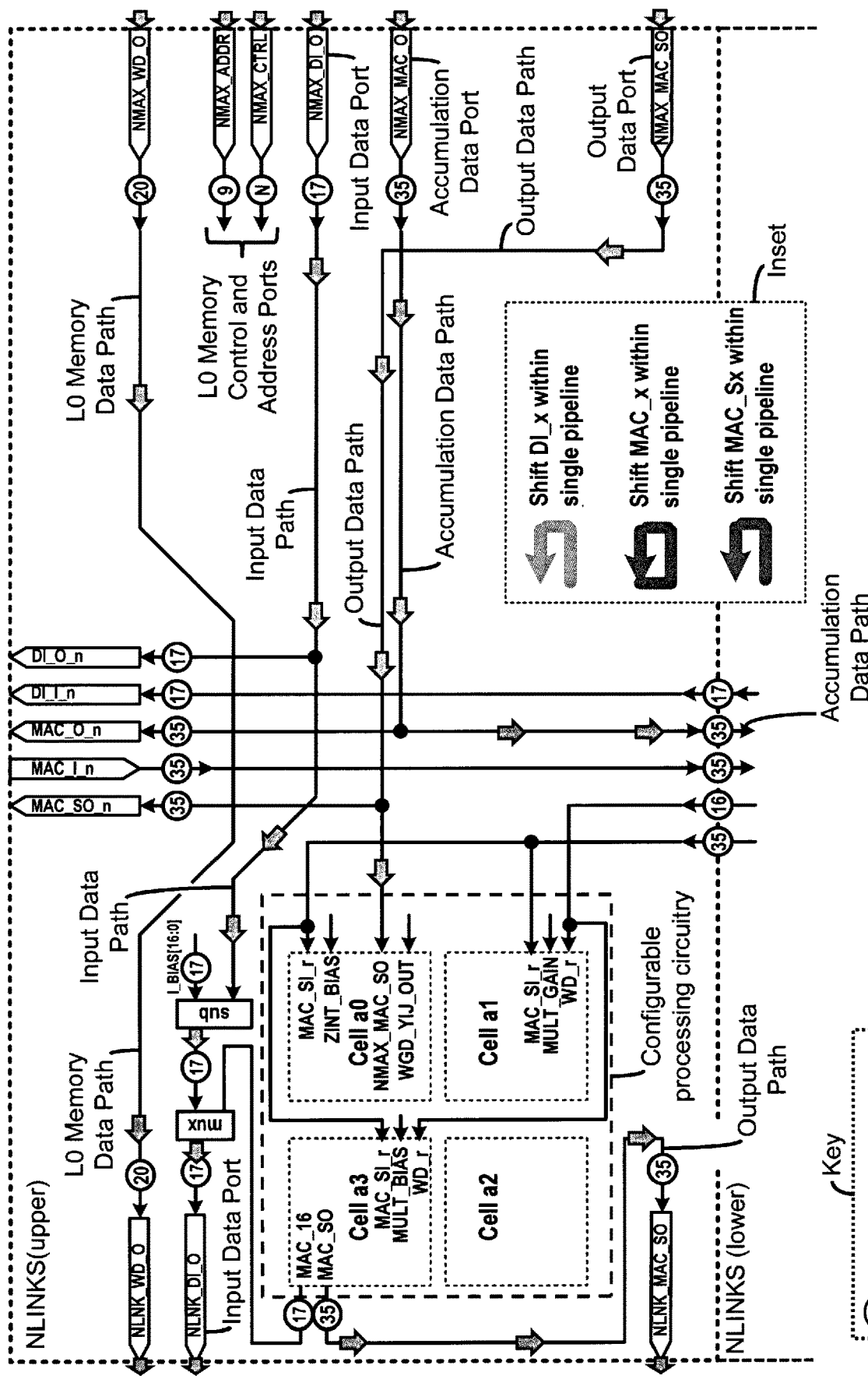
Figure 2D:
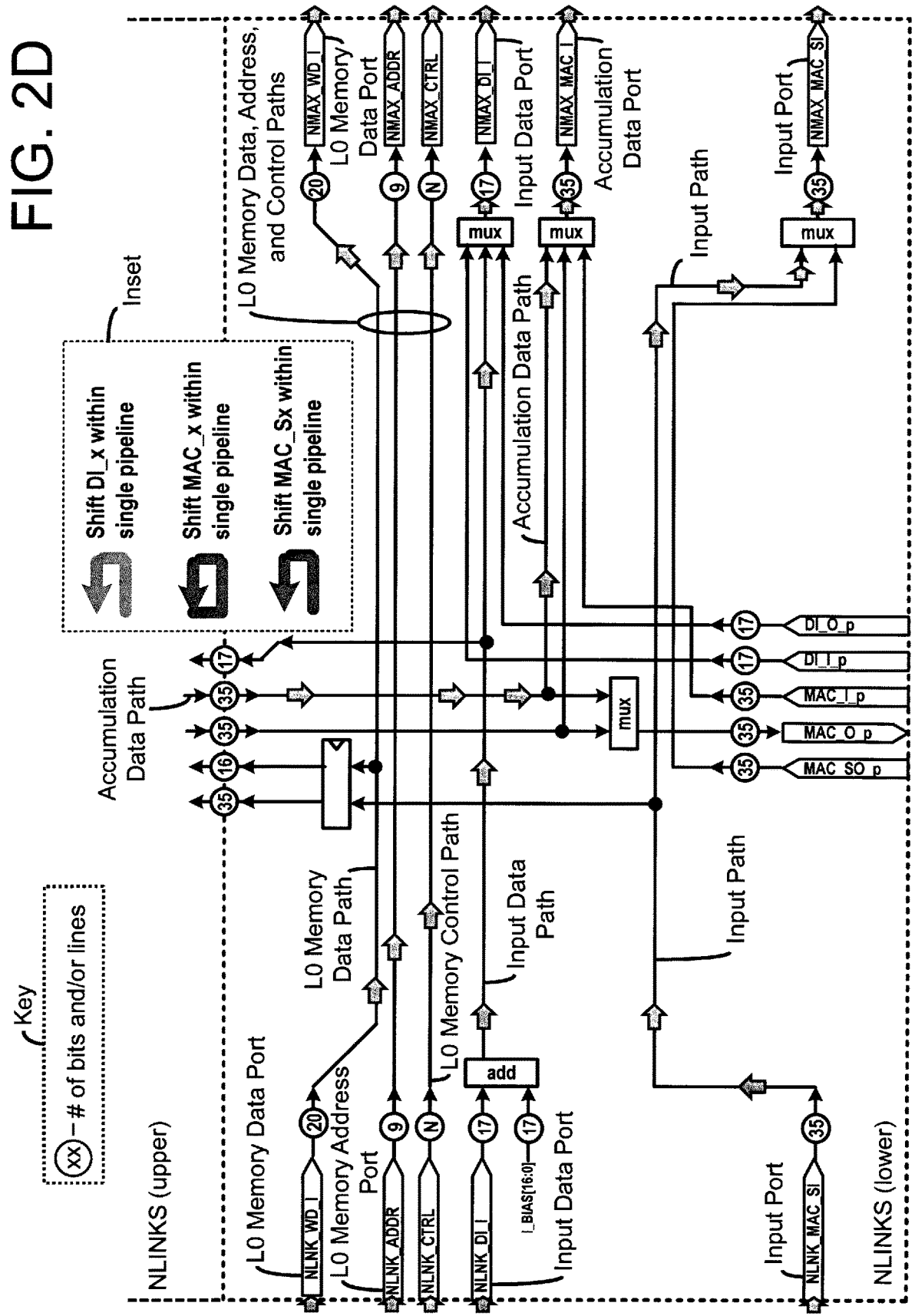
Figure 2E:
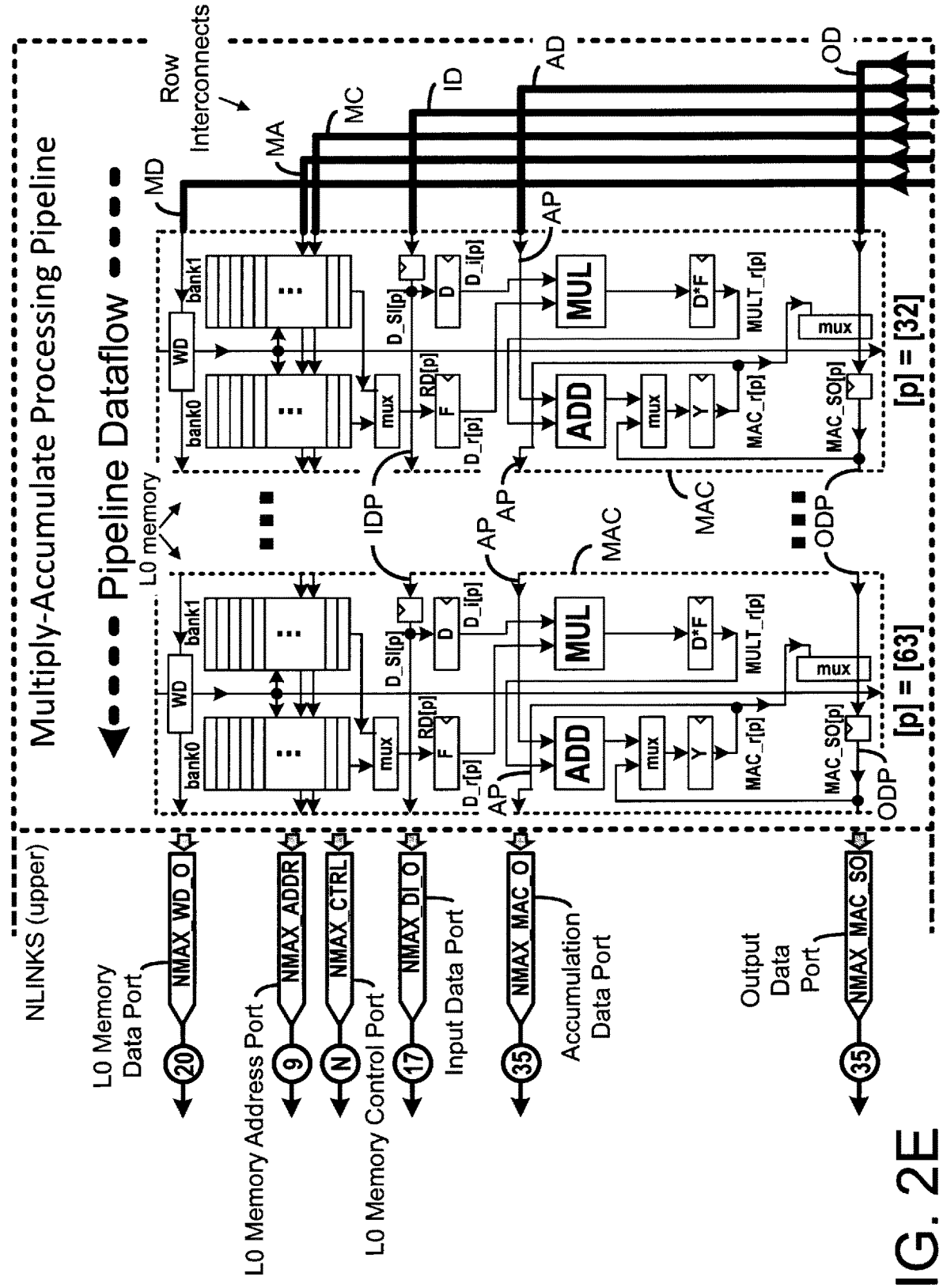
Figure 2F:
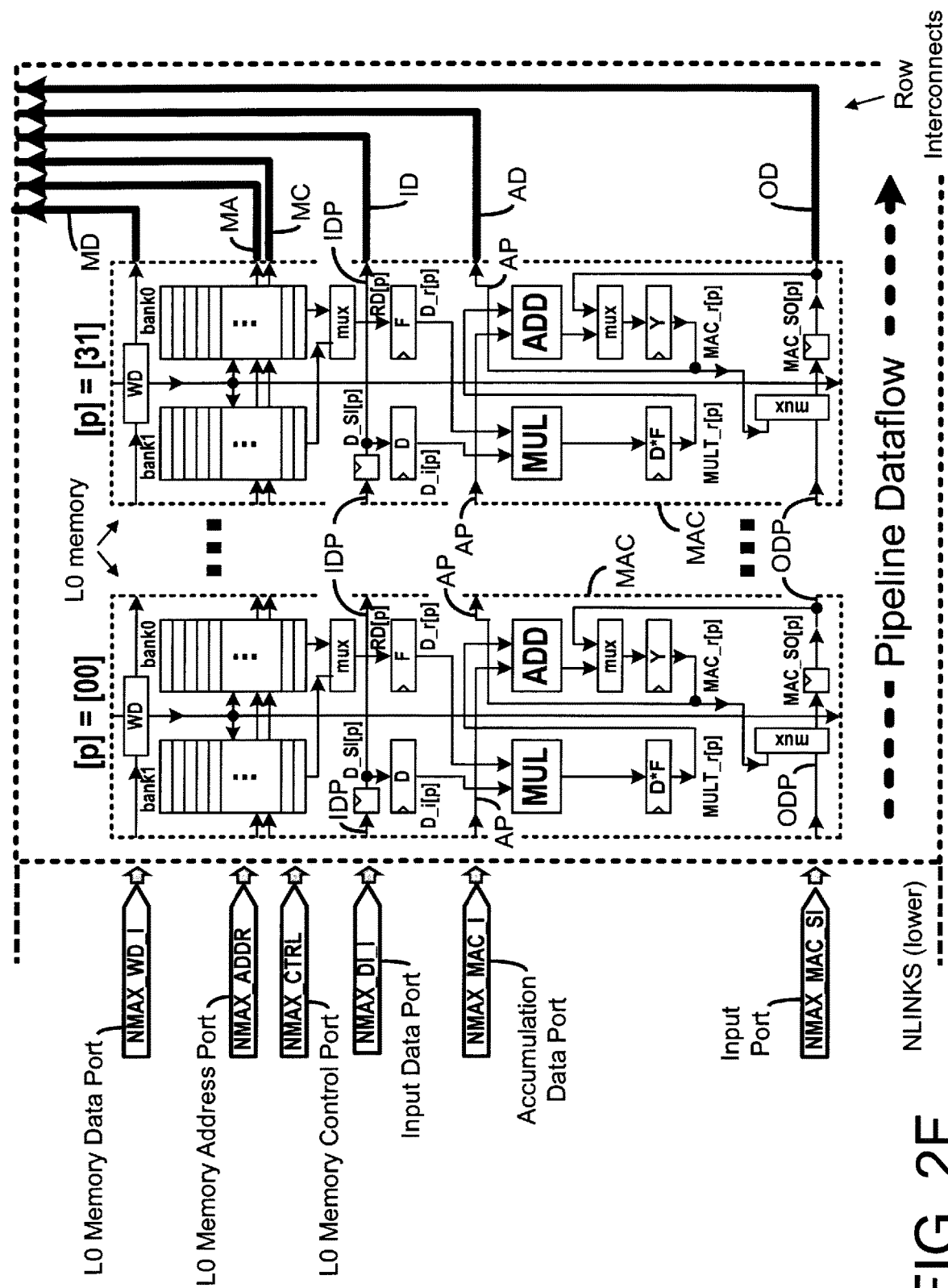
Figure 4:
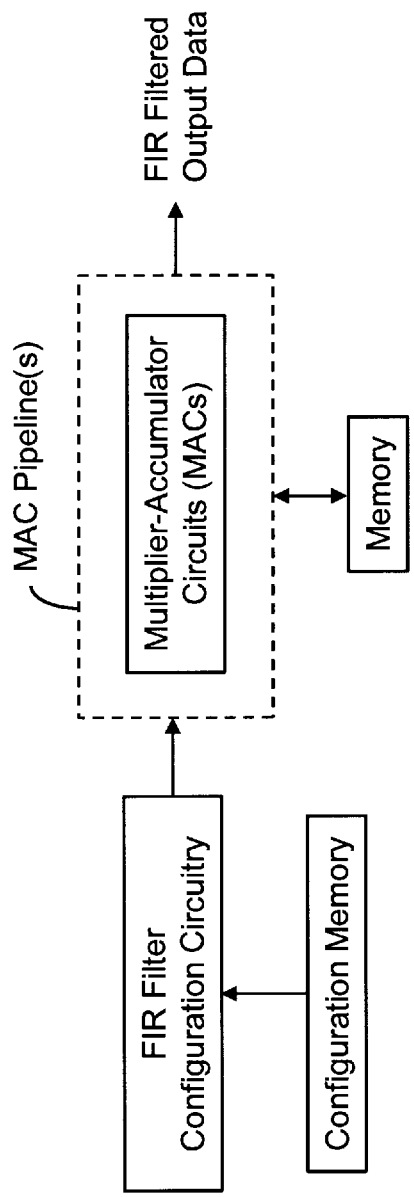
Figure 5A:
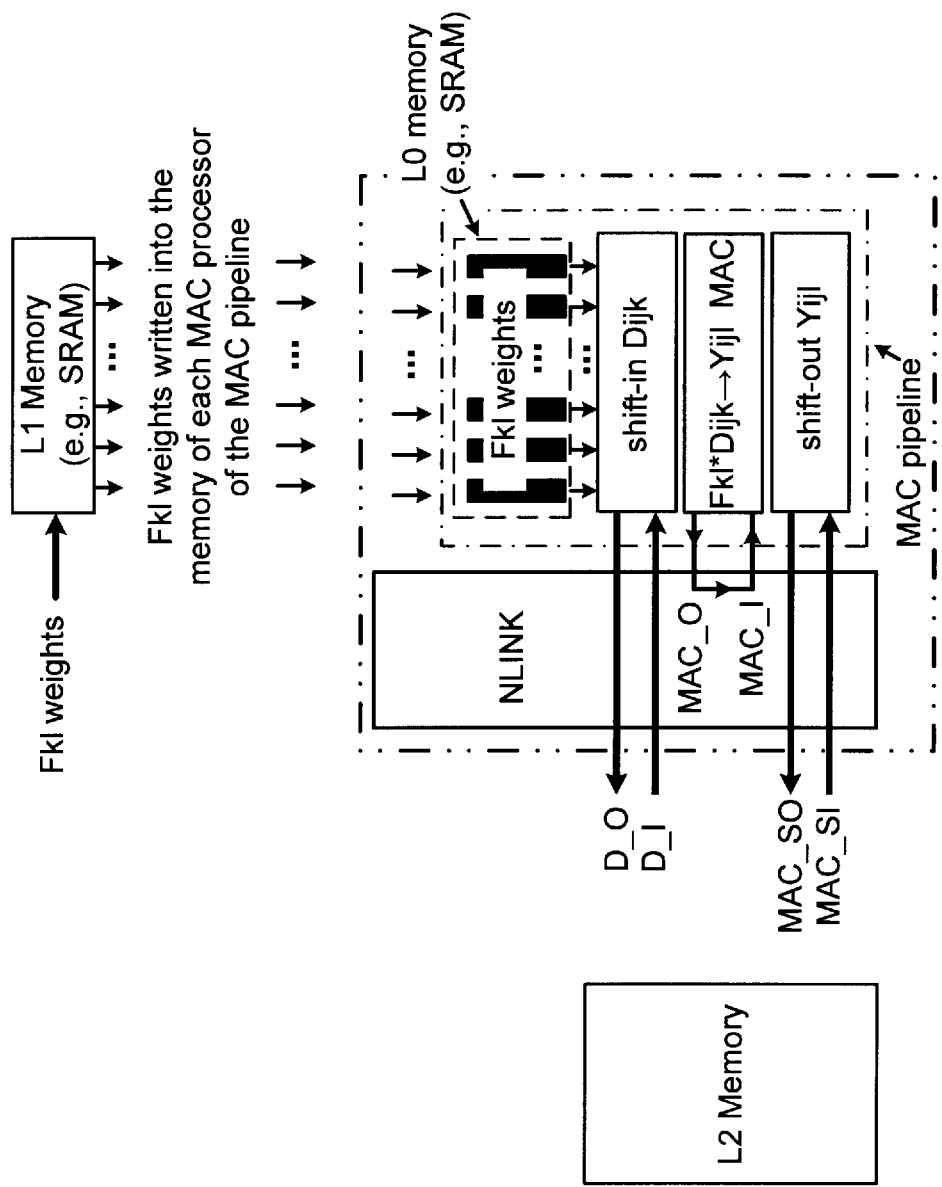
Figure 5B:
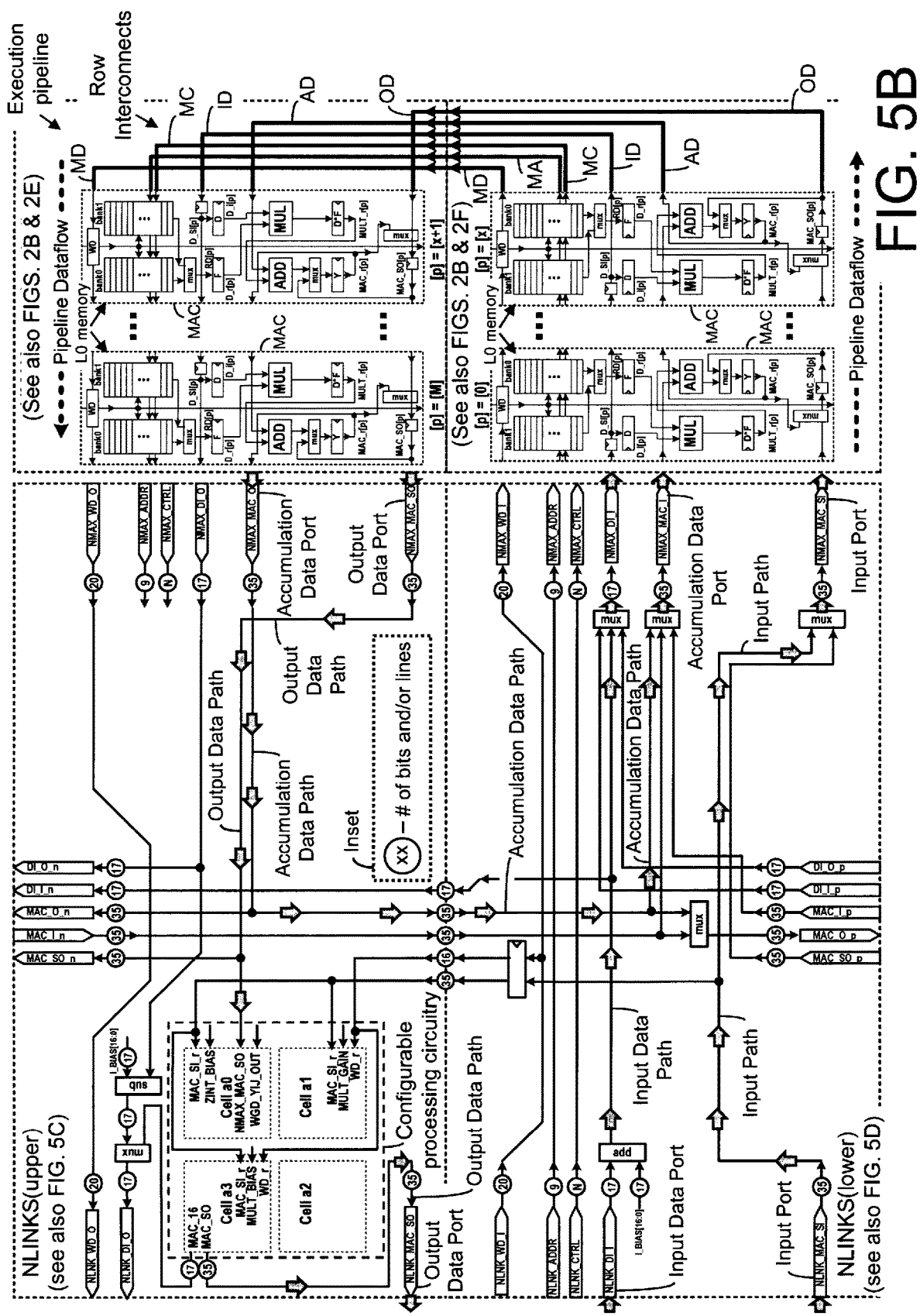
Figure 5C:
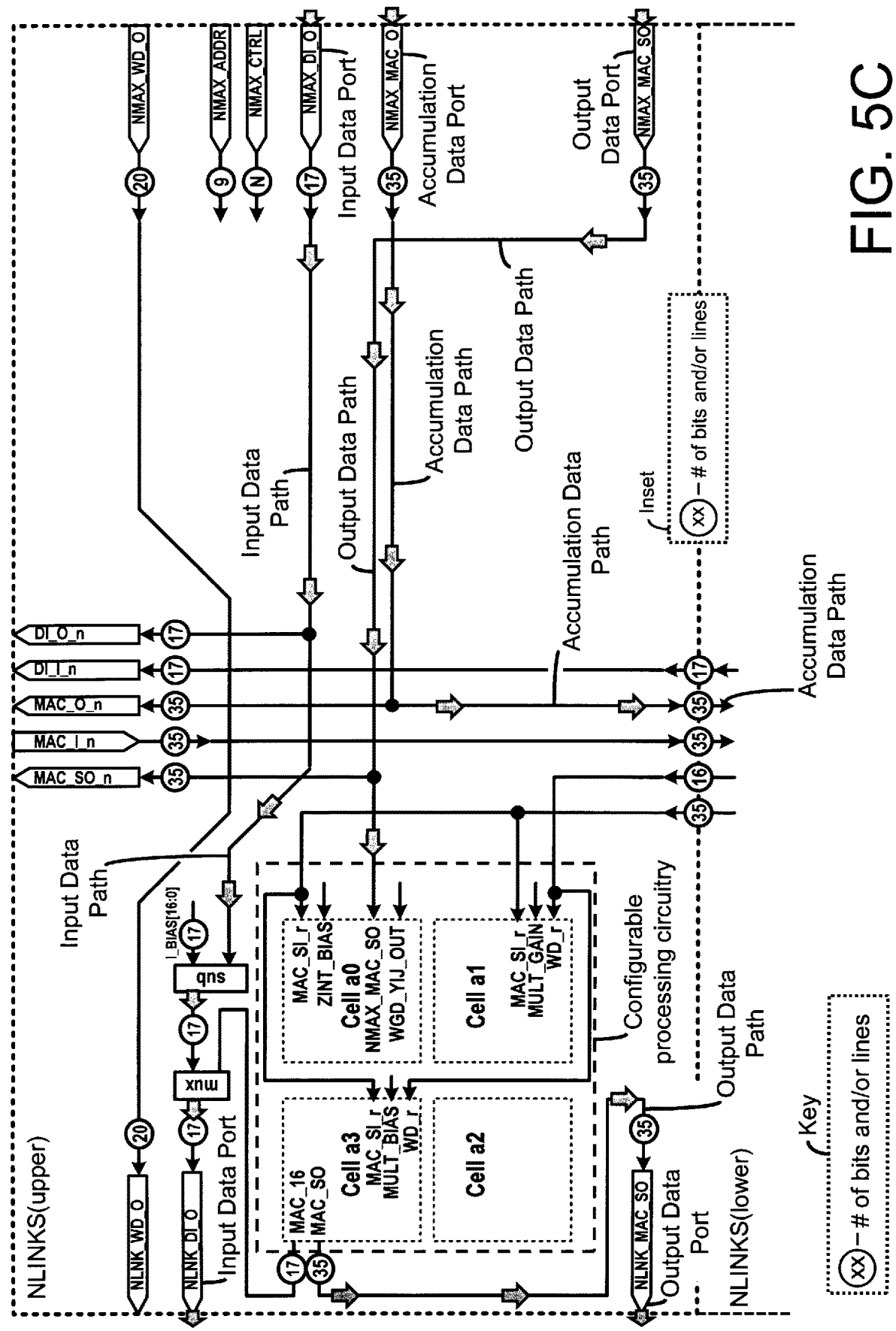
Figure 5D:
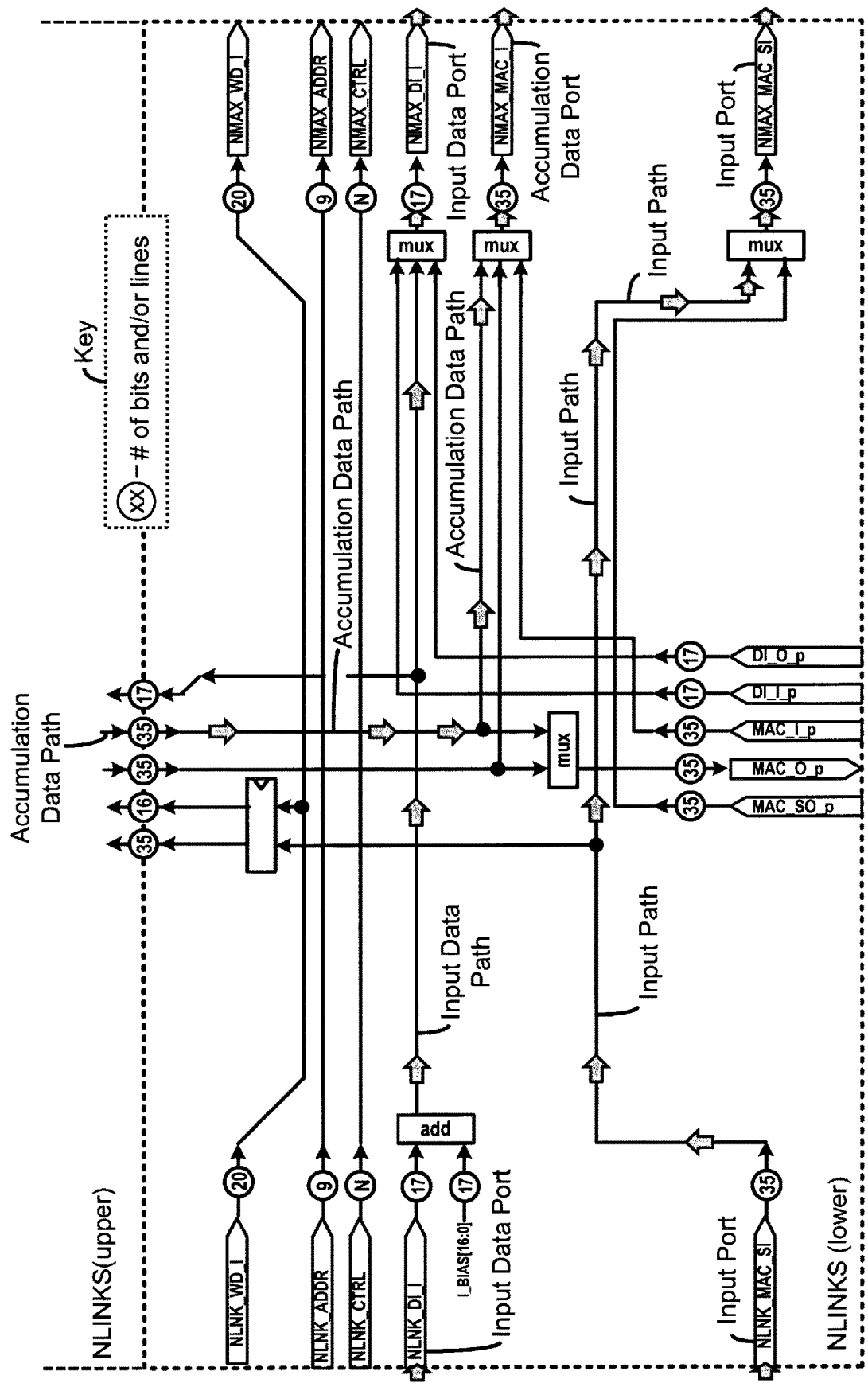
Figure 6:
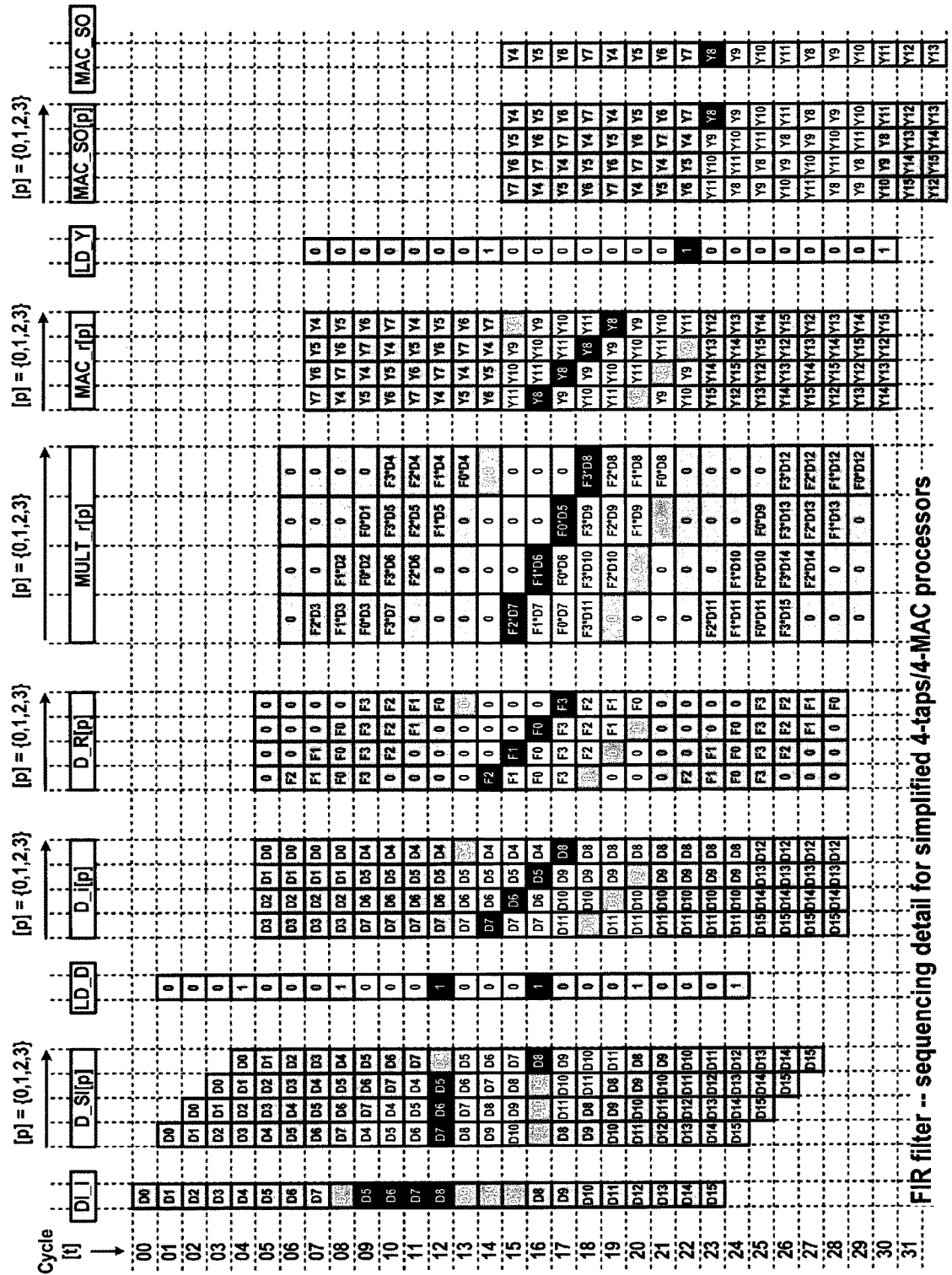
Figure 7A:
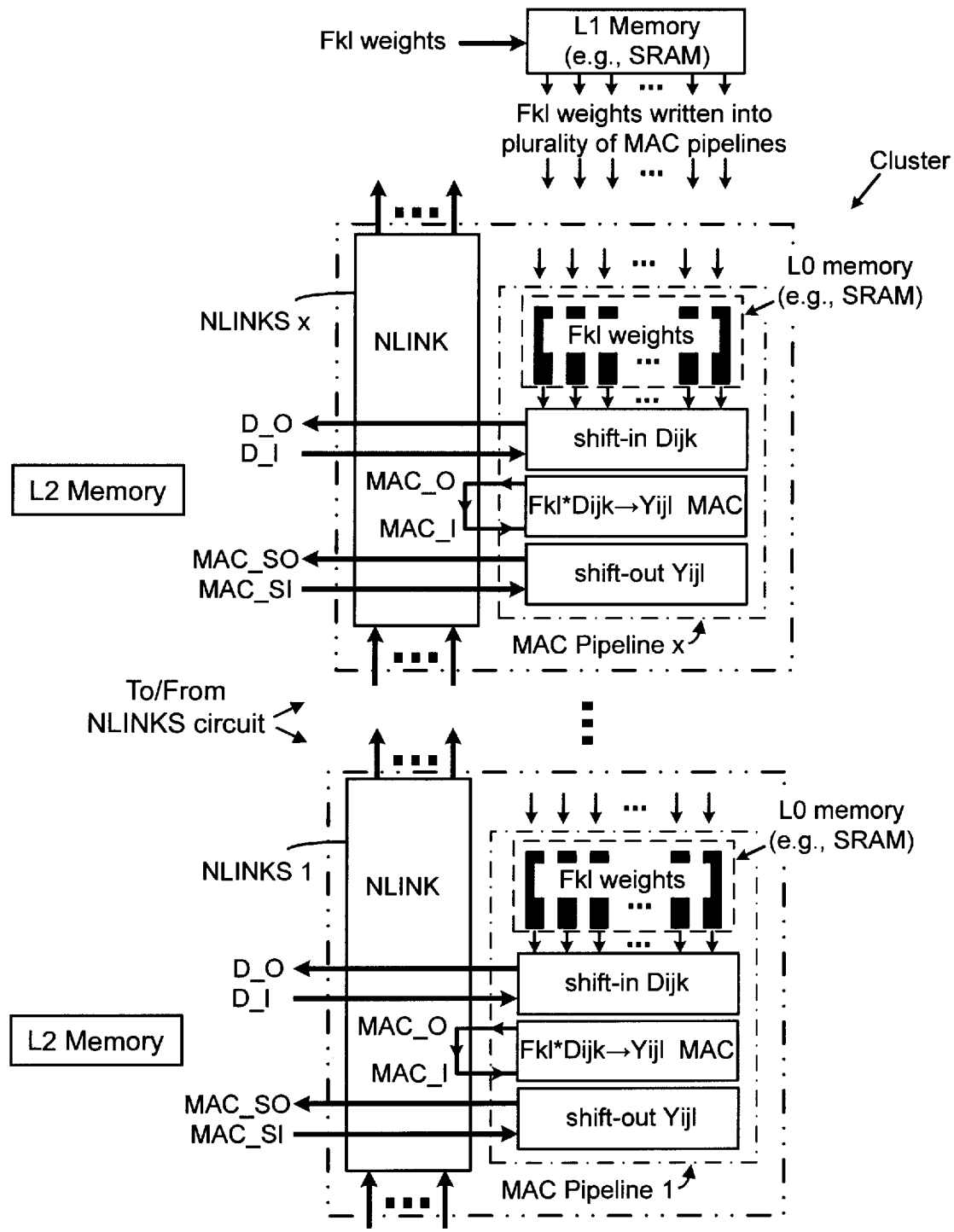
Figure 7B:
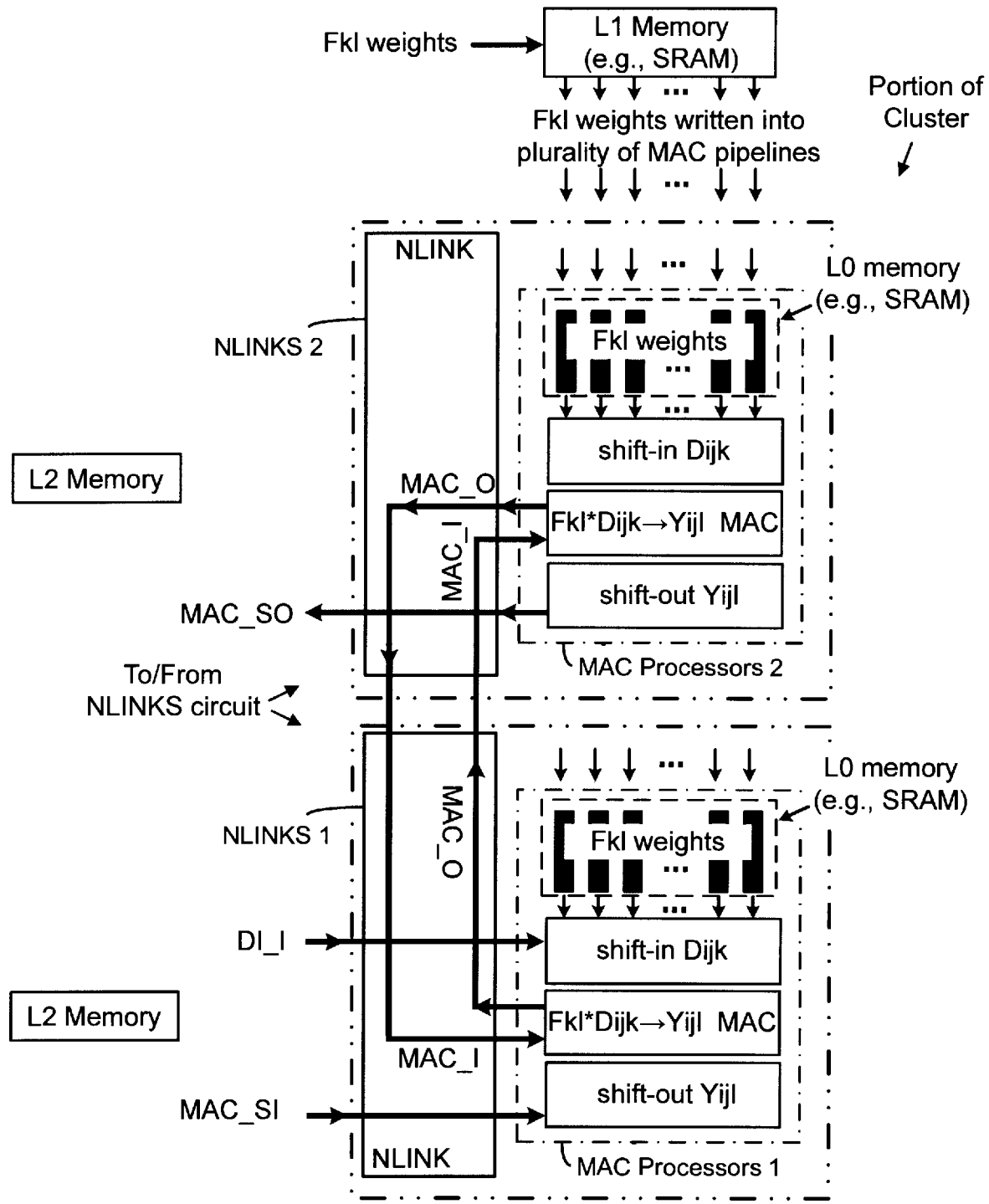
Figure 7C:
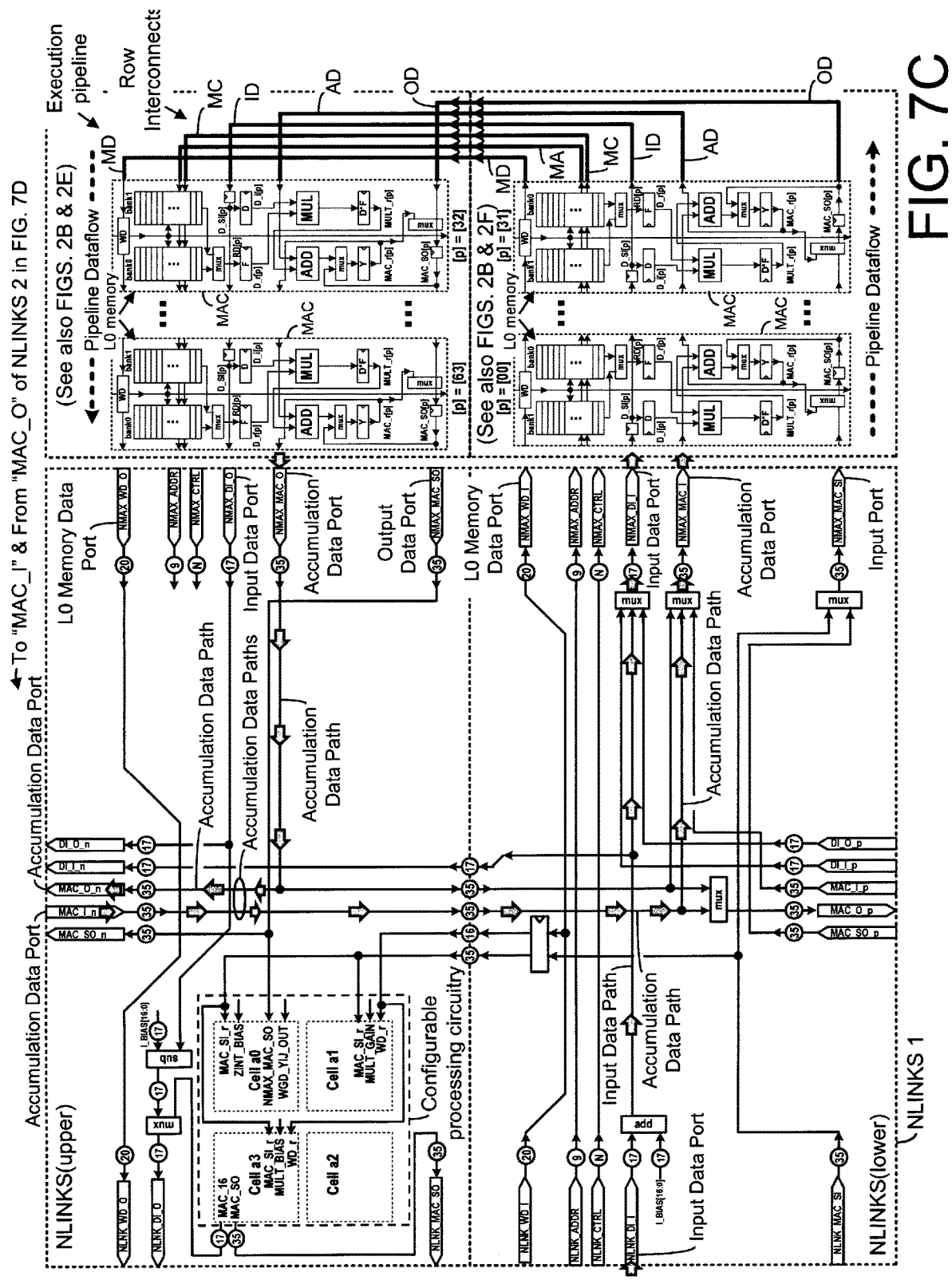
Figure 7D:
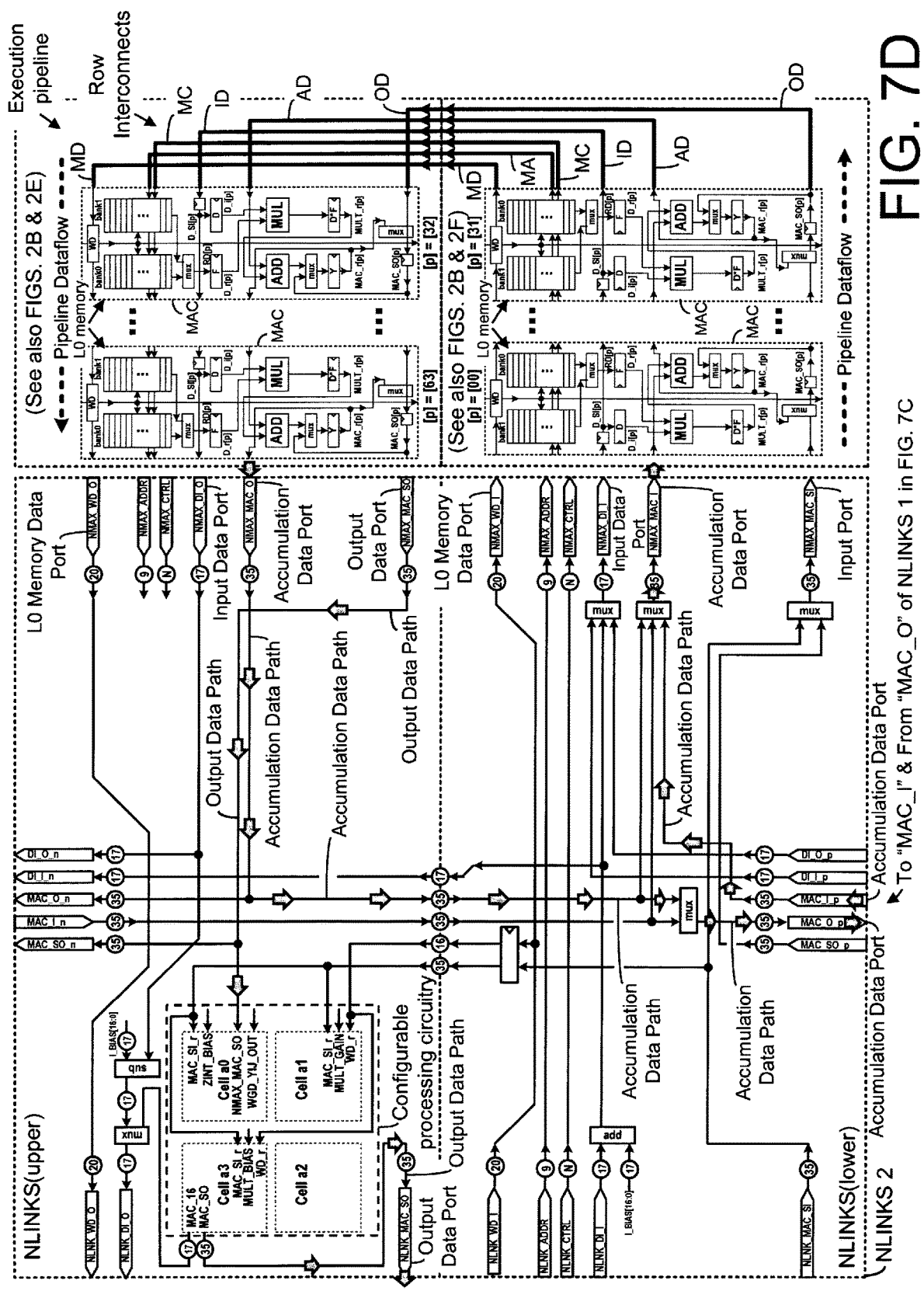
Figure 8A:
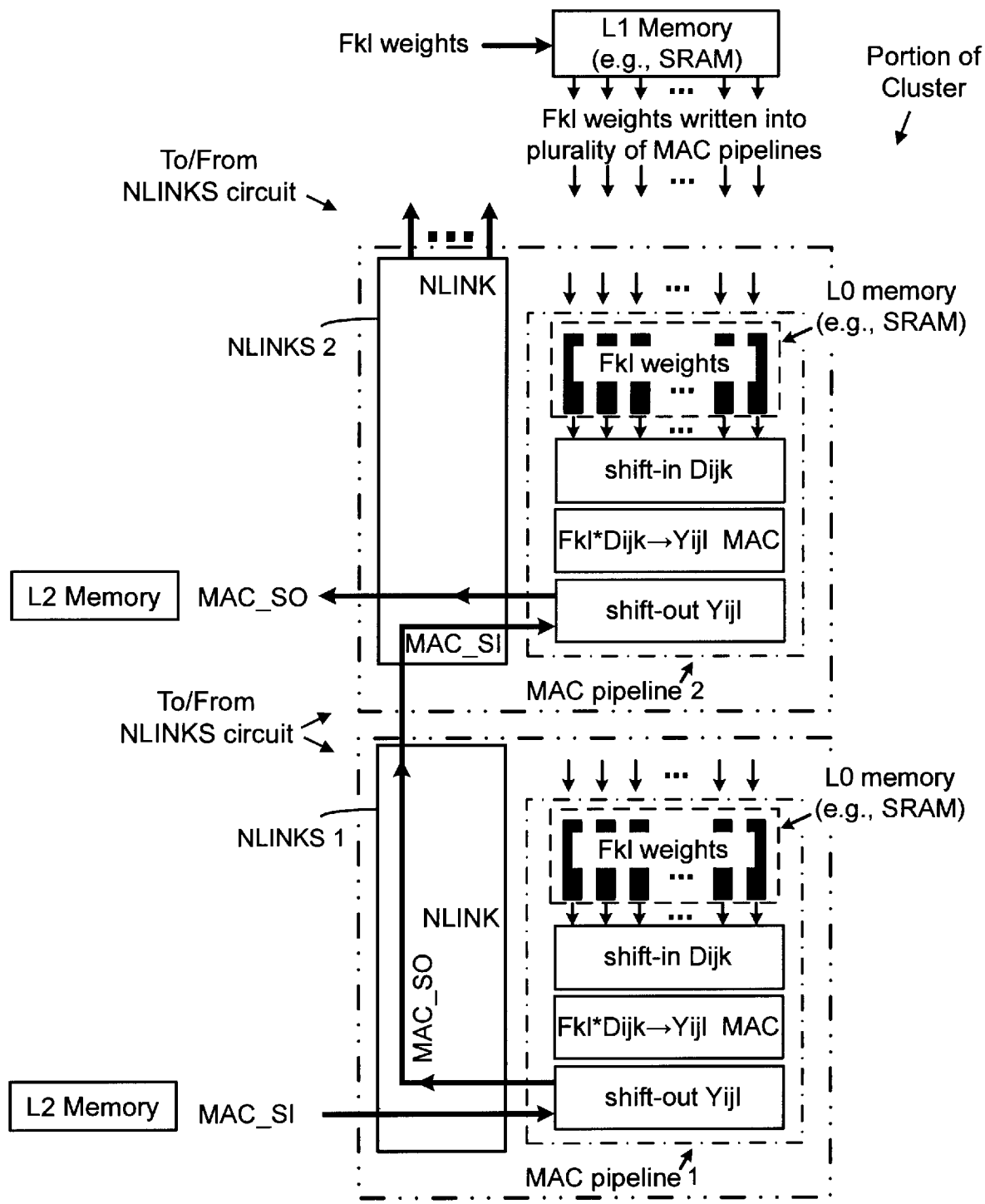
Figure 8B:
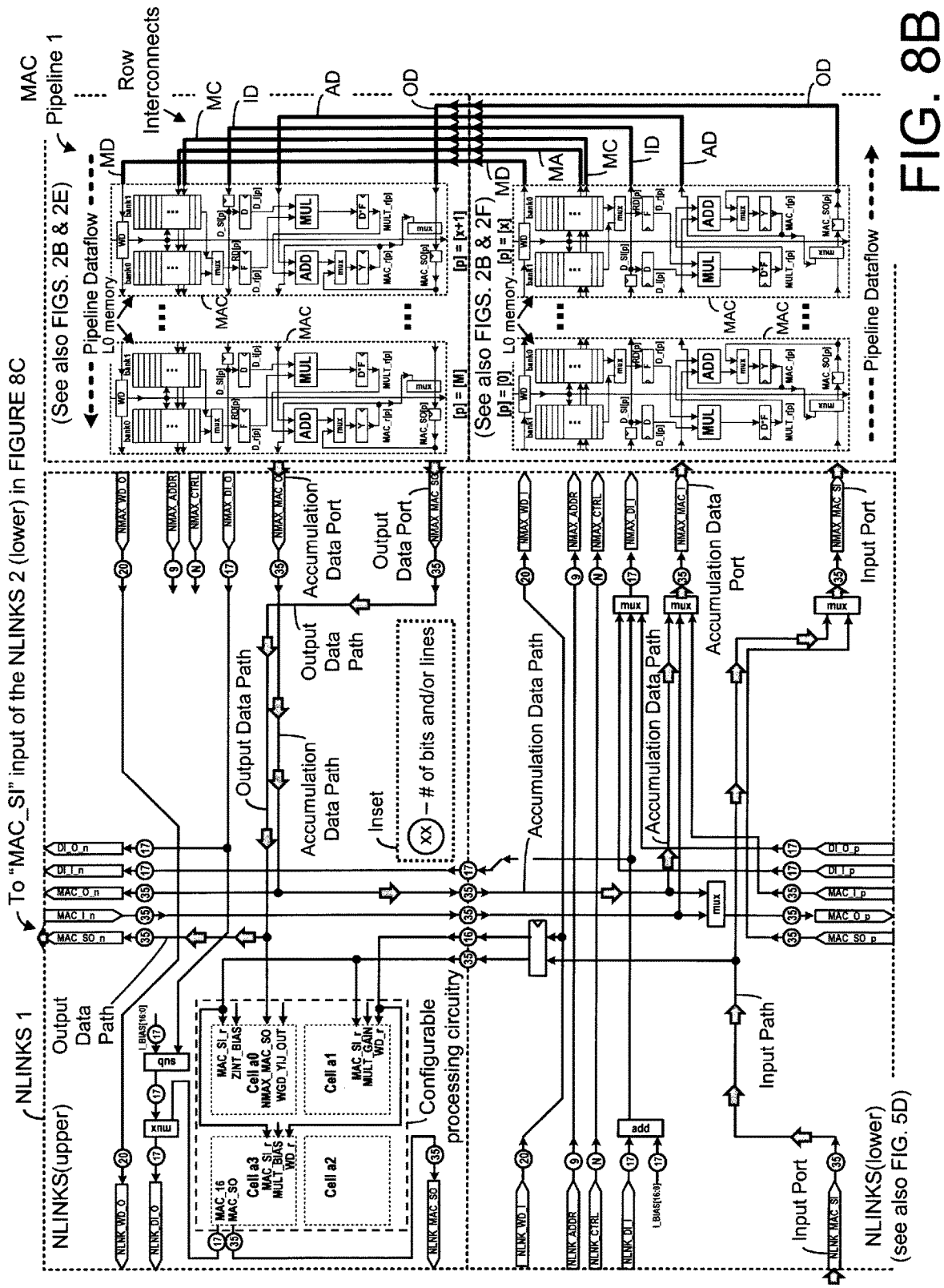
Figure 8C:
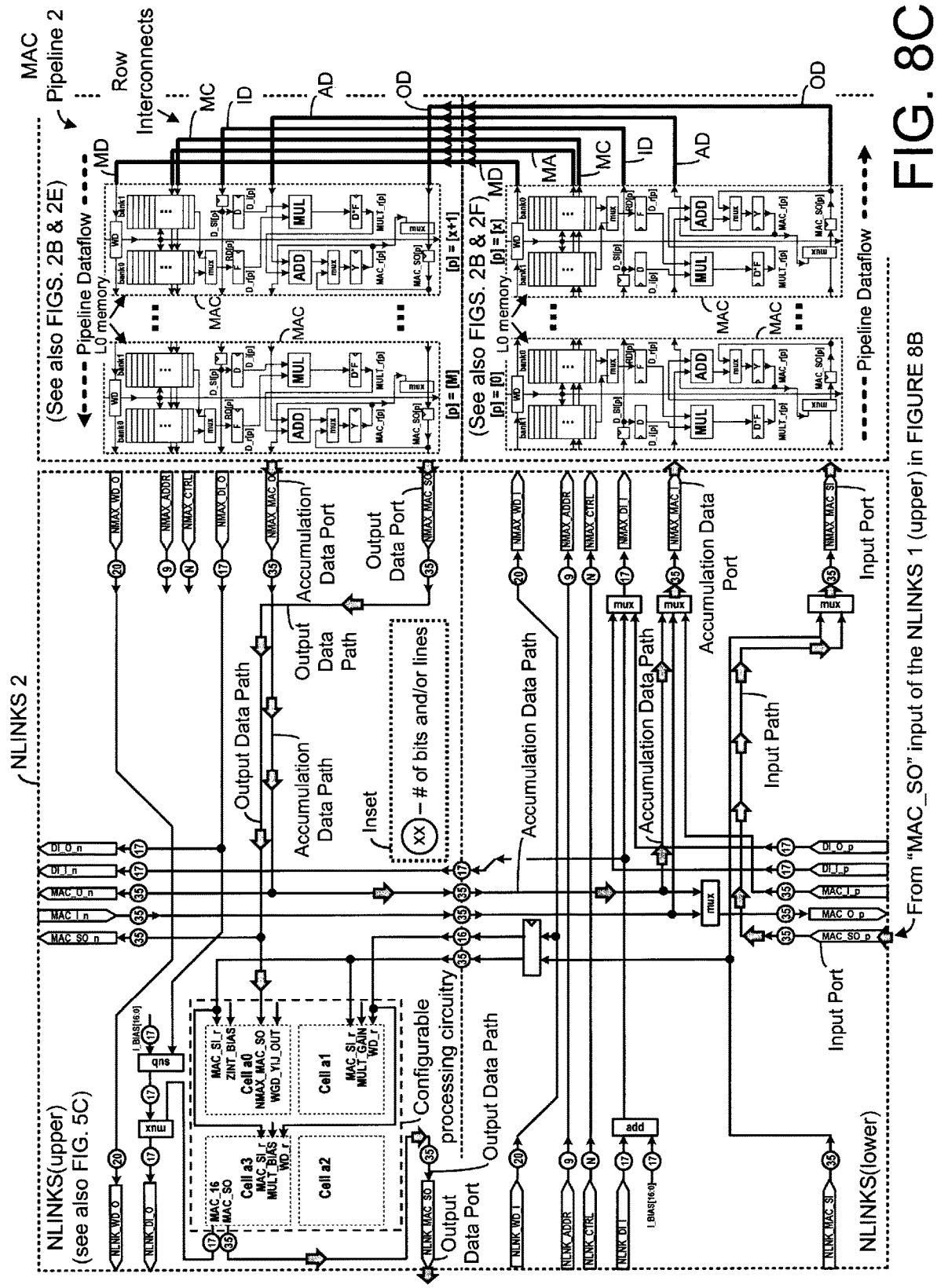
Figure 9A:
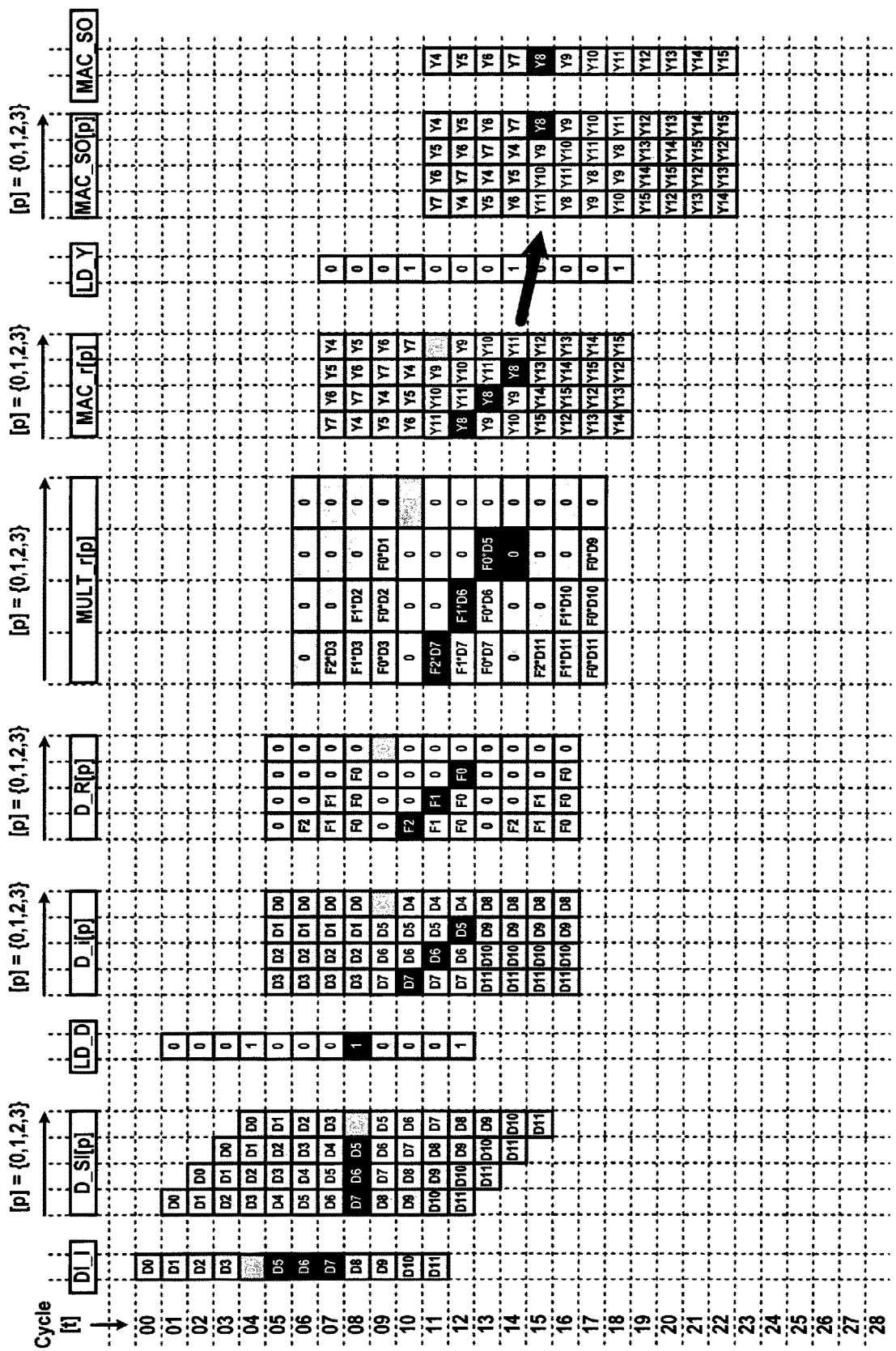
Figure 9B:
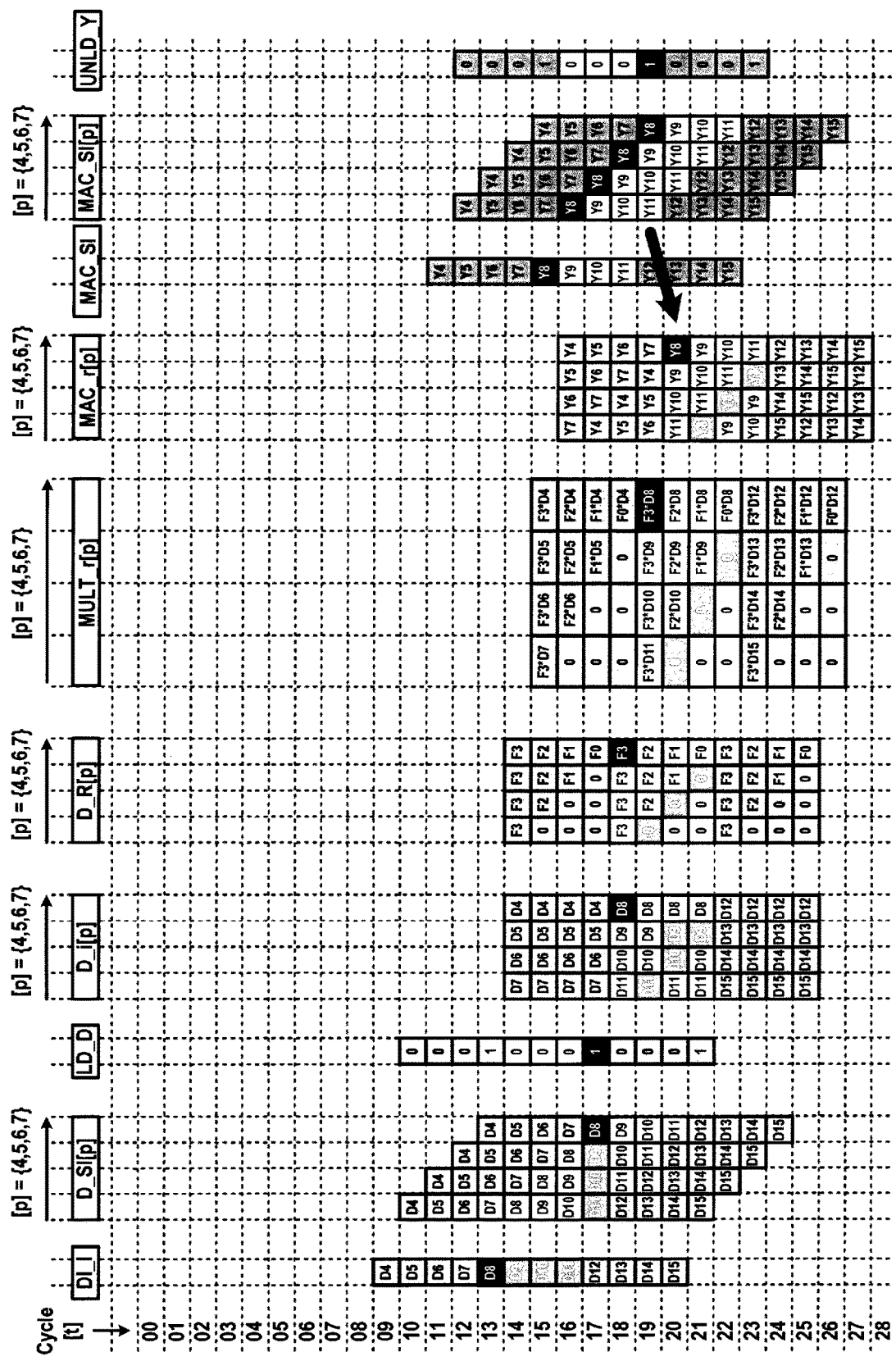
Figure 10A:
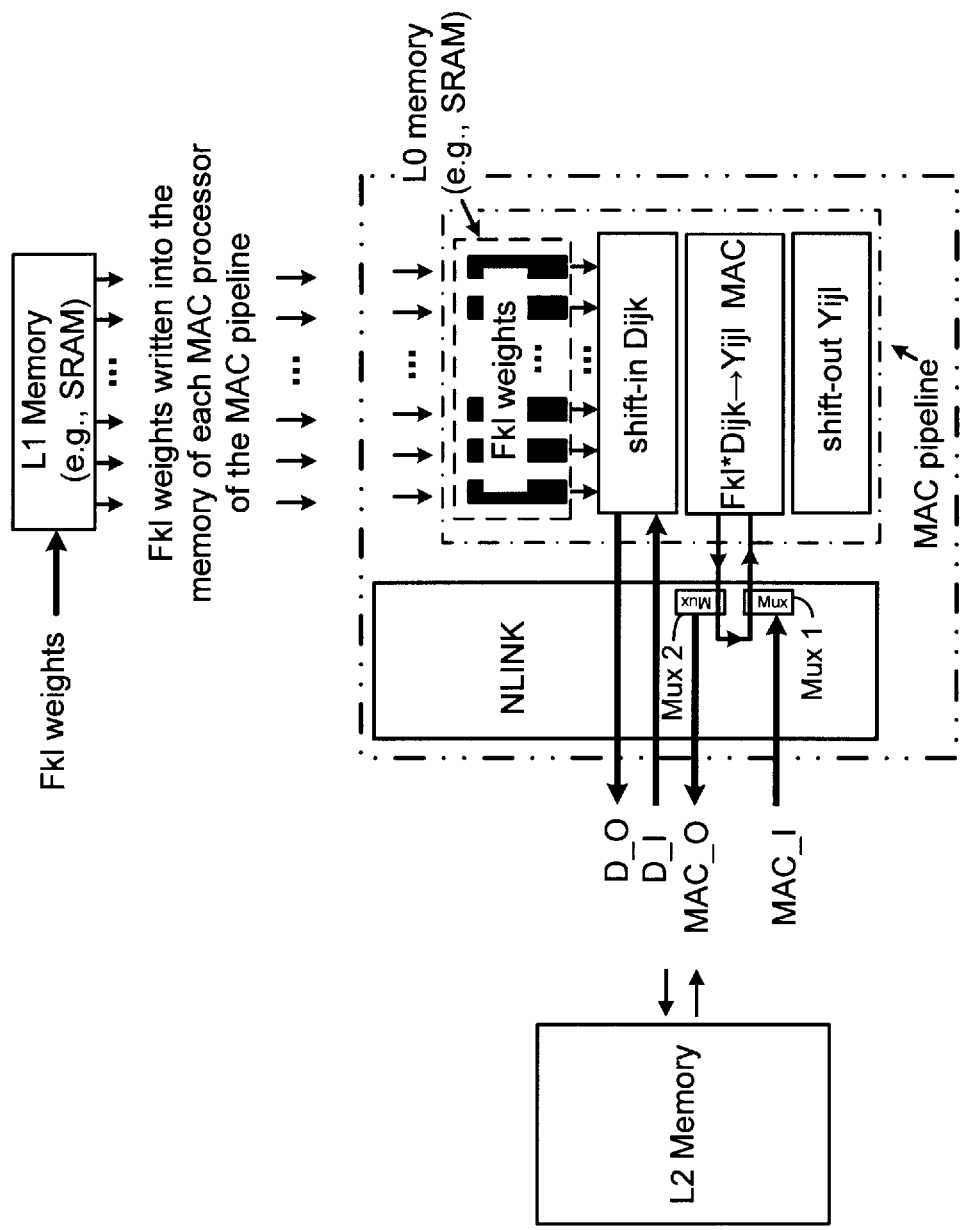
Figure 10B:
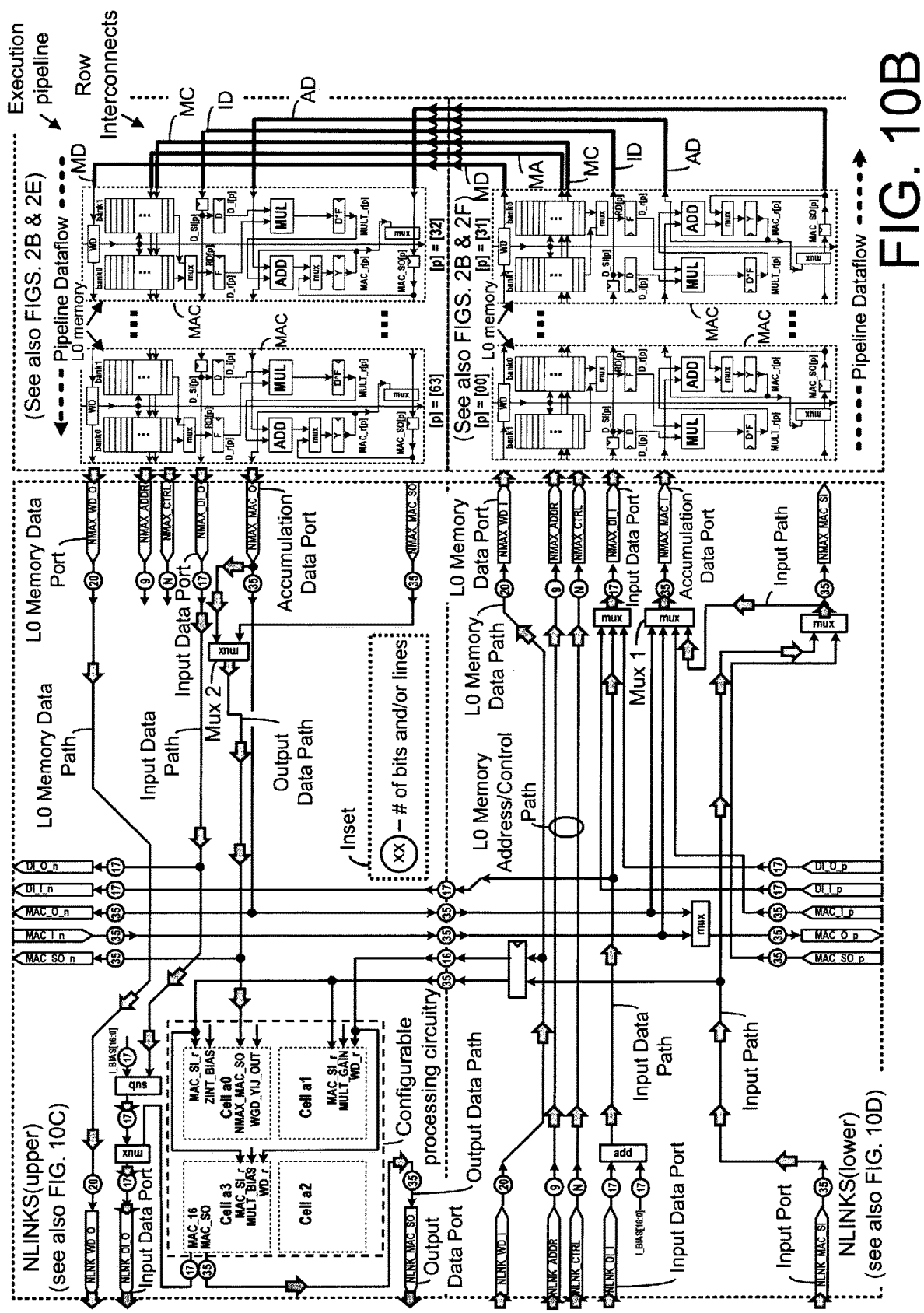
Figure 10C:
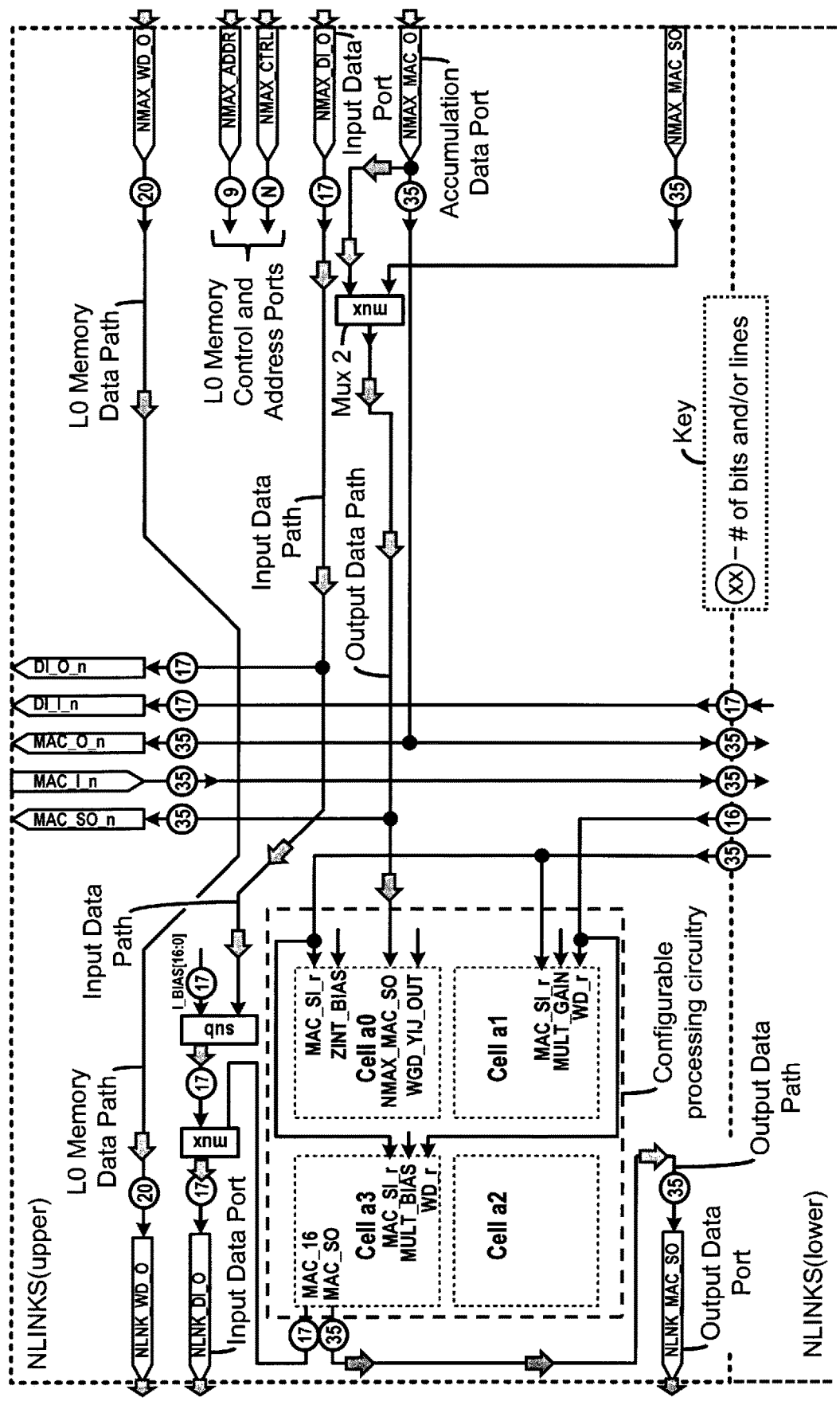
Figure 10D:
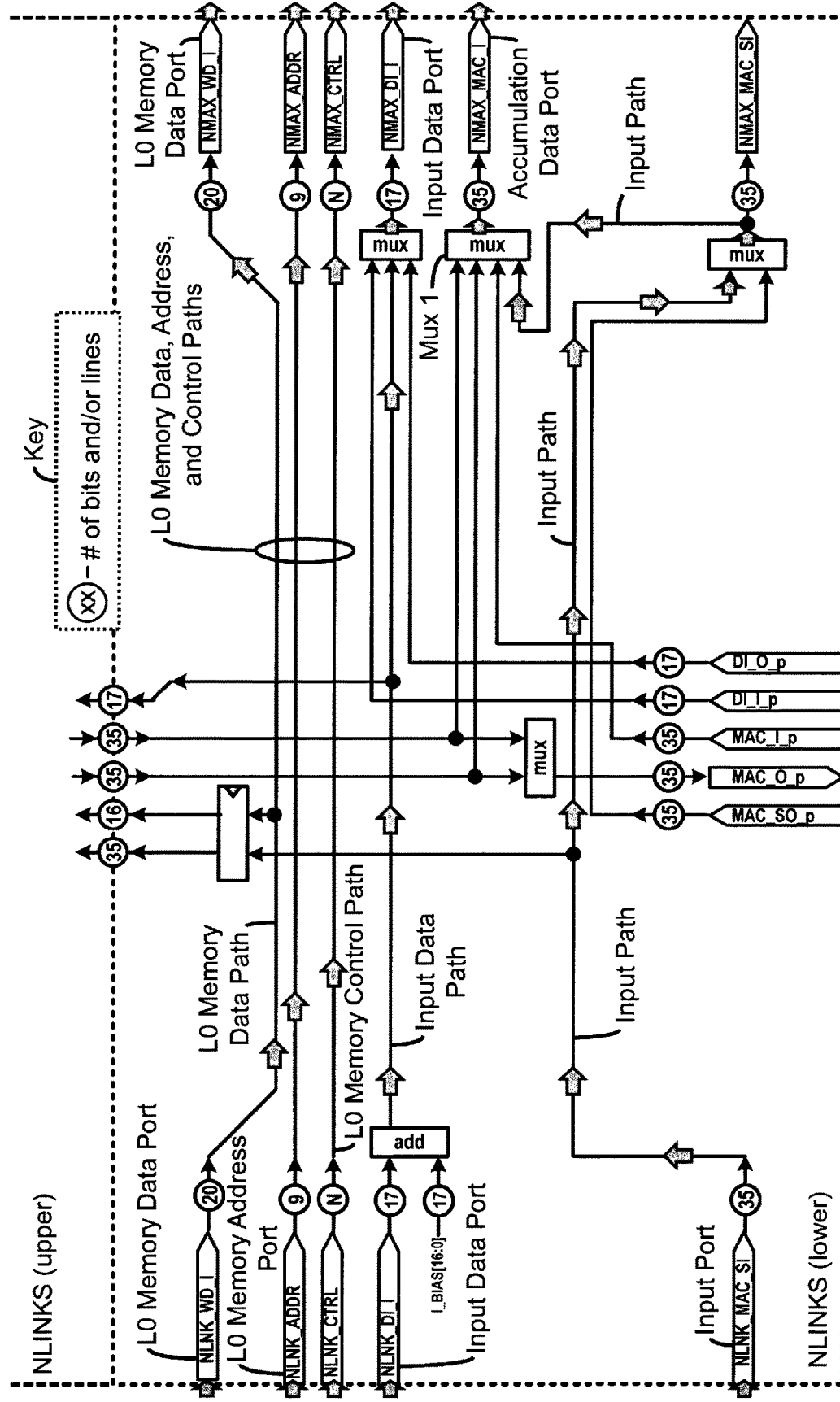
Figure 10E:
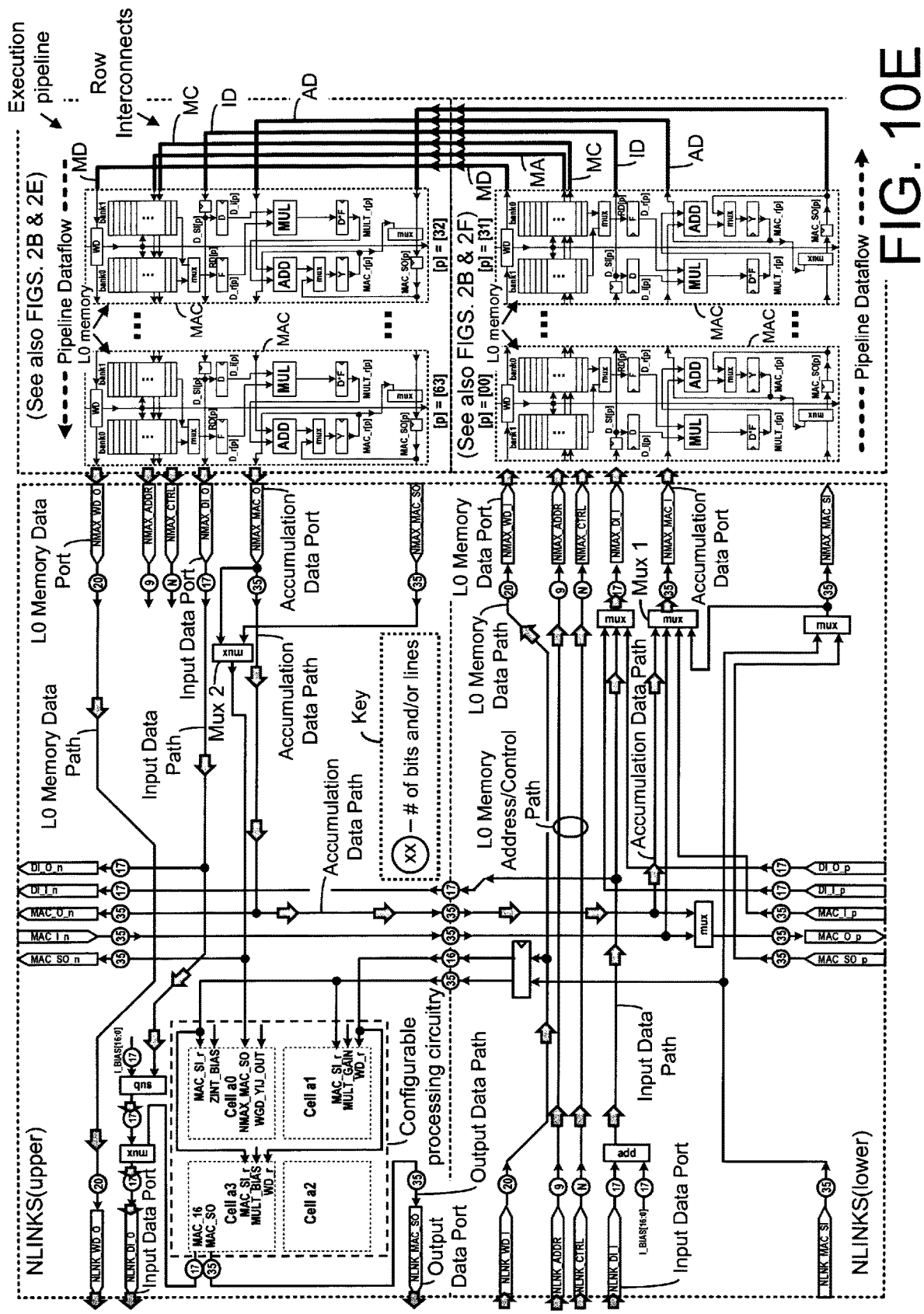
Figure 13A:
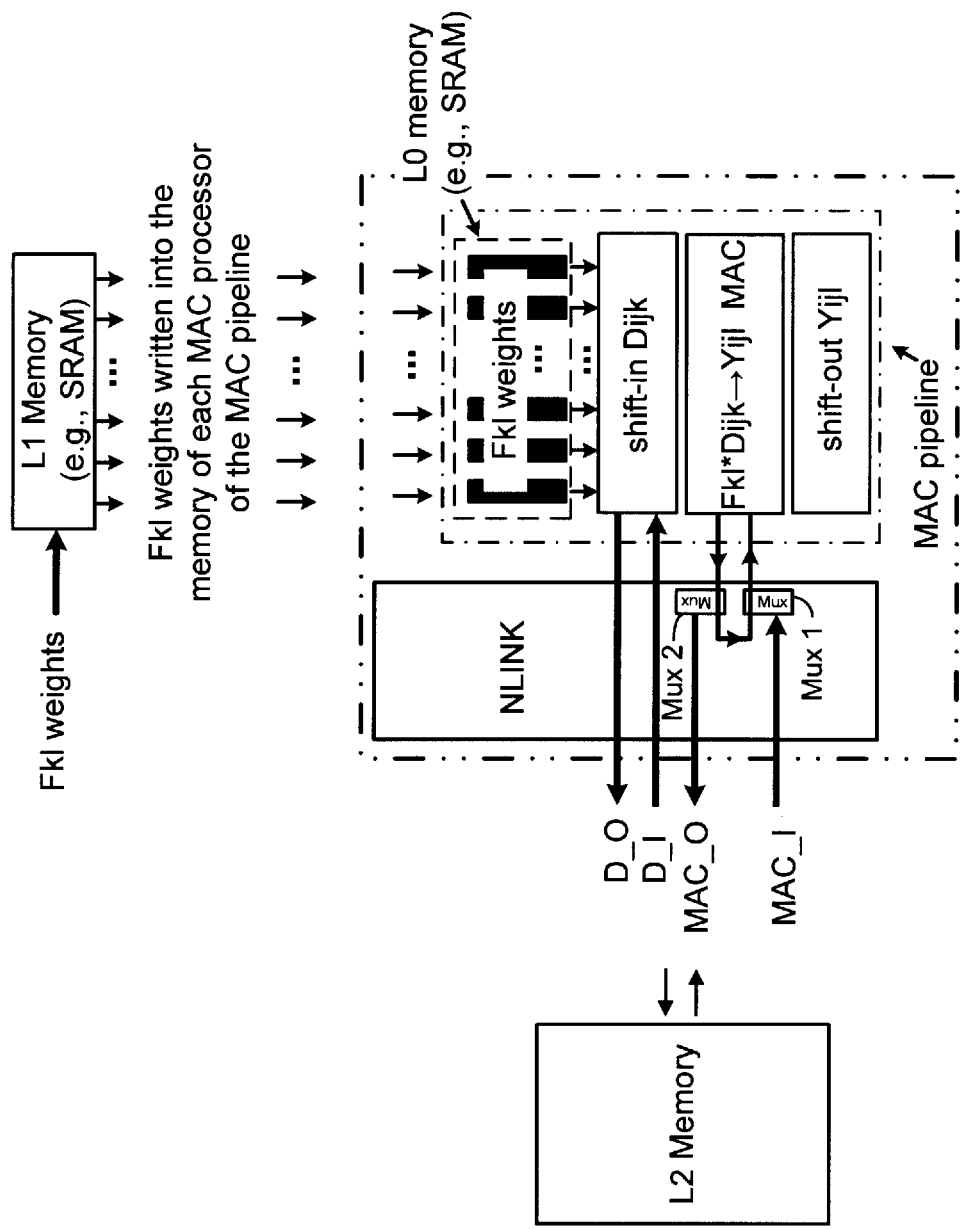
Figure 13B:
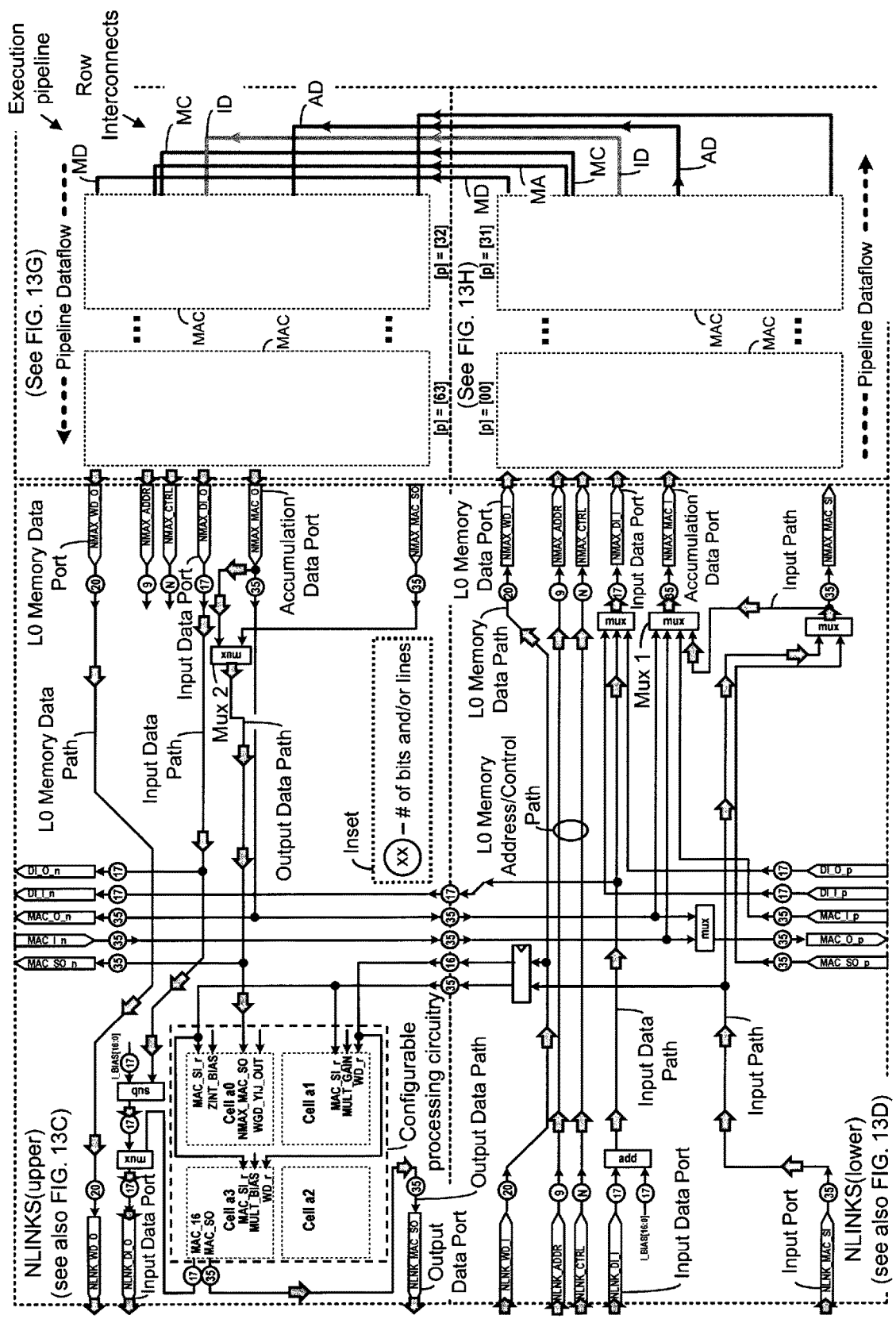
Figure 13C:
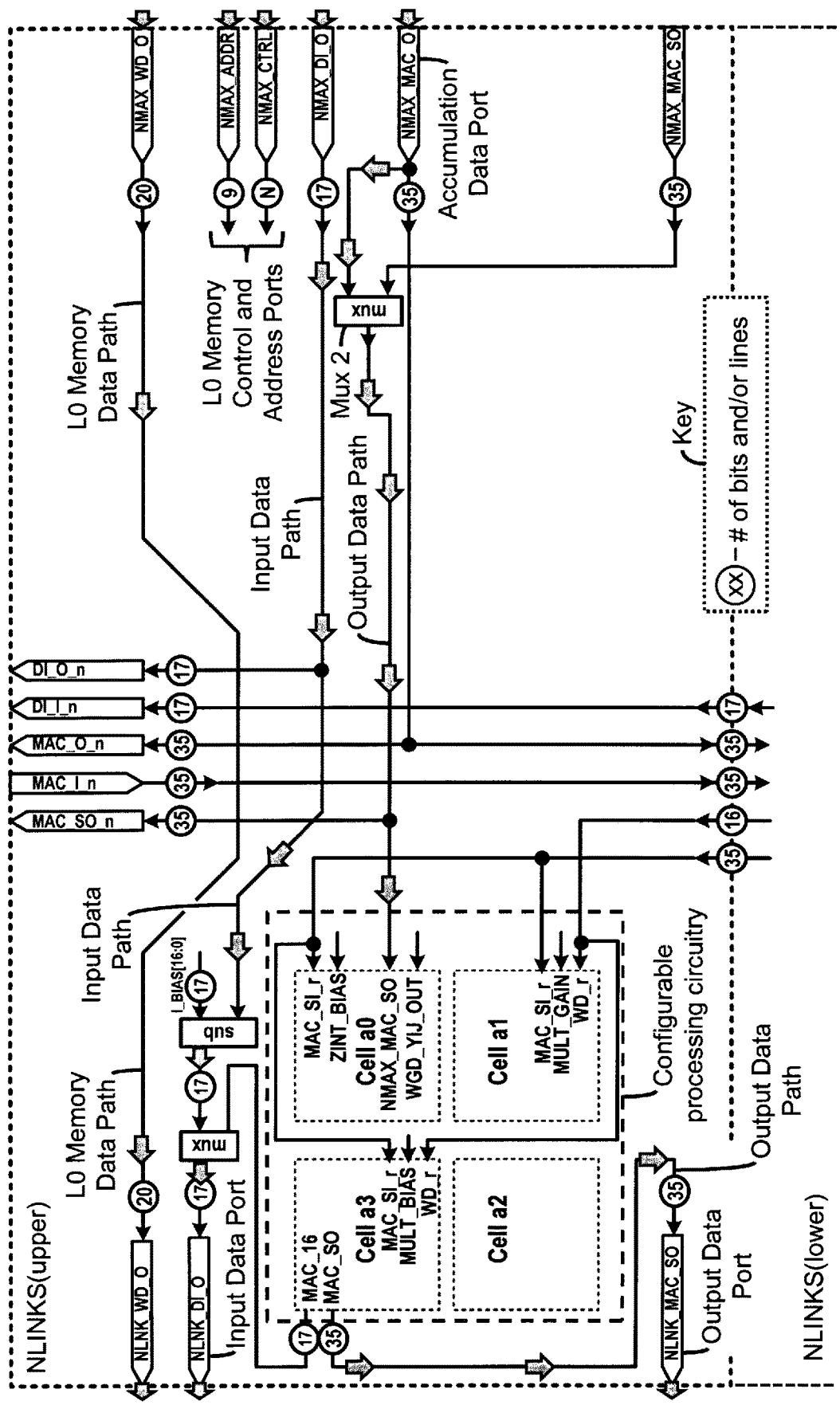
Figure 13D:
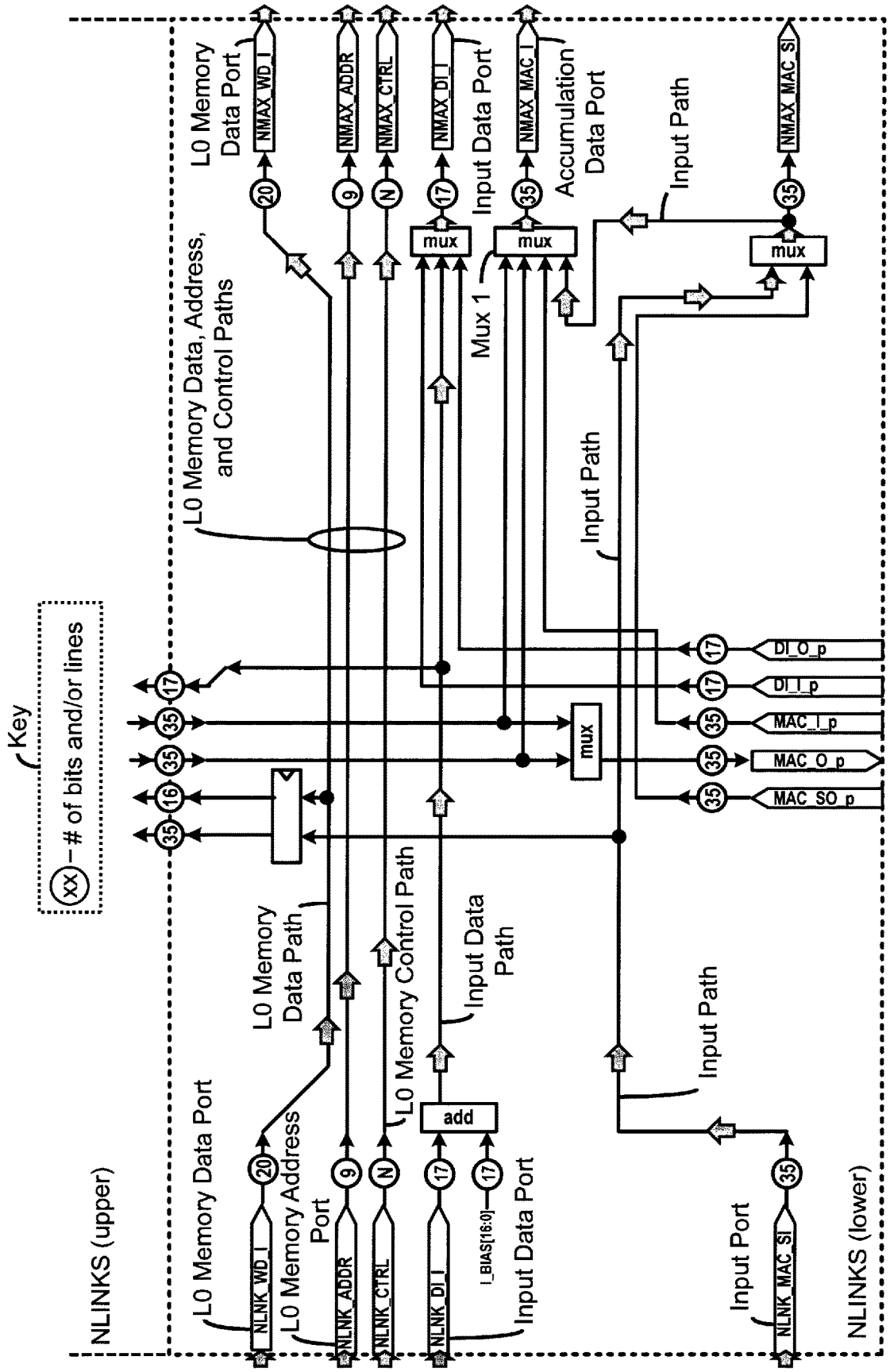
Figure 13E:
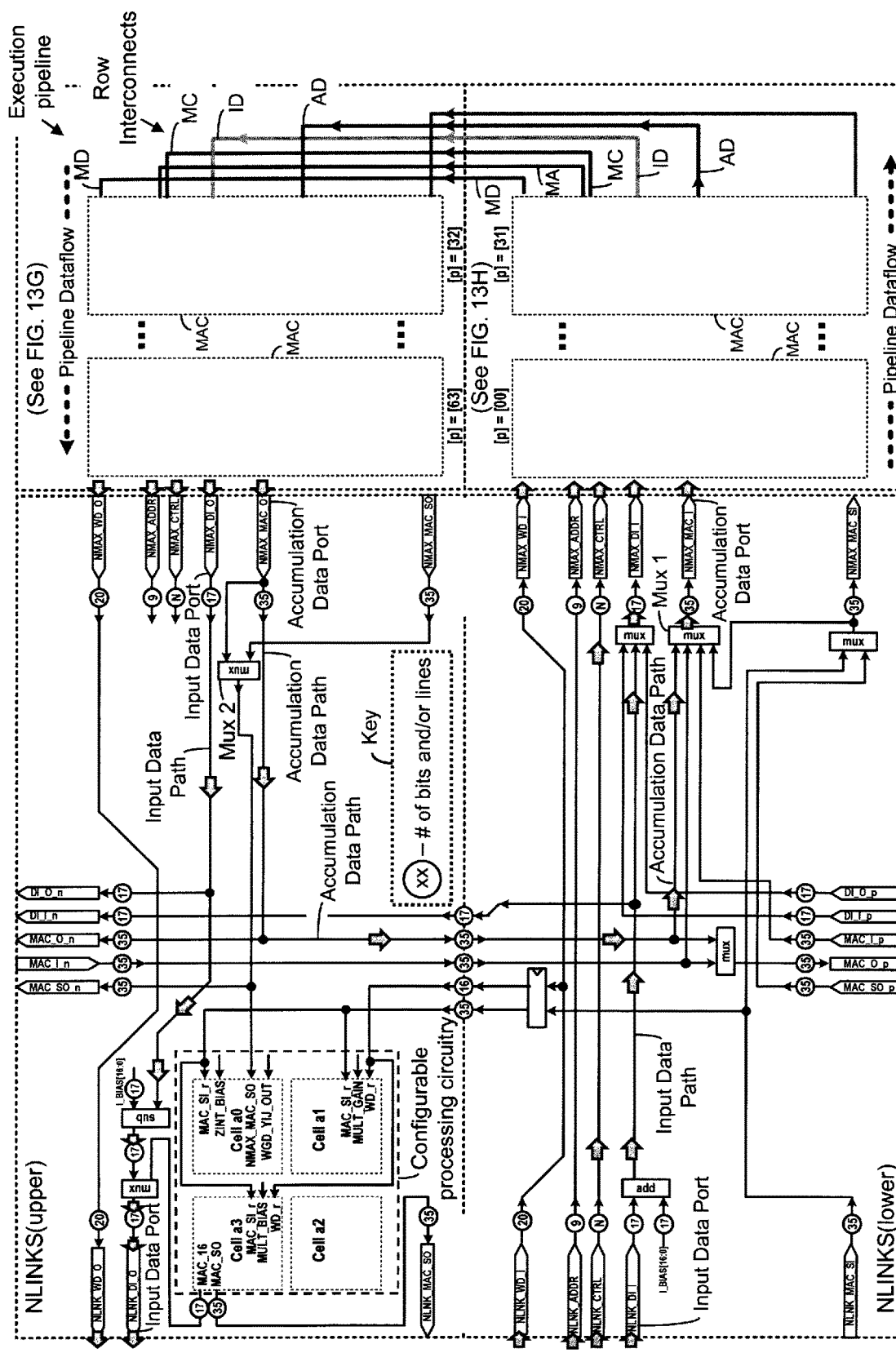
Figure 13F:
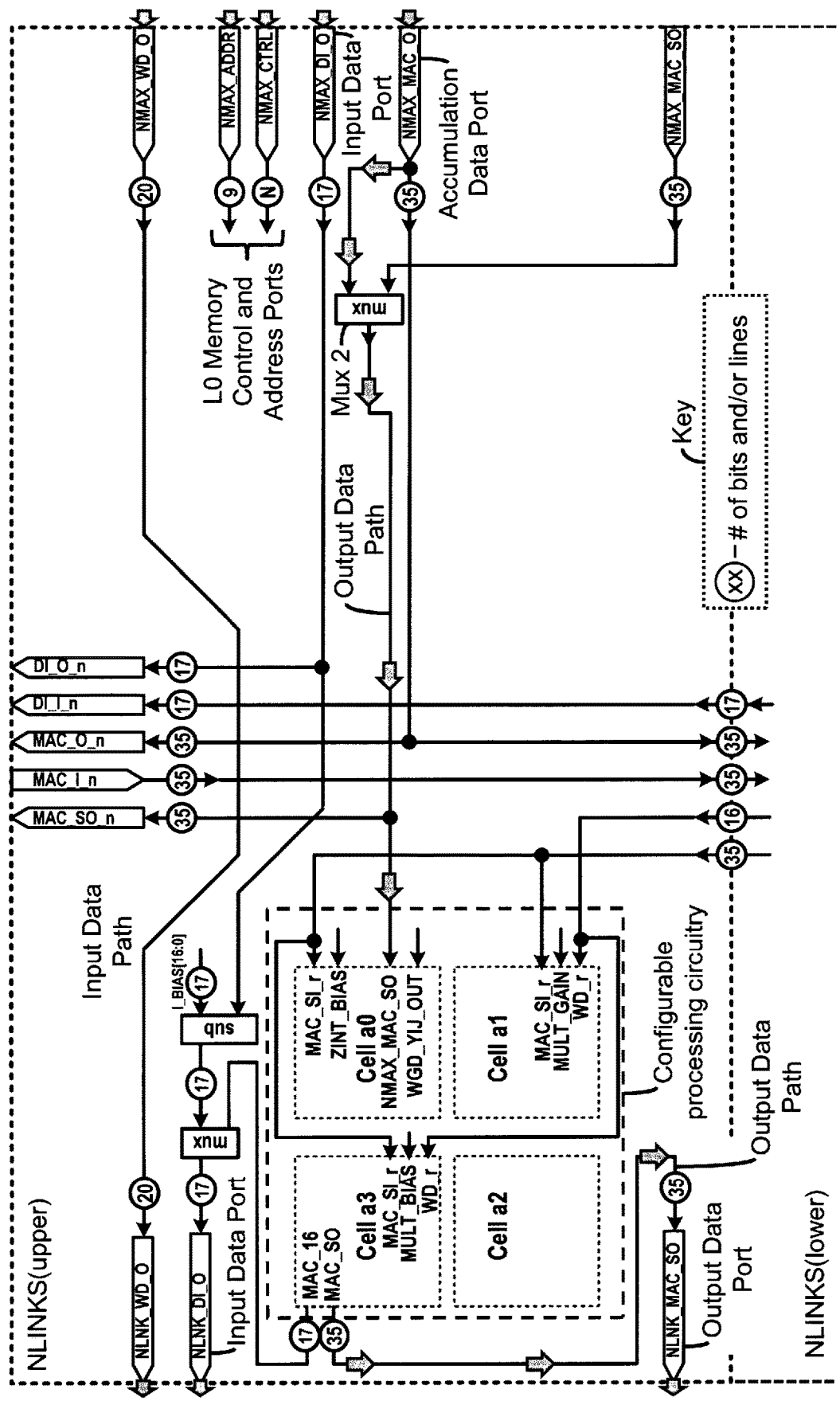
Figure 13G:
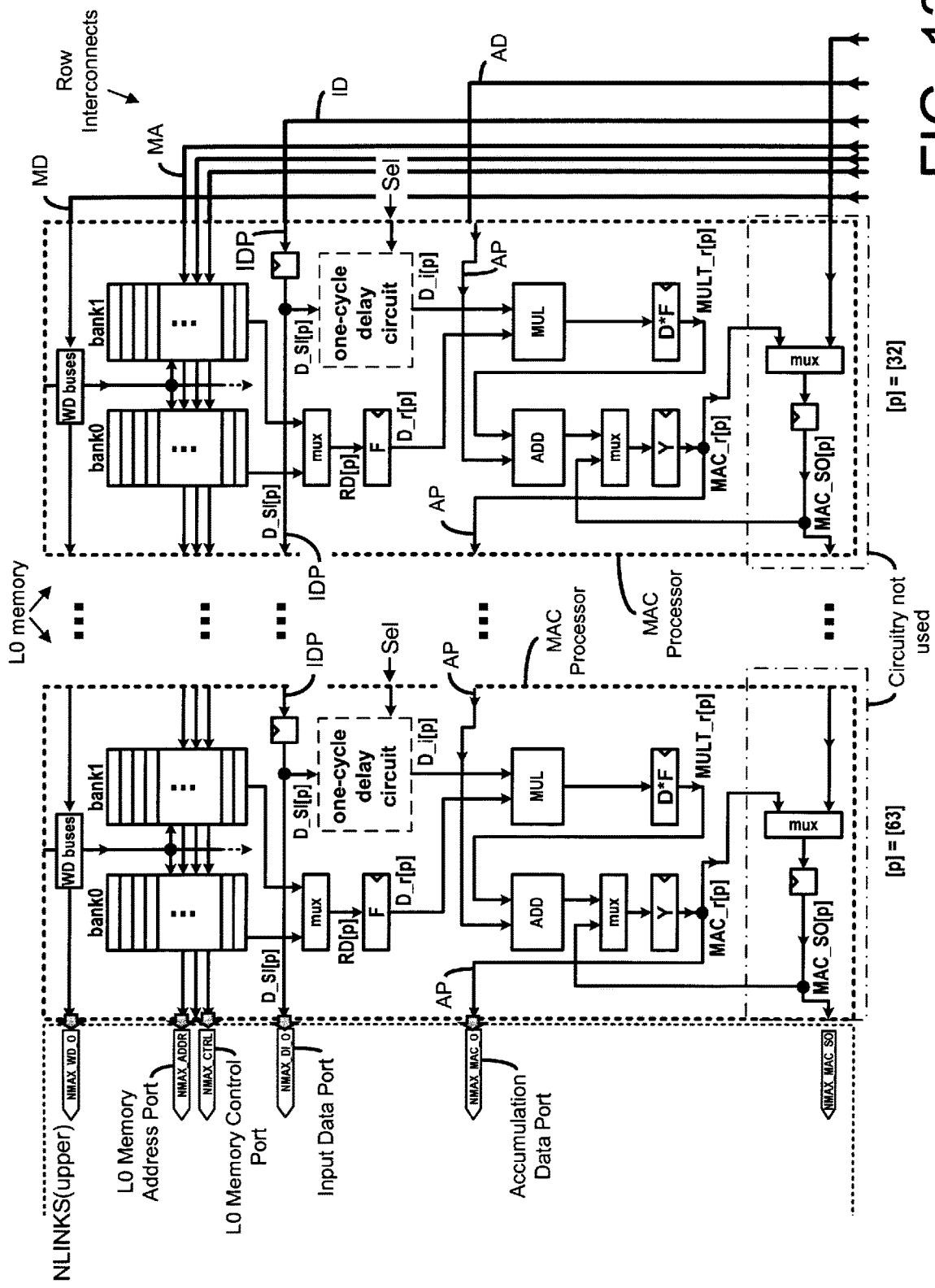
Figure 13H:
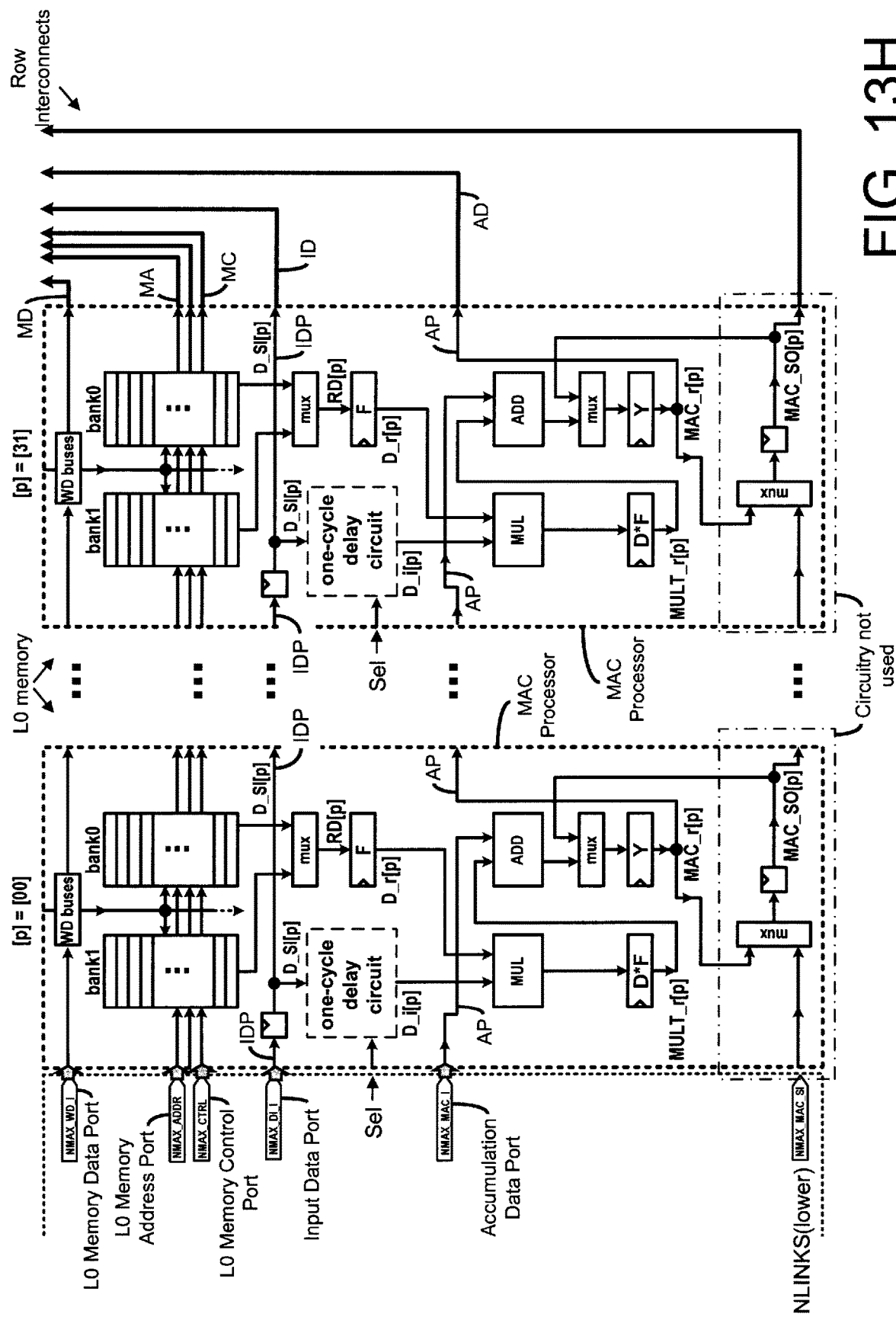
Figures 14A, 14B:
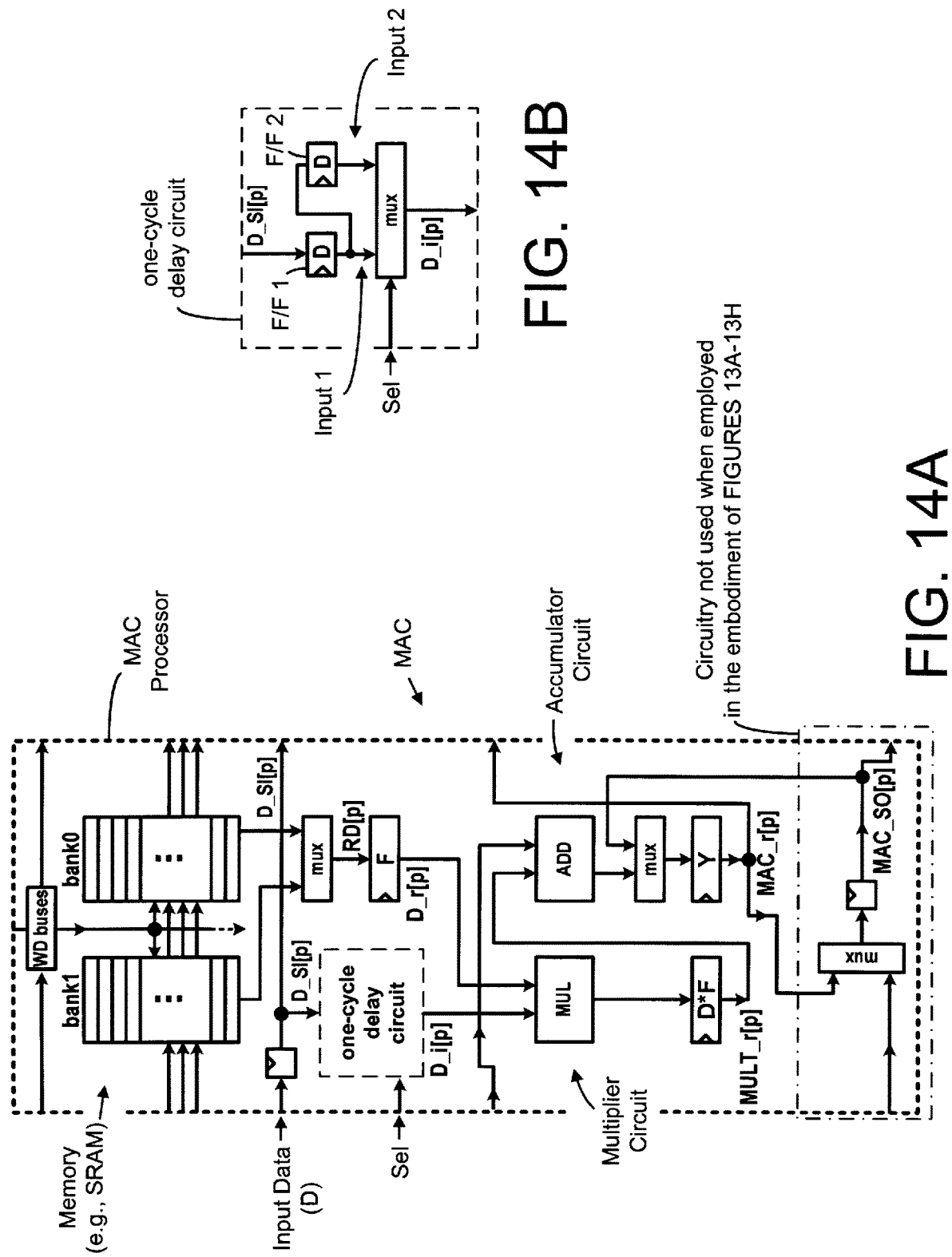
Figure 16A:
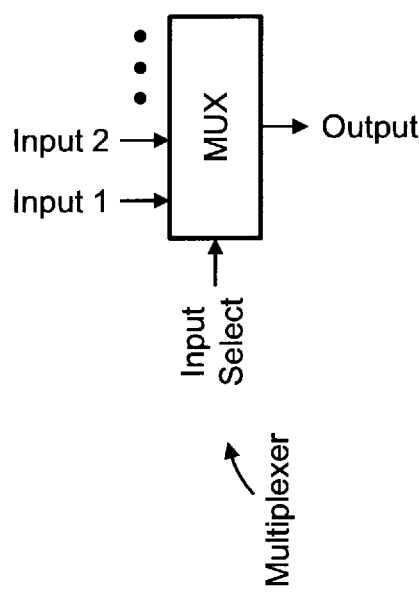
Figure 16B:
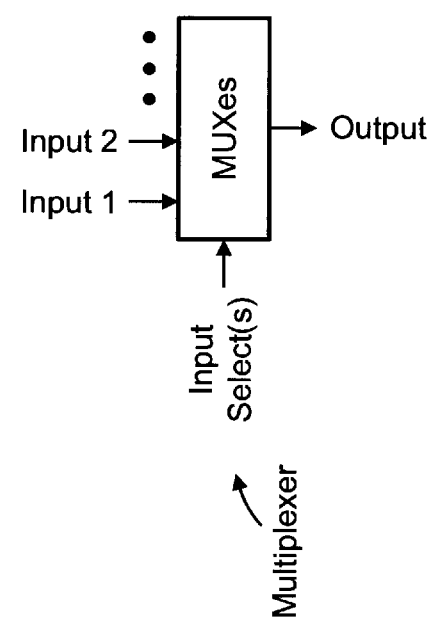
Figure 17A:
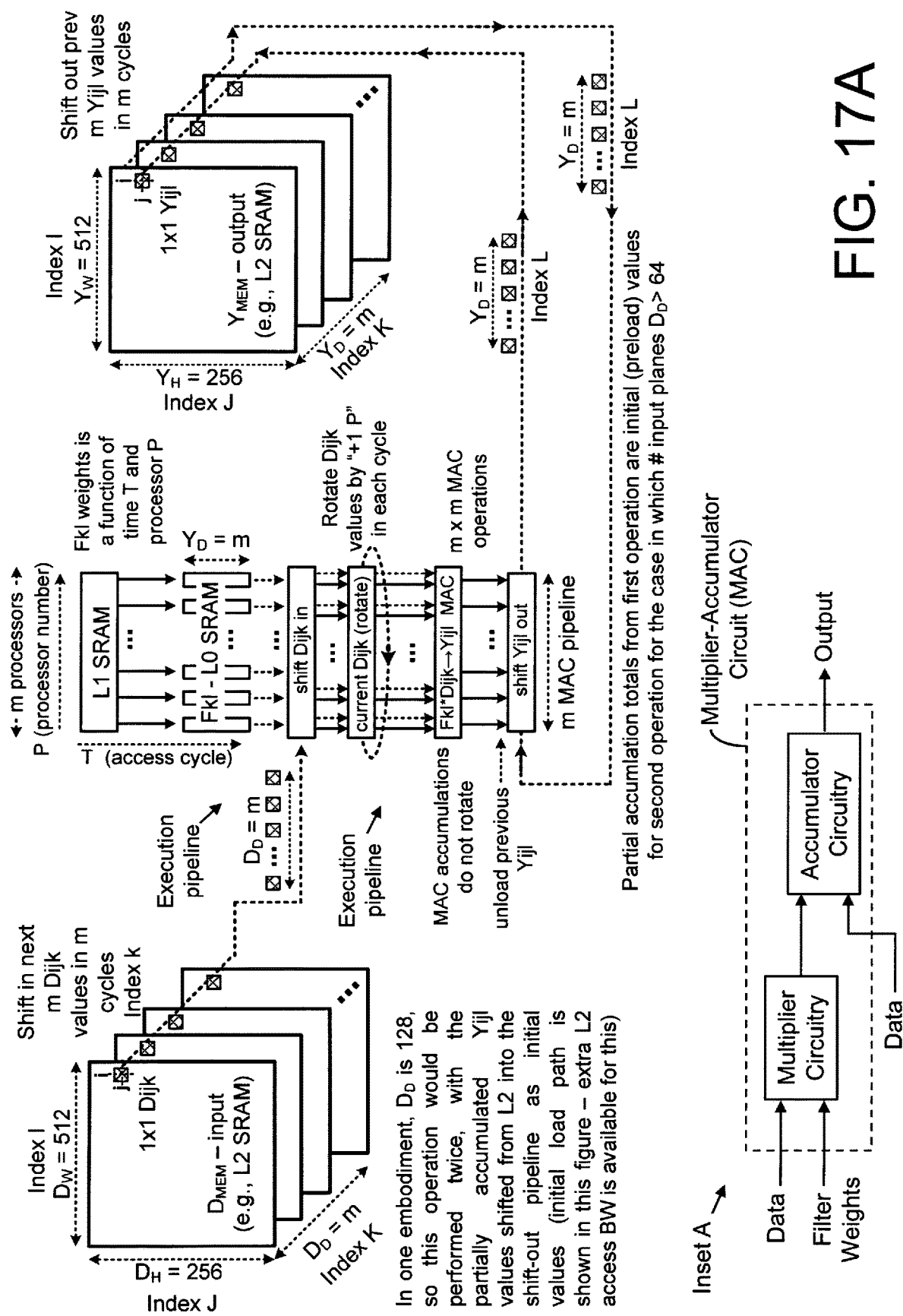
Figure 17B:
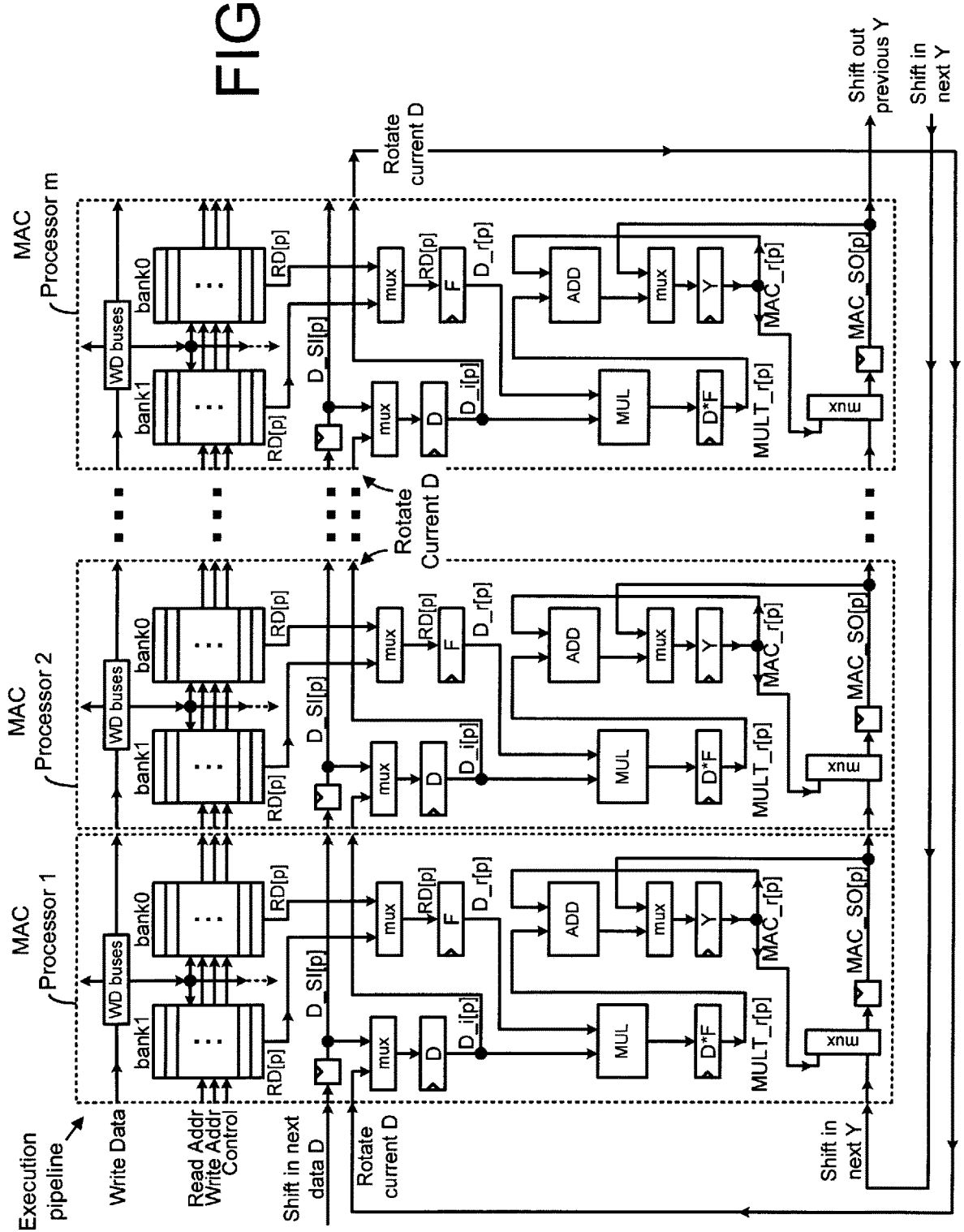
Figure 17C:
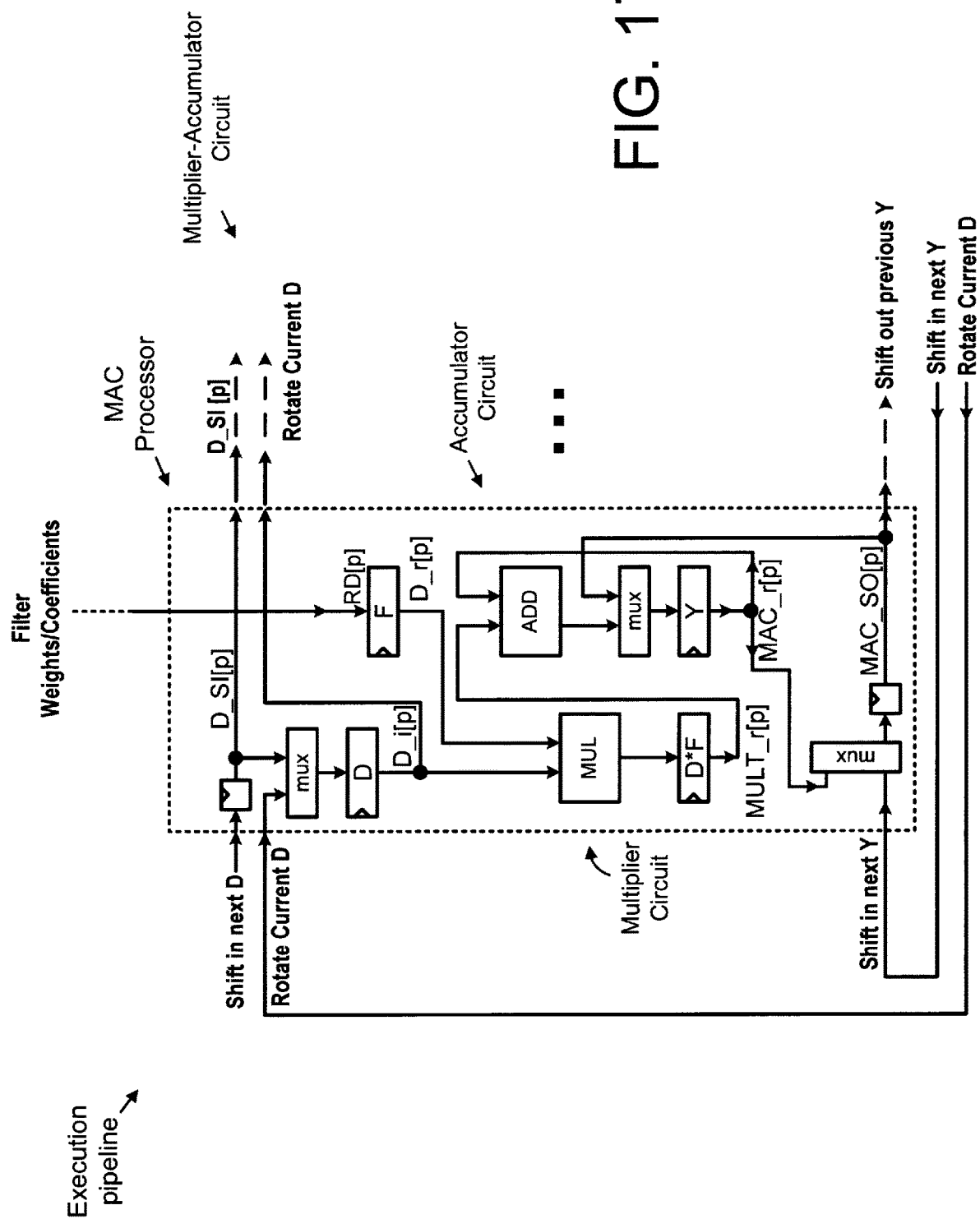
Figure 18:
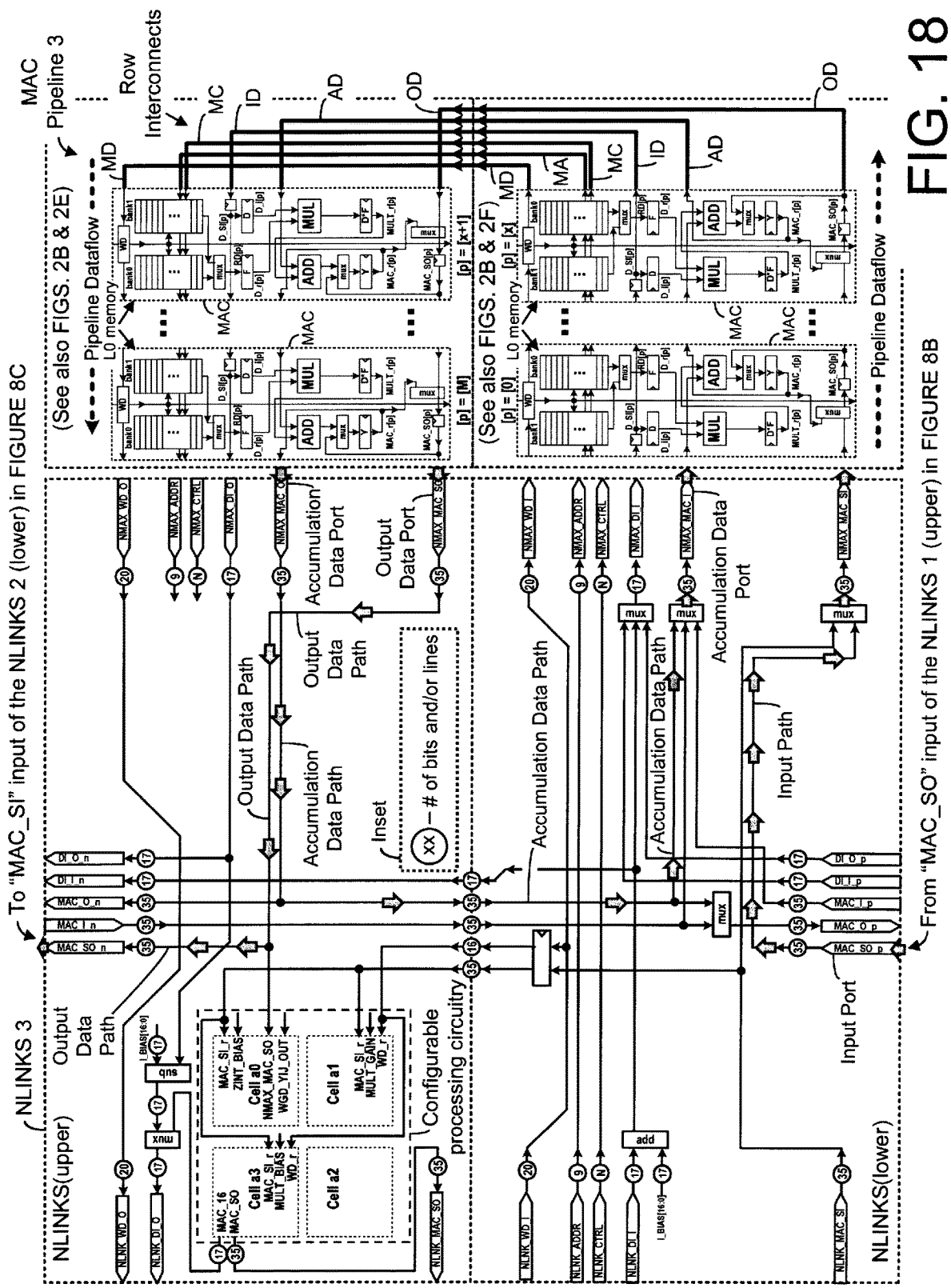

FIG. 1A illustrates a schematic block diagram of a logical overview of an exemplary multiplier-accumulator execution pipeline connected in a linear pipeline configuration, according to one or more aspects of the present inventions, wherein the multiplier-accumulator execution pipeline includes a plurality of multiplier-accumulator circuits ("MACs"), which is illustrated in block diagram form; notably, the multiplier-accumulator circuitry includes one or more of the multiplier-accumulator circuits (although the individual multiplier-accumulator circuits are not specifically illustrated here); notably, in this exemplary embodiment, "m" (e.g., 64 in the illustrative embodiment) multiplier-accumulator circuits are connected in a linear execution pipeline to operate concurrently whereby the processing circuits perform m×m (e.g., 64×64) multiply-accumulate operations in each m (e.g., 64) cycle interval; notably, each m (e.g., 64) cycle interval processes a Dd/Yd (depth) column of input and output pixels/data at a particular (i,j) location (the indexes for the width Dw/Yw and height Dh/Yh dimensions of this exemplary embodiment—Dw=512, Dh=256, and Dd=128, and the Yw=512, Yh=256, and Yd=64) wherein the m (e.g., 64) cycle execution interval is repeated for each of the Dw*Dh depth columns for this stage; in addition, in one embodiment, the filter weights or weight data are loaded into memory (e.g., L1/L0 SRAM memories) before the multiplier-accumulator circuitry starts processing (see, e.g., the '345 and '306 applications);

FIG. 1B illustrates a schematic block diagram of an exemplary logical overview of an exemplary multiplier-accumulator execution or processing pipeline wherein each multiplier-accumulator circuit includes a multiplier circuit, according to one embodiment of the present inventions; in this schematic block diagram of an exemplary multiplier-accumulator execution or processing pipelines, the plurality of MACs are connected serially in a linear pipeline wherein the output of each accumulator circuit ("ADD") of the MACs is coupled to the input of the immediately following accumulator circuit ("ADD") of the MACs of the linear processing pipeline wherein, in this way, accumulation values ("Y") generated by the MACs (see, MAC_r[p]) are rotated, transferred or moved (e.g., before, during or at the completion of each execution cycle of the execution sequence (i.e., set of associated execution cycles)) through the plurality of serially connected MACs of the pipeline such that each accumulation value (see, MAC_r[p]—"Rotate current Y") generated by a MAC is output before, during or at the completion of each execution cycle to the immediately following MAC of the linear pipeline and employed in the accumulation operation of the accumulator circuit ("ADD") of that immediately following MAC, according to one or more aspects of the present inventions; notably, each MAC includes a multiplier circuit ("MUL") to perform/implement the multiply operations and accumulator circuit ("ADD") to perform/implement the accumulate operations, according to one or more aspects of the present inventions; in this exemplary embodiment, the multiplier-accumulator circuit includes a plurality of memory banks (e.g., SRAM memory banks) that are dedicated to the multiplier-accumulator circuit to store filter weights used by the multiplier circuit of the associated multiplier-accumulator circuit; in one illustrative embodiment, the MAC execution or processing pipeline includes 64 multiplier-accumulator circuits (see FIG. 1A); notably, in the logical overview of a linear pipeline configuration of this exemplary multiplier-accumulator execution or processing pipeline, a plurality of processing (MAC) circuits ("m") are connected in the execution pipeline and operate concurrently; for example, in one exemplary embodiment where m=64, the multiplier-accumulator processing circuits 64×64 multiply-accumulate operations in each 64 cycle interval; thereafter, next 64 input pixels/data are shifted-in and the previous output pixels/data are shifted-out during the same 64 cycle intervals; in one embodiment, each multiplier-accumulator circuit may include two dedicated memory banks to store at least two different sets of filter weights—each set of filter weights associated with and used in processing a set of data) wherein each memory bank may be alternately read for use in processing a given set of associated data and alternately written after processing the given set of associated data; the filter weights or weight data are loaded into memory (e.g., the L1/L0 SRAM memories) from, for example, an external memory or processor before the stage processing started (see, e.g., the '345 and '306 applications); notably, the multiplier-accumulator circuits and circuitry of the present inventions may be interconnected or implemented in one or more multiplier-accumulator execution or processing pipelines including, for example, execution or processing pipelines as described and/or illustrated in U.S. Non-Provisional application Ser. No. 17/212,411 and U.S. Provisional Application No. 63/012,111; as noted above, the '411 and '111 applications are incorporated by reference herein in their entirety;

FIG. 1C illustrates schematic block diagrams of an exemplary multiplier-accumulator execution or processing pipelines including a plurality of serially connected MACs wherein the output of each accumulator circuit ("ADD") of the MACs is coupled to the input of the immediately following accumulator circuit ("ADD") of the MACs of the linear processing pipeline wherein, in this way, accumulation values ("Y") generated by the MACs (see, MAC_r[p]) are rotated, transferred or moved (e.g., before, during or at the completion of each execution cycle of the execution sequence (i.e., set of associated execution cycles)) through the plurality of serially connected MACs of the pipeline such that each accumulation value (see, MAC_r[p]—"Rotate current Y") generated by a MAC is output before, during or at the completion of each execution cycle to the immediately following MAC of the linear pipeline and employed in the accumulation operation of the accumulator circuit ("ADD") of that immediately following MAC, according to one or more aspects of the present inventions; notably, each MAC includes a multiplier circuit ("MUL") to perform/implement the multiply operations and accumulator circuit ("ADD") to perform/implement the accumulate operations, according to one or more aspects of the present inventions; in this exemplary embodiment, MAC processor may include or read from one memory bank or more than one memory bank (e.g., two SRAM memory banks—see FIG. 1B) that may be dedicated to the MAC of the MAC processing circuit to store filter weights used by the multiplier circuit of the associated MAC; as noted above, the individual MACs may, at times, be referred to herein as "MAC processors" or "MAC processing circuits"; notably, the linear processing pipeline, and the MACs that are incorporated in such pipeline, may be configured to rotate, transfer or move (before, during or at the completion of an execution cycle) the input data values (rather than the accumulation values—which are maintained, stored or held, in the particular MAC during each execution cycle of the execution sequence), as described and illustrated in U.S. Provisional Patent Application No. 63/156,263 "MAC Processing Pipelines, Circuitry to Configure Same, and Methods of Operating Same", filed Mar. 3, 2021; the '263 application is incorporated by reference herein in its entirety; here, in operation, after input or loading of the initial data input values into the MACs of the linear MAC processing pipeline (prior to initiation of the multiply and accumulate operations), the input data values are rotated, transferred or moved, on a cycle-by-cycle basis, from one MAC of the linear pipeline to the immediately following MAC of the pipeline and employed in the multiply operation of the multiplier circuit of that next MAC of the processing pipeline as described and/or illustrated in the '263 application;

FIG. 1D illustrates a high-level block diagram layout of an integrated circuit or a portion of an integrated circuit (which may be referred to, at times, as an X1 component) including a plurality of multi-bit MAC execution pipelines having a plurality of multiplier-accumulator circuits each of which implement multiply and accumulate operations, according to certain aspects of the present inventions; the multi-bit MAC execution pipelines and/or the plurality of multiplier-accumulator circuits may be configured to implement one or more processing architectures or techniques (singly or in combination with one or more X1 components); in this illustrative embodiment, the multi-bit MAC execution pipelines are organized into clusters (in this illustrative embodiment, four clusters wherein each cluster includes a plurality of multi-bit MAC execution pipelines (in this illustrative embodiment each cluster includes 16, 64-MAC execution pipelines (which may also be individually referred to below as MAC processors)); in one embodiment, the plurality of multiplier-accumulator circuitry are configurable or programmable (one-time or multiple times, e.g., at start-up and/or in situ) to implement one or more pipelining processing architectures or techniques (see, e.g., the expanded view of a portion of the high-level block diagram of FIG. 1B in the lower right is a single MAC execution pipeline (in the illustrative embodiment, including, e.g., 64 multiplier-accumulator circuits or MAC processors) which correlates to the schematic block diagram of a logical overview of an exemplary multiplier-accumulator circuitry arranged in a linear execution pipeline configuration—see FIG. 1A); the processing component in this illustrative embodiment includes memory (e.g., L2 memory, L1 memory and L0 memory (e.g., SRAM)), a bus interfaces (e.g., a PHY and/or GPIO) to facilitate communication with circuitry external to the component and memory (e.g., SRAM and DRAM) for storage and use by the circuitry of the component, and a plurality of switches/multiplexers which are electrically interconnected to form a switch interconnect network "Network-on-Chip" ("NOC") to facilitate interconnecting the clusters of multiplier-accumulator circuits of the MAC execution pipelines; in one embodiment, the NOC includes a switch interconnect network (e.g., a mixed-mode interconnect network (i.e., a hierarchical switch matrix interconnect network and a mesh, torus or the like interconnect network (hereinafter collectively "mesh network" or "mesh interconnect network")), associated data storage elements, input pins and/or look-up tables (LUTs) that, when programmed, determine the operation of the switches/multiplexers; in one embodiment, one or more (or all) of the clusters includes one or more computing elements (e.g., a plurality of multiplier-accumulator circuits—labeled as "NMAX Rows"—see, e.g., the '345 and '306 applications); notably, in one embodiment, each MAC execution pipeline (which, in one embodiment, consists of a plurality of serially interconnected multiplier-accumulator circuits) is connected to an associated L0 memory (e.g., SRAM memory) that is dedicated to that processing pipeline; the associated L0 memory stores filter weights used by the multiplier circuit of each multiplier-accumulator circuit of that particular MAC processing pipeline in performance of the multiply operations, wherein each MAC processing pipeline of a given cluster is connected to an associated L0 memory (which, in one embodiment, is dedicated to the multiplier-accumulator circuits of that MAC processing pipeline); a plurality (e.g., 16) MAC execution pipelines of a MAC cluster (and, in particular, the L0 memory of each MAC execution pipeline of the cluster) is coupled to an associated L1 memory (e.g., SRAM memory); here, the associated L1 memory is connected to and shared by each of the MAC execution pipelines of the cluster to receive filter weights to be stored in the L0 memory associated with each MAC execution pipeline of the cluster; in one embodiment, the associated L1 memory is assigned and dedicated to the plurality of pipelines of the MAC cluster; notably, the shift-in and shift-out paths of each 64-MAC execution pipeline is coupled to L2 memory (e.g., SRAM memory) wherein the L2 memory also couples to the L1 memory and L0 memory; the NOC couples the L2 memory to the PHY (physical interface) which may connect to L3 memory (e.g., external DRAM); the NOC also couples to a PCIe or PHY which, in turn, may provide interconnection to or communication with circuitry external to the X1 processing component (e.g., an external processor, such as a host processor); the NOC, in one embodiment, may also connect a plurality of X1 components (e.g., via GPIO input/output PHYs) which allow multiple X1 components to process related data (e.g., image data), as discussed herein, in accordance with one or more aspects of the present inventions;

FIG. 2A illustrates a schematic block diagram of an exemplary circuit, connected to multiplier-accumulator circuitry, to configure and control the multiplier-accumulator circuitry (which includes a plurality of MACs interconnected in a serial/linear pipeline (in this illustrative embodiment, 64 MACs, multiplier-accumulator circuits or MAC processors)), according to aspects of the present inventions; in one embodiment, the circuit (referred to, at times, as "control/configure circuit", "NLINKS", or "NLINKS circuit") is associated with and dedicated to interface with a plurality of interconnected (e.g., serially) multiplier-accumulator circuits and/or one or more rows of interconnected (e.g., serially) multiplier-accumulator circuits; in one embodiment, an integrated circuit having one or more control/configure circuits interfaces with a plurality of multi-bit MAC execution pipelines, each pipeline including a plurality of interconnected (e.g., serially) multiplier-accumulator circuits (see, e.g., FIG. 1D), wherein each control/configure circuit controls one of the plurality of multi-bit MAC execution pipelines, according to certain aspects of the present inventions; in this illustrative embodiment (implementing one exemplary processing pipeline embodiment), (i) the L0 memory control, address and data signal paths in the NLINKS circuit provide control, address and data signals, generated by logic circuitry (not illustrated), to the L0 memory in each MAC of the pipeline to manage or control memory operation during the execution sequence(s), (ii) the input data path in the NLINKS circuit and MAC execution pipeline of this embodiment denotes the signal path of the input data to be processed, via the MACs, during the execution sequence(s), (iii) the accumulation data path in the NLINKS circuit and execution pipeline of this embodiment denotes the ongoing/accumulating MAC accumulation totals or values generated by the MACs during performance of an execution sequence(s), and (iv) the output data path in the NLINKS circuit and MAC execution pipeline of this embodiment denotes the output data generated by execution sequence(s) (i.e., input data that was processed via the multiplier-accumulator circuits or MAC processors of the execution pipeline); the "row interconnects" connect two rows of serially connected MACs to form or provide one linear MAC pipeline wherein the signal lines: "OD" denotes the output data path, "AD" denotes the accumulation data path, "ID" denotes the input data path, "MC" denotes L0 memory control path, "MA" denotes L0 memory address path, and "MD" denotes L0 memory address path; the circle with a number therein located in each data path indicates the number of bits and/or conductors or lines (e.g., data or control) of the particular path or port—see the Inset; for the avoidance of doubt, the block/data width, data path and/or port width set forth therein are merely exemplary and not limiting in any respect; notably, a "port" is a physical point of entry to/exit from the control/configure or NLINKS circuit; all physical forms of entry to or exit from the control/configure or NLINKS circuit are intended to fall within the scope of the present inventions (for example, a conductor or metal routing in/of an integrated circuit);

FIG. 2B illustrates the schematic block diagram of the exemplary embodiment of a MAC execution or processing pipeline illustrated in FIG. 2A;

FIGS. 2C-2F illustrate selected/specific portions, as indicated in FIG. 2A, of the schematic block diagram of the exemplary control/configure circuit and multiplier-accumulator circuitry (e.g., a plurality of MACs serially connected into a linear MAC processing pipeline) of FIG. 2A, in accordance with an embodiment of certain aspects of the present inventions; the insets in FIGS. 2C and 2D provide a general key of the (i) input data flow in the one MAC pipeline and one associated NLINKS circuit (("Shift of data input DI_x within single pipeline" refers to the path of the input data), (ii) the multiply and accumulate operation flow in one the MAC pipeline and one associated NLINKS circuit ("Shift MAC_x within single pipeline" refers to the path of the accumulation data of the multiply-accumulate operation), and (iii) the output data flow of the accumulation operation with prior results in one MAC pipeline in connection with associated NLINKS circuit ("Shift MAC_Sx within single pipeline" refers to the output data path corresponding to the accumulation operation with prior results)); the signal lines in the MAC pipeline include: "ODP" denotes the output data path, "ADP" denotes the accumulation data path, "IDP" denotes the input data path; as mentioned above, the "row interconnects" connect the two rows of serially connected MACs (to form one linear MAC pipeline (comprised of the MACs of the two serially connected rows of MACs) having "n" MAC circuits, wherein in this illustrative embodiment, n=64); the signal lines of the row interconnects include: "OD" denotes the output data path, "AD" denotes the accumulation data path, "ID" denotes the input data path, "MC" denotes L0 memory control path, "MA" denotes L0 memory address path, and "MD" denotes L0 memory address path; the circle with a number therein located in each data path indicates the number of bits and/or conductors or lines (e.g., data or control) of the particular path or port—see the "key" in the FIGS. 2C and 2D; for the avoidance of doubt, the block/data width, data path and/or port width set forth are merely exemplary and not limiting in any respect; the inset in FIGS. 2C and 2D provides a general key of the data flow in a single pipeline ("shift of data input DI_x within single pipeline"), the multiply-accumulate operation (multiply and accumulate operation flow in a single pipeline ("shift MAC_x within single pipeline"), and the accumulation operation with prior results ("shift MAC_Sx within single pipeline"); again, a "port" is a physical point of entry to/exit from the control/configure or NLINKS circuit; all physical forms of entry to or exit from the control/configure or NLINKS circuit are intended to fall within the scope of the present inventions (for example, a conductor or metal routing in/of an integrated circuit);

FIG. 3A illustrates a general expression of real FIR filtering techniques, based on real number data format, in connection with a stream of input data D[u] applied to the MAC execution circuitry of the FIR filter (for example, four MACs or MAC processors) wherein the input data (e.g., image data) are processed using a set of filter weights or coefficients F[v], to generate or produce a stream of output data/values Y[u]; the data processing involves generating or forming the products of input data/values D[u] and filter weights/values F[v] via the multiplier circuits of the MAC circuits of the filter; notably, value (vmax+1) is the number of taps of the FIR filter;

FIG. 3B illustrates a simplified expression for the FIR filter, employing real FIR filtering techniques, having four taps (as such, vmax=3 in this exemplary embodiment) and four MACs or MAC processors;

FIG. 3C illustrates a general expression of complex FIR filtering techniques, based on complex number data format, in connection with a stream of complex input data/values D[u]+i*E[u] applied to the MAC execution circuitry of the FIR filter ("i" is the square root of negative one) wherein the complex input data/values D[u]+i*E[u] (e.g., image data) are processed by the MAC execution circuitry (for example, four MACs or MAC processors), using a set of complex filter values F[v]+i*G[v], to generate or produce a stream of complex output data/values Y[u]+i*Z[u]; here, the data processing operations involves generating or forming the complex products of input values D[u]+i*E[u] and complex filter values F[v]+i*G[v] via the multiplier circuit of the MAC circuit of the filter; notably, value (vmax+1) is the number of taps of the FIR filter;

FIG. 3D illustrates a simplified expression for the FIR filter, employing complex FIR filtering techniques, having two taps (as such, vmax=1 in this exemplary embodiment) and four MACs or MAC processors;

FIG. 4 illustrates a schematic block diagram of an exemplary embodiment of a MAC pipeline, including FIR filter configuration circuitry programs to configure and/or control a plurality of interconnected (in series) multiplier-accumulator circuits or rows/banks of interconnected (in series) multiplier-accumulator circuits to pipeline multiply and accumulate operations (e.g., in a linear pipeline architecture) and generate and output filter output data (e.g., filter image data/pixels), and (ii) configuration memory which is configurable to store data which is representative of one or more FIR filter characteristics for the FIR filter processing; in one embodiment, the configuration memory (e.g., a configuration register) may store data which is employed to configure the MAC pipeline to implement an FIR filter(s) having predetermined FIR filter characteristics; such configuration memory may be fixed (e.g., at manufacture) or multiple time programmable/re-programmable (e.g., at or during power-up, start-up, initialization, re-initialization and/or in situ);

FIG. 5A illustrates a block diagram of an exemplary embodiment of a control/configure circuit or NLINKS circuit, connected (and, in one embodiment, dedicated) to a MAC pipeline (including a plurality of multiplier-accumulator circuits (for example, M where M is a whole number greater than two)), according to certain aspects of the present inventions; in this embodiment, the linear MAC pipeline (having, for example, 64 multiplier-accumulator circuits) is configurable to perform, for example, real FIR filtering techniques via a plurality of multiply-accumulate operations using real input data and real FIR filter weights (in this illustrative embodiment, stored in L0 memory), according to certain aspects of the present inventions; in the illustrative example, DI_I and MAC_SI ports will be read from memory (e.g., external memory such as L2) and the data therefrom input into the MAC pipeline, and the MAC_SO port may be used to read the data processed via the MAC pipeline and, in one embodiment, thereafter written to memory (e.g., external memory such as L2); notably, a "port" is a physical point of entry to/exit from the control/configure or NLINKS circuit; all physical forms of entry to or exit from the control/configure or NLINKS circuit are intended to fall within the scope of the present invention (for example, a conductor or metal routing in/of an integrated circuit);

FIG. 5B illustrates a schematic block diagram of an exemplary circuit to configure and control (see, e.g., FIG. 5A) connected multiplier-accumulator circuitry which includes a plurality of serially connected multiplier-accumulator circuits or MAC processors (here, M where M is a whole number greater than two) that perform a plurality of multiply-accumulate operations (multiplier circuit ("MUL") performing operation and accumulator circuit ("ADD") performing operations) using real input data and real FIR filter weights, according to aspects of the present inventions; the control/configure circuit or NLINKS circuit configures and controls the data flow and data paths in and out of the MAC pipeline (in this embodiment, the plurality of serially connected multiplier-accumulator circuits or MAC processors connected to the NLINKS circuit) to implement the FIR filter and operation; in one embodiment, the control/configure circuit or NLINKS circuit is associated with and dedicated to interface with a plurality of multiplier-accumulator circuits and/or one or more rows of interconnected (e.g., serially) multiplier-accumulator circuits; the control/configure circuitry controls and configures the multi-bit MAC execution pipeline, according to certain aspects of the present inventions; in this illustrative embodiment, (i) the signals on the accumulation data path in the NLINKS circuit and execution pipeline denote the ongoing MAC accumulation values generated during or by an execution sequence in operation, (ii) the signals on the input data path in the NLINKS circuit and MAC execution pipeline denote the input data (e.g., image data), and (iii) the signals on the output data path in the NLINKS circuit and MAC execution pipeline denote the output data generated by an execution sequence (i.e., input data that was processed via the multiplier-accumulator circuits or MAC processors of the execution pipeline); in this illustrative embodiment, the memory (e.g., SRAM) which stores the real FIR filter weights includes a plurality of memory banks (here, 2) which are dedicated to one of the multiplier-accumulator circuits to locally store the FIR filter weights (again, often referred to as L0 memory); the memory banks may be separately addressable memory wherein the read/write operations of each memory bank are separately controllable relative to other memory bank such that memory bank 1 may be read from while memory bank 0 is being written to (i.e., storing filter weights of another set of filter weights); the data from only one of the banks is output to the multiplier circuit of an associated multiplier-accumulator circuit at a given time (e.g., for a set of filter weights associated with a set of data under processing); notably, the write data bus may be connected to another memory (e.g., L1 memory—which may be SRAM—see FIG. 5A) which provides sets of filter weights to store in the appropriate/selected memory bank; in operation, in one embodiment, the multiplier-accumulator circuit may ping-pong read operations, on a set of multiply operations basis, between the two memory banks (see, e.g., FIGS. 1B, 2B, 2E and 2F) to reduce or minimize the temporal delay or overhead stemming from the availability of "new" filter weights or values to the multiplier-accumulator circuits during the data processing performed by the multiplier-accumulator circuit; similarly, the control/configure circuitry may ping-pong write operations, on a set of multiply operations basis, between the two "local" memory banks associated with the multiplier-accumulator circuit so that while filter weights are being read from one of the memory banks, the other memory bank is receiving and storing the next set of filter weights to be used by the multiplier-accumulator circuit during data processing of the next set of data; the present inventions, however, may employ any memory architecture including the memory architecture described and/or illustrated in U.S. Non-Provisional application Ser. No. 17/212,411 and U.S. Provisional Application No. 63/012,111, which, as noted above, are incorporated by reference herein in their entirety; notably, certain of the signal/control lines between the control/configure or NLINKS circuit and the MAC pipeline have been omitted for purposes of clarity;

FIGS. 5C and 5D illustrate particular portions of the NLINKS circuitry of FIG. 5B, wherein the "NLINKS(upper)" is illustrated in FIG. 5C and "NLINKS(lower)" is illustrated in FIG. 5D; here, the accumulation data path, input data path and output data path are highlighted in detail;

FIG. 6 illustrates exemplary sequencing details of an exemplary FIR filter circuit embodiment of FIGS. 5A-5D, employing a real number data format, where the number of processors employed in the FIR filter circuit is four (i.e., M=4) and the number of taps is four (i.e., N=4); notably, exemplary configuration is convenient for the purposes of describing the operation and processing of the NLINKS circuit and MAC processing pipeline as well as exemplary sequencing details of the real FIR filtering process and the inventions are not limited thereto or thereby;

FIG. 7A illustrates an exemplary embodiment of a plurality of control/configure circuits or NLINKS circuits (i.e., NLINKS 1, . . . NLINKS x), each connected (and, in one embodiment, dedicated) to an associated pipeline of multiplier-accumulator circuits to perform, for example, real FIR filtering techniques via a plurality of multiply-accumulate operations using real input data and real FIR filter weights (in this illustrative embodiment, stored in L0 memory), according to certain aspects of the present inventions; here, each NLINKS circuit and associated MAC pipeline of multiplier-accumulator circuits may perform separate real FIR filtering operations on input data applied to the MAC pipeline via the D_I input port wherein each NLINK-MAC pipeline pair may be configured into and employed as a separate or independent FIR filter (independent from at least the perspective of the filtering operation) to filter input data (e.g., image data); the plurality of FIR filters may have the same architecture or a different architecture; moreover, the filtering characteristics or filter response (amplitude and/or phase response) of the plurality of FIR filters (NLINKS circuit-MAC pipeline pairs) may be the same or different; notably, in one embodiment, each NLINKS circuit may be connected to the associated pipeline of multiplier-accumulator circuits in the manner illustrated in FIG. 5B and each NLINKS circuit is configurable to connect to one or more other NLINKS circuits, for example, to provide a linear MAC execution or processing pipeline configured to perform, for example, multiply-accumulate processing according to certain aspects of the present inventions; in the illustrative example, each control/configure circuit (labeled "NLINKS n", where n=1 to x) includes MAC_I/MAC_O ports of the linear MAC execution pipeline (which includes a plurality of the connected (e.g., serially) multiplier-accumulator circuits (labeled "MAC pipeline" and illustrated in block diagram depicting exemplary multiplier-accumulator circuitry (including, e.g., 64 multiplier-accumulator circuits—see FIGS. 1A and 1B); notably, the DI_1 and MAC_SI ports will be read from memory (e.g., external memory such as L2) and the data therefrom input into the MAC pipeline, and the MAC_SO port may be used to read the data processed via the MAC pipeline and thereafter and written to an external memory (e.g., external memory such as L2); notably, a "port" is a physical point of entry to/exit from the control/configure or NLINKS circuit; all physical forms of entry to or exit from the control/configure or NLINKS circuit are intended to fall within the scope of the present invention (for example, a conductor or metal routing in/of an integrated circuit); notably, certain of the connections and signal lines between the control/configure or NLINKS circuits have been omitted for purposes of clarity;

FIG. 7B illustrates an exemplary embodiment of a plurality of interconnected control/configure circuits or NLINKS circuits, each connected (and, in one embodiment, dedicated) to a plurality of multiplier-accumulator circuits (e.g., rows of multiplier-accumulator circuits wherein each row includes M multiplier-accumulator circuits, where M is a whole number greater than two), the two pluralities of multiplier-accumulator circuits are interconnected via the NLINKS circuits (i.e., NLINKS 1 and NLINKS 2) to form one linear MAC pipeline capable of performing real FIR filtering using real input data and real FIR filter weights (in this illustrative embodiment, stored in L0 memory), according to certain aspects of the present inventions; in the illustrative example, the MAC_I/MAC_O ports of the NLINKS circuits connect the plurality of multiplier-accumulator circuits of MAC processors 1 and the plurality of multiplier-accumulator circuits of MAC processors 2 to form the linear MAC execution pipeline and an accumulation ring for the processing pipeline in connection with performance of the FIR filtering operations (multiply and accumulate operations) implemented by the MAC pipeline; the accumulation ring for the data processing pipeline is formed via connecting (1) the output of the accumulation data path of MAC processors 1 (MAC_O port of NLINKS 1 (NLINKS(upper)) to the input of the accumulation data path of MAC processors 2 (MAC_I port of NLINKS 2 (NLINKS(lower)) and (2) the output of the accumulation data path of MAC processors 2 (MAC_O port of NLINKS 2 (NLINKS(lower)) to the input of the accumulation data path of MAC processors 1 (MAC_I port of NLINKS 2 (NLINKS(upper)); in this embodiment, data will be read from memory (e.g., external memory such as L2) and input into the MAC pipeline via DI_I and MAC_SI ports of the NLINKS circuit associated with MAC processors 1, and processed/filtered output data read from the MAC pipeline via the MAC_SO port/path of the NLINKS circuit associated with MAC processors 2; the data output at the MAC_SO port is in a real number data format; notably, as described herein, a "port" is a physical point of entry to/exit from the control/configure or NLINKS circuit; moreover, certain of the connections and signals within or between the control/configure or NLINKS circuits have been omitted for purposes of clarity;

FIGS. 7C and 7D illustrate more detailed schematic block diagrams of exemplary control/configure circuits or NLINKS circuits configured to route MAC_I and MAC_O between a plurality of NLINKS circuits, as illustrated in FIG. 7B, to form a circular shifting path (e.g., a ring) for intermediate accumulation values that traverses the processing pipeline of a plurality (in this illustrative embodiment, 64) of multiplier-accumulator circuits or MAC processors (organized into two rows of serially interconnected multiplier-accumulator circuits) which are associated with each control/configure circuit or NLINKS circuit incorporated into the overall, joined, combined or complete pipeline formed via connection of the MAC circuits of each MAC processor associated with the interconnected NLINKS circuits (see FIG. 7B), according to certain aspects of the present inventions; in this illustrative embodiment, the accumulation data path illustrates the circuit configuration of the NLINKS circuits to provide connection for/between the plurality of NLINKS circuits (through the associated MAC processing pipelines associated with such NLINKS circuits) to implement the circular shifting path (e.g., a ring) for intermediate accumulation values; specifically, in this illustrative embodiment, the control/configure circuit or NLINKS circuits (see FIG. 7B), which may be a "bottom" or a first end or edge NLINKS circuit (NLINKS 1—of the overall, complete or composite pipeline—which includes a plurality of NLINKS circuits and associated pipelines—see FIG. 7C) which is configured to receive accumulation data from NLINKS 2, via the MAC_I port) and route such data to the processing pipeline associated therewith to the MAC_O port in NLINKS 1 to connect to (and output data to) the MAC_I port of NLINKS 2; each NLINKS circuit is associated with a different plurality of multiplier-accumulator circuits or MAC processors (for example, which are organized into two rows of interconnected (e.g., serially) multiplier-accumulator circuits and are disposed adjacent to (here, above); thus, the plurality of NLINKS and associated MAC pipelines are interconnected to form a "ring" in connection with the accumulation data path via the MAC_O ports and port and the MAC_I ports and the accumulation data paths in an NLINKS circuits (see FIG. 7B); notably, each NLINKS circuit is associated with a different plurality of multiplier-accumulator circuits or MAC processors (for example, which are organized into two rows of interconnected (e.g., serially) multiplier-accumulator circuits) which are incorporated into the overall, joined, combined or complete pipeline via configuration of the NLINKS circuit; notably, the circle with a number therein located in data paths indicates the number of bits and/or conductors or lines (e.g., data or control) of the particular path or port in one exemplary embodiment; for the avoidance of doubt, the block/data width, data path and/or port width set forth are merely exemplary and not limiting in any respect; as noted, a "port" (e.g., the MAC_I port, MAC_O port) is a physical point of entry to and exit from the control/configure or NLINKS circuit; notably, connections, signal paths, and signals within or between the control/configure or NLINKS circuits (and between an NLINKS circuit and its associated execution pipeline) have been omitted for purposes of clarity (e.g., memory address, data and control paths, input data path, and output data path); certain connections, signal paths, and signals (which, in one embodiment, are not modified in order to implement the architecture of this embodiment) are, however, illustrated in FIG. 2A-2F (e.g., memory address, data and control paths, input data path, and/or output data path);

FIG. 8A illustrates an exemplary interconnect architecture of a plurality of control/configure or NLINKS circuits (in the illustrative embodiment, two—i.e., NLINKS 1 and NLINKS 2) connected in series to form a shifting data path for final accumulation values/data to traverse through the plurality of processing circuitry in/of a cluster, according to certain aspects of the present inventions; here, the NLINKS circuits are configured to connect to one or more other NLINKS circuits via the MAC_SI and MAC_SO ports of the control/configure or NLINKS circuit to form the shifting chain of a processing pipeline wherein, each control/configure or NLINKS circuit connected (and, in one embodiment, dedicated) to a plurality of associated multiplier-accumulator circuits; notably, many of the connections and signal lines between the control/configure or NLINKS circuits have been omitted for purposes of clarity (i.e., improve clarity of certain aspects of the schematic block diagram); moreover, the embodiment of FIG. 8A may be extended to more than two NLINKS circuits and associated MAC pipelines wherein final accumulation data of a given MAC pipeline are provide, as initial data or initial accumulation data, to another/subsequent MAC pipeline, via the NLINKS circuits associated therewith;

FIGS. 8B and 8C illustrate a schematic block diagram of the two exemplary circuits to configure and control (see, e.g., FIG. 8A) connected multiplier-accumulator circuitry which includes a plurality of serially connected multiplier-accumulator circuits or MAC processors (here, M where M is a whole number greater than two) that perform a plurality of multiply-accumulate operations (multiplier circuit ("MUL") performing operation and accumulator circuit ("ADD") performing operations) using real input data and real FIR filter weights, according to aspects of the present inventions; in one embodiment, the control/configure circuit or NLINKS is associated with and dedicated to interface with a plurality of multiplier-accumulator circuits and/or one or more rows of interconnected (e.g., serially) multiplier-accumulator circuits; the control/configure circuity controls and configures the multi-bit MAC execution pipeline, according to certain aspects of the present inventions; in this illustrative embodiment, the exemplary interconnect architecture of the NLINKS circuits may be employed, together with the MAC pipeline, to implement real FIR filter operations wherein (i) the signals on the accumulation data path in the NLINKS circuit and execution pipeline denote the accumulating, ongoing or partial MAC accumulation totals or values generated during operation or performance of an execution sequence (e.g., prior to completion of the sequence), (ii) the output data path in the NLINKS circuit and MAC execution pipeline of this embodiment denotes the output data (e.g., final accumulation data, totals or values) generated by execution sequence(s) (i.e., input data that was processed via the multiplier-accumulator circuits or MAC processors of the execution pipeline) and (iii) the input port/path in the NLINKS circuit and MAC execution pipeline of this embodiment denotes the port/path of the initial data (e.g., partial accumulation data, totals or values) input into the MACs or MAC processors of the MAC pipeline before initiation of the processing operations; in this embodiment, the output of the MAC pipeline in FIG. 8B (see output port labeled "MAC_SO" in the NLINKS(upper) of NLINKS 1) is input into the MAC pipeline of FIG. 8C (see input port labeled "MAC_SO" in the NLINKS(lower) of NLINKS 2); moreover, in this illustrative embodiment, the memory (e.g., SRAM) which stores the real FIR filter weights includes a plurality of memory banks (e.g., 2) which are dedicated to a multiplier-accumulator circuit to locally store the FIR filter weights (again, often referred to as L0 memory); a discussion of the memory banks is set forth above (see, e.g., FIG. 5B and is not repeated here however, it is emphasized that the present inventions may employ any memory architecture described and/or illustrated in U.S. Non-Provisional application Ser. No. 17/212,411 and U.S. Provisional Application No. 63/012,111, which, as noted above, are incorporated by reference herein in their entirety; notably, certain of the signal/control lines between the control/configure or NLINKS circuit and the MAC pipeline have been omitted for purposes of clarity;

FIGS. 9A and 9B illustrate exemplary sequencing details of an exemplary FIR filter circuit embodiment of FIGS. 8A-8C, employing a real number data format, where the number of processors employed in the FIR filter circuit is eight (i.e., M=8) and the number of taps is four (i.e., N=4); notably, this exemplary configuration is convenient for the purposes of describing the operation and processing of the NLINKS circuit and MAC processing pipeline as well as exemplary sequencing details of the real FIR filtering process and certain inventions—and is in no way limited thereto or thereby;

FIG. 10A illustrates a block diagram of an exemplary embodiment of a control/configure circuit or NLINKS circuit, connected (and, in one embodiment, dedicated) to a MAC pipeline (including a plurality of multiplier-accumulator circuits), according to certain aspects of the present inventions; in this embodiment, the linear MAC pipeline (having, for example, 64 multiplier-accumulator circuits or MAC processors) is configurable to perform, for example, real FIR filtering techniques via a plurality of multiply-accumulate operations using real input data and real FIR filter weights (in this illustrative embodiment, stored in L0 memory), according to certain aspects of the present inventions; in the illustrative example, DI_I and MAC_I ports receive data read from memory (e.g., external memory such as L2) and the data therefrom is input into the MAC pipeline, and the MAC_O port and DI_O port may be used to read data from the MAC pipeline, after generating partial accumulations and final accumulations, respectively; in one embodiment, after reading the final accumulations (i.e., final accumulation data, totals or values) such output data is written to memory (e.g., external memory such as L2); multiplexers (Mux 1 and Mux 2) are employed to route or re-route the MAC_I and MAC_O ports between a data load mode (i.e., loading initial values into the MAC pipeline and reading partial accumulations of the MAC multiply and accumulate operations) and an accumulation mode (i.e., MAC accumulation generated by an execution sequence wherein the MACs perform a plurality of multiply and accumulate operations to filter two dimensional image data via a filter processing mode (e.g., one dimensional FIR filtering); the signals that control the selection/operation of multiplexers Mux 1 and Mux 2 implement the filter processing mode and the data load mode via selection of the active input (from the plurality of inputs) of the multiplexer; notably, a "port" is a physical point of entry to/exit from the control/configure or NLINKS circuit; all physical forms of entry to or exit from the control/configure or NLINKS circuit are intended to fall within the scope of the present invention (for example, a conductor or metal routing in/of an integrated circuit);

FIG. 10B illustrates a schematic block diagram of an exemplary embodiment of the control/configure circuit or NLINKS circuit (see, e.g., FIG. 10A), configured in a data load mode, that is the connected multiplier-accumulator circuitry which includes a plurality of serially connected multiplier-accumulator circuits or MAC processors (in this illustrative example, 64) that perform a plurality of multiply-accumulate operations (multiplier circuit ("MUL") performing operation and accumulator circuit ("ADD") performing operations) using real input data and real FIR filter weights, according to aspects of the present inventions; in this configuration, the NLINKS circuit is configured in the data load mode wherein the NLINKS circuit configures and controls the data flow and data paths, via multiplexers Mux 1 and Mux 2, in and out of the MAC pipeline (in this embodiment, the plurality of serially connected multiplier-accumulator circuits or MAC processors connected to the NLINKS circuit) to initially load the MAC processors of the FIR filter before filtering; in this illustrative embodiment, (i) the accumulation data path in the NLINKS circuit, via Mux 1 and Mux 2, provides the initial data during the data load mode wherein initial values are input into the MACs of the MAC pipeline (prior to initiation of the multiply and accumulate operations) and outputting partial accumulations generated by the MACs of the MAC pipeline, (ii) the L0 memory control, address and data signal paths in the NLINKS circuit provide control, address and data signals, generated by logic circuitry (not illustrated), to the L0 memory in each MAC of the pipeline to manage or control memory operation during the execution sequence(s), and (iii) the input data path in the NLINKS circuit and MAC execution pipeline of this embodiment denotes the signal path of the input data to be processed, via the MACs, during the execution sequence(s); notably, certain of the signal/control lines between the control/configure or NLINKS circuit and the MAC pipeline have been omitted for purposes of clarity;

FIGS. 10C and 10D illustrate particular portions of the NLINKS circuitry of FIG. 10B, wherein the "NLINKS (upper)" is illustrated in FIG. 10C and "NLINKS(lower)" is illustrated in FIG. 10D;

FIG. 10E illustrates a schematic block diagram of an exemplary embodiment of the control/configure circuit or NLINKS circuit (see, e.g., FIG. 10A), configured in an accumulation mode, that is the connected multiplier-accumulator circuitry which includes a plurality of serially connected multiplier-accumulator circuits or MAC processors (in this illustrative example, 64) that perform a plurality of multiply-accumulate operations (via multiplier circuits ("MUL") and accumulator circuits ("ADD")) using real input data and real FIR filter weights, according to aspects of the present inventions; the control/configure circuit or NLINKS circuit controls and configures the multi-bit MAC execution pipeline, according to certain aspects of the present inventions; in this configuration, the circuits are configured in the accumulations mode wherein the control/configure circuit or NLINKS circuit configures and controls the data flow and data paths in the NLINKS circuit (via multiplexers Mux 1 and Mux 2) to form a ring wherein the accumulation data path in the NLINKS circuit loops from the out of the execution pipeline to the input of the execution pipeline to implement the FIR filter and operation; that is, in this configuration, (i) the accumulation signal path in the NLINKS circuit provides the data during the accumulations mode wherein ongoing MAC accumulation values generated by an execution sequence are provided between the MACs of the MAC pipeline and outputting partial accumulations generated by the MACs of the MAC pipeline, (ii) the L0 memory control, address and data signal paths in the NLINKS circuit provide control, address and data signals, generated by logic circuitry (not illustrated), to the L0 memory in each MAC of the pipeline to manage or control memory operation during the execution sequence(s), and (iii) the input data path in the NLINKS circuit and MAC execution pipeline denotes the signal path of the input data (i.e., input data, in real number data format) to be processed via the multiplier-accumulator circuits or MAC processors of the execution pipeline; notably, certain of the signal/control lines between the control/configure or NLINKS circuit and the MAC pipeline have been omitted for purposes of clarity;

FIG. 10F illustrates a schematic block diagram of an exemplary embodiment of the control/configure circuit or NLINKS circuit (see, e.g., FIG. 10A), configured in an output data mode, that is the connected multiplier-accumulator circuitry which includes a plurality of serially connected multiplier-accumulator circuits or MAC processors (in this illustrative example, 64) that perform a plurality of multiply-accumulate operations (via multiplier circuits ("MUL") and accumulator circuits ("ADD")) using real input data and real FIR filter weights, according to aspects of the present inventions; the control/configure circuit or NLINKS circuit is configured in an output data mode wherein the Mux 2 is controlled and configured to route the output of the accumulation data port to the output data port (see NLINKS(upper)), according to certain aspects of the present inventions; in this configuration, the NLINKS circuit, via Mux 2, is configured to provide the processed data, generated by execution sequence(s) (which employs the accumulation mode (see FIG. 10E), on the output data path at the conclusion/completion of the execution sequence, via control of Mux 2 to select the accumulation data port input of Mux 2 to connect to the output thereof and, in turn, the output data path and output data port connects to the output data port (see NLINKS(upper)); notably, certain of the signal/control lines between the control/configure or NLINKS circuit and the MAC pipeline have been omitted for purposes of clarity;

Figure 11:
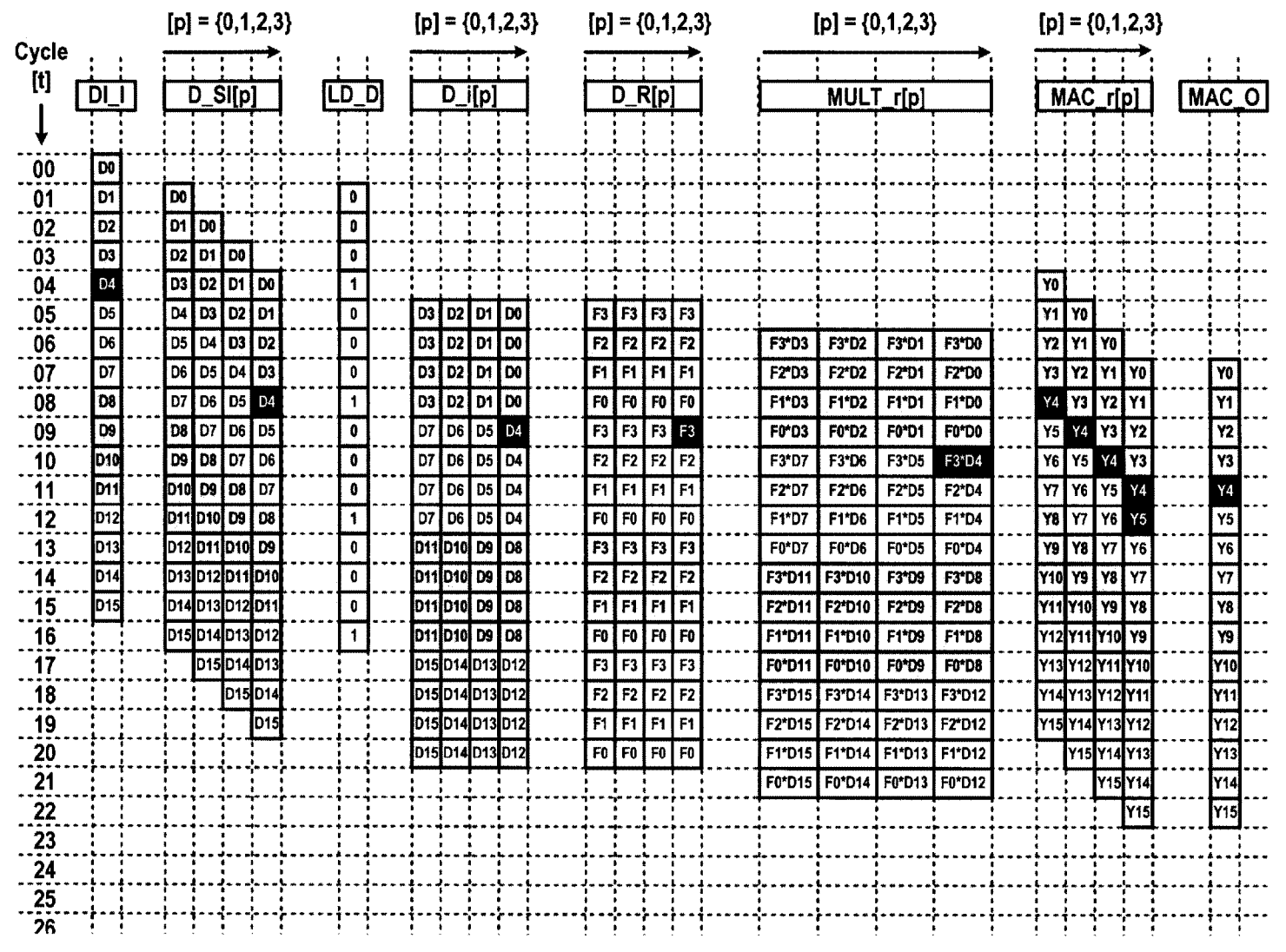

FIG. 11 illustrate exemplary sequencing details of an exemplary FIR filter circuit embodiment of FIGS. 10B-10E, employing a real number data format, where the number of processors employed in the FIR filter circuit is four (i.e., M=4) and the number of taps is four (i.e., N=4); notably, exemplary configuration is convenient for the purposes of describing the operation and processing of the NLINKS circuit and MAC processing pipeline as well as exemplary sequencing details of the real FIR filtering process and the inventions are not limited thereto or thereby;

Figure 12:
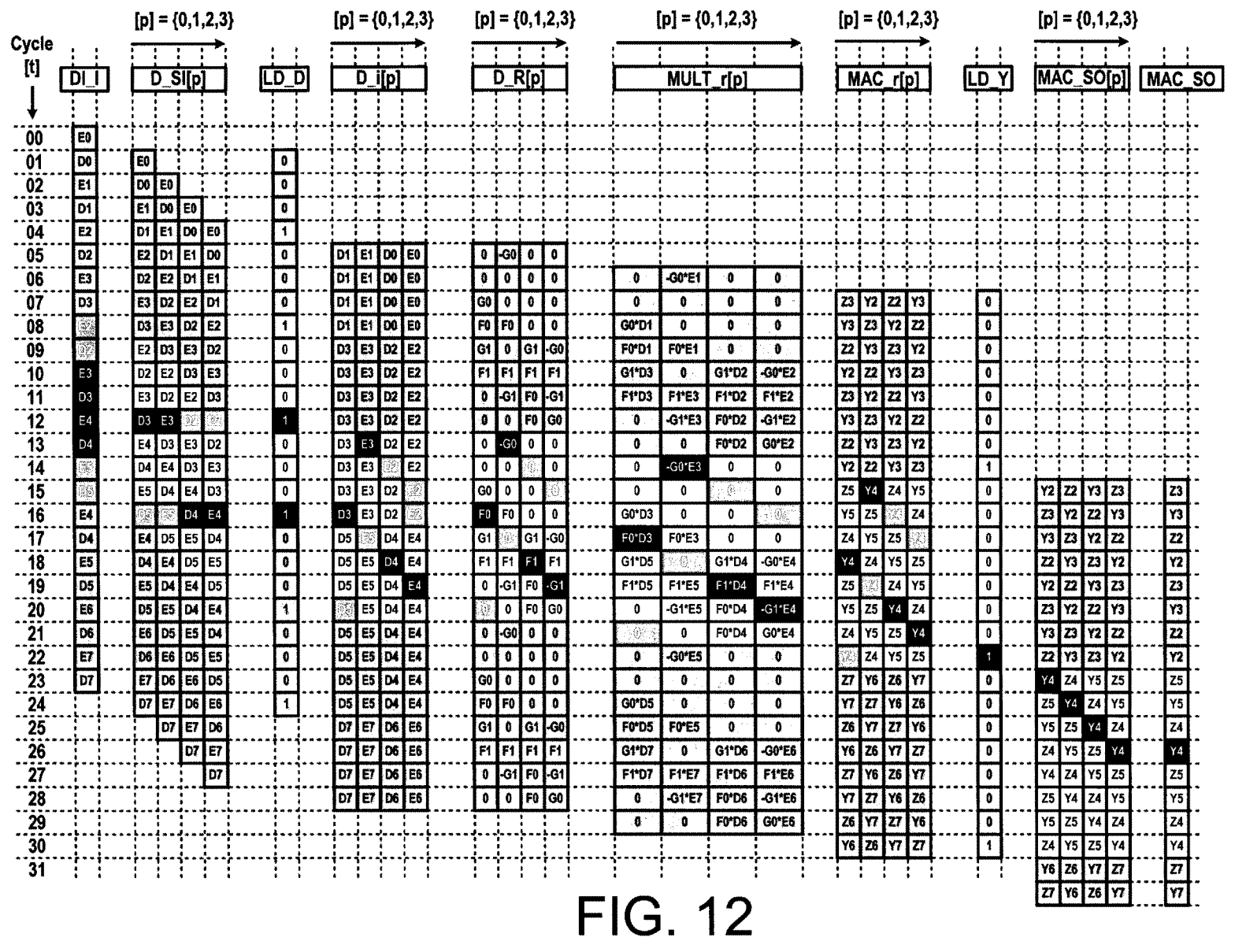

FIG. 12 illustrates exemplary sequencing details of an exemplary FIR filter circuit embodiment of FIGS. 5A-5D, configured to employ a complex number data format, where the number of processors employed in the FIR filter circuit is four (i.e., M=4) and the number of taps is two (i.e., N=2); here, the linear MAC pipeline illustrated in FIG. 5A-5D performs complex FIR filtering techniques via a plurality of multiply-accumulate operations using complex input data and complex FIR filter weights (in this illustrative embodiment, stored in L0 memory), according to certain aspects of the present inventions; notably, exemplary configuration is convenient for the purposes of describing the operation and processing of the NLINKS circuit and MAC processing pipeline as well as exemplary sequencing details of the complex FIR filtering process; the present inventions are in no way limited thereto or thereby;

FIG. 13A illustrates a block diagram of an exemplary embodiment of a control/configure circuit or NLINKS circuit, connected (and, in one embodiment, dedicated) to a MAC pipeline (including a plurality of multiplier-accumulator circuits), according to certain aspects of the present inventions; in this embodiment, the linear MAC pipeline (having, for example, 64 multiplier-accumulator circuits) is configurable to perform, for example, complex FIR filtering techniques via a plurality of multiply-accumulate operations using input data and FIR filter weights, having a complex number data format, according to certain aspects of the present inventions; in the illustrative example, DI_I and MAC_I ports receive data read from memory (e.g., external memory such as L2) and the data therefrom is input into the MAC pipeline, and the MAC_O port and DI_O port may be used to read data from the MAC pipeline, after generating partial accumulations and final accumulations, respectively; in one embodiment, after reading the final accumulations such output data is written to memory (e.g., external memory such as L2); multiplexers (Mux 1 and Mux 2) are employed to route/re-route the MAC_I and MAC_O ports between an accumulation mode (i.e., MAC accumulation generated by an execution sequence) and a data load mode (loading initial values into the MAC pipeline and reading partial accumulations of the MAC operations); notably, a "port" is a physical point of entry to/exit from the control/configure or NLINKS circuit; all physical forms of entry to or exit from the control/configure or NLINKS circuit are intended to fall within the scope of the present invention (for example, a conductor or metal routing in/of an integrated circuit);

FIG. 13B illustrates a schematic block diagram of an exemplary embodiment of a control/configure circuit or NLINKS circuit, configured in a data load mode, which is connected to a plurality of serially connected multiplier-accumulator circuits or MAC processors (in this illustrative exemplary embodiment, 64) which performs a plurality of multiply-accumulate operations (via multiplier circuits ("MUL") and accumulator circuits ("ADD")) using real input data and real FIR filter weights, according to aspects of the present inventions; in this configuration, the circuits are configured in the data load mode wherein the control/configure circuit or NLINKS circuit configures and controls the data flow and data paths in and out of the MAC pipeline (in this embodiment, the plurality of serially connected multiplier-accumulator circuits or MAC processors connected to the NLINKS circuit) to initially load the FIR filter before filtering; in this illustrative embodiment, (i) the accumulation signal path in the NLINKS circuit, via multiplexers Mux 1 and Mux 2, provides the initial data during the data load mode wherein initial values are input into the MACs of the MAC pipeline (prior to initiation of the multiply and accumulate operations) and outputting partial accumulations generated by the MACs of the MAC pipeline, (ii) the L0 memory control, address and data signal paths in the NLINKS circuit provide control, address and data signals, generated by logic circuitry (not illustrated), to the L0 memory in each MAC of the pipeline to manage or control memory operation during the execution sequence(s), and (iii) the input data path in the NLINKS circuit and MAC execution pipeline of this embodiment denotes the signal path of the input data to be processed, via the MACs, during the execution sequence(s); notably, certain of the signal/control lines between the control/configure or NLINKS circuit and the MAC pipeline have been omitted for purposes of clarity;

FIGS. 13C and 13D illustrate particular portions of the NLINKS circuitry of FIG. 13B, wherein the "NLINKS (upper)" is illustrated in FIG. 13C and "NLINKS(lower)" is illustrated in FIG. 13D;

FIG. 13E illustrates a schematic block diagram of an exemplary embodiment of a control/configure circuit or NLINKS circuit, configured in an accumulation mode, which is connected to a plurality of serially connected multiplier-accumulator circuits or MAC processors (in this illustrative exemplary embodiment, 64) which performs a plurality of multiply-accumulate operations (via multiplier circuits ("MUL") and accumulator circuits ("ADD")) using real input data and real FIR filter weights, according to aspects of the present inventions; the control/configure circuit or NLINKS circuit controls and configures the multi-bit MAC execution pipeline, according to certain aspects of the present inventions; in this configuration, the circuits are configured in the accumulation mode wherein the control/configure circuit or NLINKS circuit configures and controls the data flow and data paths in and out of the linear MAC pipeline, via control/configuration of multiplexer Mux 1 and Mux 2, to route the accumulation data path and implement the FIR filter and filtering operation; in this illustrative embodiment, (i) the accumulation signal path in the NLINKS circuit forms an accumulation ring, including the associated MACs or MAC processors of the pipeline, wherein ongoing MAC accumulation values (partial accumulations) generated by the associated MACs or MAC processors of the pipeline during an execution sequence are provided between the MACs of the linear MAC pipeline, (ii) the L0 memory control, address and data signal paths in the NLINKS circuit provide control, address and data signals, generated by logic circuitry (not illustrated), to the L0 memory in each MAC of the pipeline to manage or control memory operation during the execution sequence(s), and (iii) the input data path in the NLINKS circuit and MAC execution pipeline denotes the signal path of the input data (i.e., input data, in real number data format) to be processed via the multiplier-accumulator circuits or MAC processors of the execution pipeline; notably, certain of the signal/control lines between the control/configure or NLINKS circuit and the MAC pipeline have been omitted for purposes of clarity;

FIG. 13F illustrates a schematic block diagram of an exemplary embodiment of a portion of the control/configure circuit or NLINKS circuit (namely, NLINKS(upper)), configured in an output data mode, which is connected to the plurality of serially connected multiplier-accumulator circuits or MAC processors which performs a plurality of multiply-accumulate operations (via multiplier circuits ("MUL") and accumulator circuits ("ADD")) using real input data and real FIR filter weights, according to aspects of the present inventions; in this configuration, the control/configure circuit or NLINKS circuit is configured in an output data mode wherein the Mux 2 is controlled and configured to route the output of the accumulation data port to the output data port (like that in FIG. 10F), according to certain aspects of the present inventions; in this configuration, the NLINKS circuit, via Mux 2, is configured to provide the processed data, generated during the execution sequence(s) (which employs the accumulation mode (see FIG. 13E)), on the output data path at the conclusion/completion of the execution sequence, via control of Mux 2 to select the accumulation data port input of Mux 2 to connect to the output thereof and, in turn, the output data path and output data port connects to the output data port (see NLINKS(upper)); notably, certain of the signal/control lines between the control/configure or NLINKS circuit and the MAC pipeline have been omitted for purposes of clarity;

FIGS. 13G and 13H illustrate schematic block diagrams of the exemplary embodiment of a plurality of MACs (in this illustrative embodiment, 64) serially connected into a linear MAC processing pipeline of FIGS. 13A, 13B and 13E that is connected to the control/configure circuit or NLINKS circuit of FIGS. 13A-13F, in accordance with an embodiment of certain aspects of the present inventions; in this embodiment, the MAC processors include a delay circuit (e.g., a one-cycle delay circuit), for example, as illustrated in the exemplary embodiment of FIGS. 14A and 14B; notably, the signal lines in the MAC pipeline include: "ODP" denotes the output data path, "ADP" denotes the accumulation data path, "IDP" denotes the input data path; the signal lines of the row interconnects include: "AD" denotes the accumulation data path, "ID" denotes the input data path, "MC" denotes L0 memory control path, "MA" denotes L0 memory address path, and "MD" denotes L0 memory address path; the circle with a number therein located in each data path indicates the number of bits and/or conductors or lines (e.g., data or control) of the particular path or port; for the avoidance of doubt, the block/data width, data path and/or port width set forth are merely exemplary and not limiting in any respect; as stated above, a "port" is a physical point of entry to/exit from the control/configure or NLINKS circuit; all physical forms of entry to or exit from the control/configure or NLINKS circuit are intended to fall within the scope of the present inventions (for example, a conductor or metal routing in/of an integrated circuit);

FIGS. 14A and 14B illustrate portions of a schematic block diagram of an exemplary logical overview of an exemplary MAC or MAC processor, including a delay circuit (e.g., a one-cycle delay circuit), of the MAC pipeline of FIGS. 13A-13G, including multiplier-accumulator circuit having a multiplier circuit ("MUL") performing operation in a complex number data format and/or accumulator circuit ("ADD") performing operations in a complex number data format, according to one embodiment of the present inventions; in this illustrative embodiment, the multiplexer of the one-cycle delay circuit may responsively select between input 1 or input 2, a one-cycle delay of input 1 (see FIG. 14B); in one embodiment, the multiplexer (mux) of the one-cycle delay circuit of each MAC of the pipeline of the FIR filter may be configured/controlled to select input 1 where the FIR filter and filtering techniques employ real number data format and real filter weights (based on values having only real number values) and, in contrast, select input 2 (incorporating a one-cycle delay into the FIR filtering operations) where the FIR filter and filtering techniques employ complex number data format and complex filter weights (based on values having both real and imaginary number values); notably, different or longer delays (relative to a one-cycle delay) may be implemented via, for example, employing one or more additional D flip/flop circuits; as discussed above, in one embodiment, the MAC may include one or more (here, two are illustrated) dedicated memory banks to store at least two different sets of filter weights—each set of filter weights associated with and used in processing a set of data) wherein each memory bank may be alternately read for use in processing a given set of associated data and alternately written after processing the given set of associated data;

Figure 15:
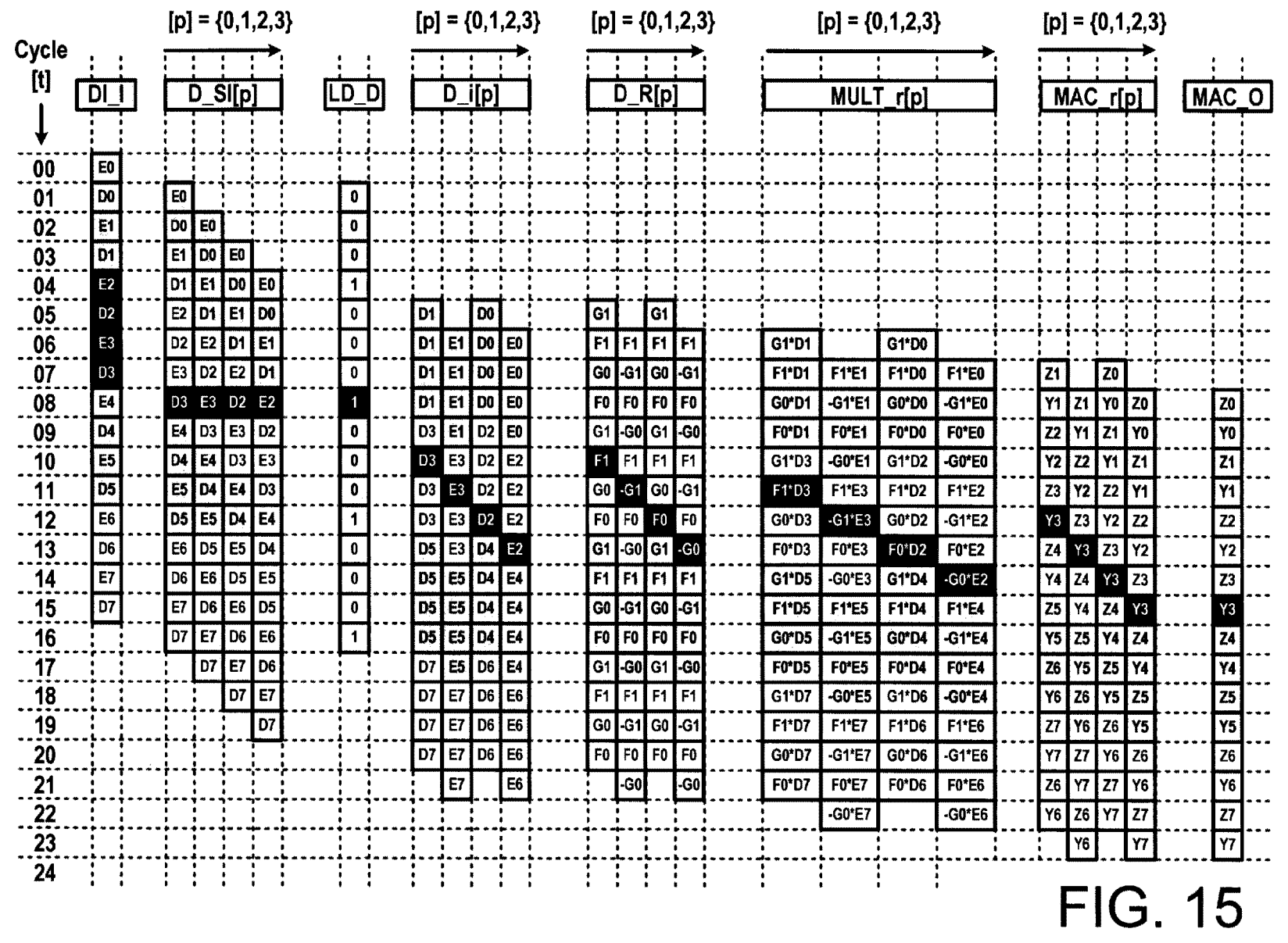

FIG. 15 illustrate exemplary sequencing details of an exemplary FIR filter circuit embodiment of FIGS. 13B-13G, employing a complex number data format, where the number of processors employed in the FIR filter circuit is four (i.e., M=4) and the number of taps is two (i.e., N=2); notably, exemplary configuration is convenient for the purposes of describing the operation and processing of the NLINKS circuit and MAC processing pipeline as well as exemplary sequencing details of the complex FIR filtering process and the inventions are not limited thereto or thereby;

FIGS. 16A and 16B illustrate schematic block diagrams of multiplexers (i.e., data selectors) having a plurality of inputs (Input 1, Input 2 . . . ), at least one input select control signal (Input Select or Input Selects) and an output, wherein the input select control signal determines or input select control signals determine which multiplexer input is connected to the multiplexer output (i.e., which input-output of the Mux or MUX is enabled or selected); a multiplexer may include one multiplexer or "mux" (FIG. 16A) or a plurality of interconnect multiplexers "muxes" (FIG. 16B), for example, that are arranged in tree topology to provide an overall larger or bigger multiplexer from one or more smaller multiplexers; the term "multiplexer" or "mux" (or plurals thereof) means any data selector circuit (e.g., one or more switches) now known or later developed; notably, at times, the control signal(s), and control signal input(s), employed to control multiplexers in the circuit block diagrams hereof (e.g., Mux 2 in FIG. 13F) have been omitted for the purpose of or to improve clarity—however, each such multiplexer includes at least one input select control signal and at least one control signal determines which multiplexer input is connected to the multiplexer output;

FIG. 17A illustrates a schematic block diagram of a logical overview of an exemplary multiplier-accumulator execution pipeline, connected in a linear pipeline configuration wherein input data values (Dijk) are rotated, transferred or moved, on a cycle-by-cycle basis, from one MAC of the linear pipeline to the immediately following MAC of the pipeline and employed in the multiply operation of the multiplier circuit of that next MAC of the processing pipeline, according to one or more aspects of the present inventions; in this embodiment, before, during or after each cycle of the set of associated execution cycles, the input data are rotated, transferred or moved from a MAC of the linear pipeline to successive MAC thereof wherein the rotated, transferred or moved input data are input or applied to the multiplier circuit of associated MAC during or in connection with the multiply operation of that MAC; in this embodiment, the accumulation values generated by each MAC are maintained, stored or held, during each execution cycle of the execution sequence (i.e., set of associated execution cycles), in respective MAC (compare the embodiment of FIGUREIA) and used in the accumulation operation of the associated accumulator circuit thereof; that is, the accumulation values employed in subsequent processing (i.e., the accumulation operation) in the associated MAC; in this illustrative embodiment, the plurality of MACs is illustrated in block diagram form; an exemplary MAC is illustrated in schematic block diagram form in Inset A; notably, in this exemplary embodiment, "m" (e.g., 64 in one illustrative embodiment) MACs are connected in a linear execution pipeline to operate concurrently whereby the processing circuits perform m×m (e.g., 64×64) multiply-accumulate operations in each m (e.g., 64) cycle interval; notably, in one exemplary embodiment, each m (e.g., 64) cycle interval processes a Dd/Yd (depth) column of input and output pixels/data at a particular (i,j) location (the indexes for the width Dw/Yw and height Dh/Yh dimensions of this exemplary embodiment—Dw=512, Dh=256, and Dd=128, and the Yw=512, Yh=256, and Yd=64) wherein the m (e.g., 64) cycle execution interval is repeated for each of the Dw*Dh depth columns for this stage;

FIGS. 17B and 17C illustrate schematic block diagrams of exemplary multiplier-accumulator execution or processing pipelines including a plurality of serially connected MACs (e.g., 64; when m=64, see FIG. 17B) wherein input data values ("D") are rotated, transferred or moved, on a cycle-by-cycle basis, from one MAC (e.g., MAC Processor 1) of the linear pipeline to the immediately following MAC (e.g., MAC Processor 2) of the execution pipeline (see, D_i[p]) and employed in the multiply operation of the multiplier circuit of that next MAC (e.g., MAC Processor 2) of the processing pipeline, according to one or more aspects of the present inventions; in this embodiment, the output of each accumulator circuit ("ADD") of the MACs is input into the accumulator circuit ("ADD") of the associated MAC (see, MAC_r[p]) and employed in the accumulation operation; moreover the output of each accumulator circuit ("ADD") of the MACs is not rotated, transferred or moved to the immediately following MAC of the linear processing pipeline (compare FIGS. 1A-1C); in this way, the input data values ("D") are rotated, transferred or moved (e.g., before, during or at the completion of each execution cycle of the execution sequence (i.e., set of associated execution cycles)) through the plurality of serially connected MACs of the pipeline such that, in operation, after input of the initial data input values into the MACs of the linear pipeline (see "Shift in next D"), each input data value (see "Rotate current D") that is input into a MAC is output before, during or at the completion of each execution cycle to the immediately following MAC of the linear pipeline and employed in the multiplication operation of the multiplier circuit ("MUL") of that immediately following MAC, according to one or more aspects of the present inventions; notably, each MAC includes a multiplier circuit ("MUL") to perform/implement the multiply operations and accumulator circuit ("ADD") to perform/implement the accumulate operations, according to one or more aspects of the present inventions; in this exemplary embodiment, MAC processor may include or read from one or more of memory banks (e.g., two SRAM memory banks) that are dedicated to the MAC to store filter weights used by the multiplier circuit of the associated MAC (as described and illustrated in U.S. Non-Provisional application Ser. No. 17/212,411 and U.S. Provisional Application No. 63/012,111); notably, the individual MACs may, at times, be referred to herein as MAC processors); and FIG. 18 illustrates a schematic block diagram of one of a plurality of exemplary circuits to configure and control a MAC pipeline (including a plurality of serially connected multiplier-accumulator circuits or MAC processors (here, M where M is a whole number greater than two) that perform a plurality of multiply-accumulate operations (multiplier circuit ("MUL") performing operation and accumulator circuit ("ADD") performing operations) using, for example, real input data and real FIR filter weights) wherein initial values are provided to the MAC pipeline via another NLINKS circuit and wherein such initial values are final accumulation values generated by the MAC pipeline associated with that another NLINKS circuit, according to aspects of the present inventions; in one embodiment, the configuration is generally representative of architecture of FIG. 8A including more than two NLINKS circuits; in one embodiment, the NLINKS circuit illustrated in FIG. 8B is connected to the NLINKS circuit illustrated in FIG. 18, which is connected to the NLINKS circuit illustrated in FIG. 8C; in this illustrative embodiment, the exemplary interconnect architecture of the NLINKS circuits may be employed, together with the MAC pipeline, to implement real FIR filter operations wherein (i) the signals on the accumulation data path in the NLINKS circuit and execution pipeline denote the accumulating, ongoing or partial MAC accumulation totals or values generated during operation or performance of an execution sequence (e.g., prior to completion of the sequence), (ii) the output data path in the NLINKS circuit and MAC execution pipeline of this embodiment denotes the output data (e.g., final accumulation data, totals or values) generated by execution sequence(s) (i.e., input data that was processed via the multiplier-accumulator circuits or MAC processors of the execution pipeline), and (iii) the input port/path in the NLINKS circuit and MAC execution pipeline of this embodiment denotes the port/path of the initial data (e.g., partial accumulation data or values) input into the MAC processors of the MAC pipeline before initiation of the processing operations; certain of the signal/control lines between the control/configure or NLINKS circuit and the MAC pipeline have been omitted for purposes of clarity.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions are directed to circuitry and methods to filter input data (e.g., image data) via finite-impulse-response (FIR) filtering circuitry having a plurality of multiplier-accumulator circuits connected in a data processing pipeline (e.g., a linear pipeline). For example, a plurality of multiplier-accumulator circuits may be configured into and employed as one or more FIR filters to filter input data (e.g., image data) wherein the FIR filters may include the same or different filter or filtering characteristics. The FIR filters and filtering techniques may employ real number data format and real filter weights (based on values having only real number values) and/or complex number data format and complex filter weights (based on values having both real and imaginary number values—generally expressed as "a+bi", where "a" and "b" are real numbers, and "i" satisfies the equation $i^2=-1$).

In one embodiment, a plurality of multiplier-accumulator circuits are connected in series to perform a plurality of pipelined multiply and accumulate operations to filter two dimensional image data via a filter processing mode (e.g., one dimensional FIR filtering). The multiplier-accumulator circuits of the FIR filter may be configured or connected into a data processing pipeline of multiplier-accumulator circuits or may be a subset or a portion of a larger data processing pipeline of multiplier-accumulator circuits whereby the input and/or output of the FIR filter is intermediate of the larger multiplier-accumulator circuit pipeline.

The characteristics and/or configuration of the FIR filter may be one time or multiple time programmable or re-programmable—for example, the number of taps of the filter may be programmed/re-programmable, in situ (i.e., during normal operation of the integrated circuit) and/or at or during power-up, start-up, initialization, re-initialization, configuration, re-configuration or the like. In addition, the number of multiplier-accumulator circuits implemented or employed in the FIR filter may also be programmable. In another embodiment, the characteristics and/or configuration of the FIR filter, when activated and/or employed in the data processing operation, are fixed (e.g., at manufacture or during test (e.g., initial test)). As noted above, the "impulse response" of a FIR filter may be, at least in part, determined by the filter coefficients or weights employed in the multiply operations performed by the multiplier-accumulator circuit. Such filter coefficients may be stored in memory and provided to the multiplier-accumulator circuitry during operation.

In one embodiment, memory (e.g., a configuration register) may store the FIR filtering characteristics, including—for example, the number of taps of the image processing of, for example, the multiplier-accumulator circuit pipeline, and the number and/or specific ones of multiplier-accumulator circuits of one or more pipelines to be employed in the FIR filter. Such memory may be programmed or re-programmed at or during power-up, start-up, initialization, re-initialization and/or in situ. In one embodiment, the FIR filter includes 4, 8, 16, 32, 64, etc. taps and employs 4, 8, 16, 32, 64, 128, 256, etc. MACs. Indeed, the FIR filter may have N taps, employing M multiplier-accumulator circuits, where N and M are positive whole numbers (which may or may not be equal). As noted above, where the multiplier-accumulator circuits are configured into and employed as a plurality of FIR filters to filter input data (e.g., image data), such FIR filters may include the same or different filter or filtering characteristics.

In another aspect, the present inventions are directed to FIR filter configuration circuitry to program, configure and/or control a plurality of separate multiplier-accumulator circuits or rows/banks of interconnected (in series) multiplier-accumulator circuits to filter input data (e.g., image data), via multiply and accumulate operations (e.g., in a linear pipeline architecture), and generate and output a FIR filtered data (e.g., image data). Here, the FIR filter configuration circuitry may program, configure and/or control a plurality of multiplier-accumulator circuits to perform a plurality of pipelined multiply and accumulate operations to filter two dimensional image data via a filter processing mode (e.g., one dimensional FIR filtering).

In one embodiment, the FIR filter configuration circuitry programs and/or configures a plurality of FIR filters (having the same or different filtering characteristics/responses) using multiplier-accumulator circuits or rows/banks of interconnected (in series) multiplier-accumulator circuits to filter input data (e.g., image data), via multiply and accumulate operations (e.g., in a linear pipeline architecture).

The filter configuration circuitry may configure and/or re-configure (one-time or more than one-time) the MAC processing pipeline to provide one or more predetermined FIR filters to filter image data, for example, in situ (i.e., during normal operation of the integrated circuit) and/or at or during power-up, start-up, initialization, re-initialization, configuration, re-configuration or the like. As noted above, in one embodiment, memory (e.g., a configuration register) may store filter configuration data, including the characteristics of the filter implementing the image processing of, for example, the MAC pipeline. Such memory may be fixed or programmable/re-programmable, for example, multi-time programmable, at or during power-up, start-up, initialization, re-initialization and/or in situ.

The present inventions may implement real FIR filtering and/or complex FIR filtering of input data (e.g., image data). That is, the FIR filters and filtering techniques may employ real number data format and real filter weights (based on values having only real number values) and/or complex number data format and complex filter weights (based on values having both real and imaginary number values—generally expressed as "a+bi", where "a" and "b" are real numbers, and "i" satisfies the equation $i^2=-1$). With reference to FIG. 3A, where the circuitry and technique employs real FIR filtering techniques, a stream of input data D[u] is provided or supplied to the MAC execution circuitry of the FIR filter (a plurality of MACs, e.g., 4, 8, 16, 64, 128, etc. MACs or MAC processors). The input data D[u] (e.g., image data) are real values processed by the MAC execution circuitry, using a set of filter weights or coefficients F[v] which are real values, to generate or produce a stream of output data Y[u] (which are also real values). The data processing involves generating or forming the products of input values D[u] and filter values F[v] via the multiplier circuits of the MAC circuitry of the FIR filter.

With continued reference to FIG. 3A, there is one output value Y[u] generated or produced for each input value D[u]. Moreover, there are (vmax+1) of these products for each output value Y[v]. The value (vmax+1) is the number of taps of the FIR filter. Each output value includes (vmax+1) multiplies and (vmax+1) additions operations to be performed by the MAC execution circuitry of the FIR filter.

FIG. 3B illustrates a simplified expression for the real FIR filter, employing real FIR filtering techniques, having 4-taps (i.e., vmax=3 in this exemplary embodiment). Where the circuitry employs real FIR filtering techniques, a stream of input data D[u], having real number data, is provided to a plurality of MACs (e.g., 4, 8, 16, 64, 128, etc. MACs or MAC processors) to process or filter the input data using real filter weights (based on values having only real number values).

With reference to FIG. 3C, where the circuitry and technique employs complex FIR filtering techniques, based on complex number data format, a stream of complex input data/values D[u]+i*E[u] is provided or supplied to the MAC execution circuitry of the FIR filter ("i" is the square root of negative one). The complex input data/values D[u]+i*E[u] are processed by the MAC execution circuitry (e.g., 4 MACs or MAC processors in a linear pipeline), using a set of complex filter values/weights F[v]+i*G[v], to generate or produce a stream of complex output values/data Y[u]+i*Z[u]. The data processing operation of the circuitry and technique employing complex FIR filtering techniques involves generating or forming the complex products of input values/data D[u]+i*E[u] and complex filter values/weights F[v]+i*G[v].

Notably, there is one complex output value Y[u]+i*Z[u] generated or produced for each complex input value D[u]+i*E[u]. Moreover, there are (vmax+1) of these complex products for each complex output value Y[u]+i*Z[u]. Again, the value (vmax+1) is the number of taps for the FIR filter. However, each complex output value includes 4*(vmax+1) real multiplies and 4*(vmax+1) real additions to be performed by the MAC execution circuitry of the FIR filter implementing complex FIR filtering techniques. FIG. 3D illustrates a simplified expression for the FIR filter, employing complex FIR filtering techniques, having 2-taps (i.e., vmax=1 in this exemplary embodiment).

With reference to FIGS. 4 and 5A-5D, in one embodiment of the present inventions, FIR filter configuration circuitry (which includes the NLINKS circuit) controls and configures the MAC processing pipeline (which includes a plurality of MACs connected in a data processing pipeline (here, a linear pipeline of M multiplier-accumulator circuits)) to perform FIR filtering operations (including multiply and accumulate operations), based on a real number data format, using predetermined filter characteristics (for example, characteristics that are stored in configuration memory). In one embodiment, the NLNK_MAC_SI port/path of the NLINKS circuit (input port and input path—see NLINKS(lower)) are employed to provide initial values, having a real number data format, to the MACs of the MAC processing pipeline prior to initiation of the multiply and accumulate operations of the execution sequence. The DI_I port/path of the NLINKS circuit (input data port and input data path—see NLINKS(lower)) is employed to provide input data (e.g., image data), having a real number data format, to the MAC processing pipeline. Moreover, the FIR filter weights or coefficients, employed by the multiplier circuit (in connection with the multiply operations) of each MAC of the filter, are also values in a real number data format and, in this embodiment, are stored in the "local" memory associated with each particular MAC (see, e.g., FIGS. 2E, 2F and 5B). The MAC_I and MAC_O ports/path of the NLINKS circuit (see accumulation data port and accumulation data path in FIGS. 5B-5D) provide an accumulation ring in connection with performance of the FIR filtering operations (multiply and accumulate operations) implemented by the MAC pipeline. That is, the accumulation data path in the NLINKS circuit (and execution pipeline) denotes the ongoing/accumulating MAC accumulation values generated by the MACs during performance of an execution filtering sequence(s)). Finally, the MAC_SO port/path of the NLINKS circuit (see output data port and output data path in FIGS. 5B-5D) is employed to output data processed (i.e., data fully processed by the FIR filter circuit via the execution sequence(s)) by the MAC pipeline to, for example, memory (e.g., L2 memory). Here, the data output at the MAC_SO port is in a real number data format.

For example, in one embodiment, the number of MACs or MAC processors employed in the FIR filter circuit is four (i.e., M=4) and the number of taps is four (i.e., N=4). This exemplary embodiment is convenient for the purposes of describing the operation and processing of the NLINKS circuit and MAC processing pipeline as well as exemplary sequencing details of the FIR filtering process. It is not intended to limit the present inventions in any way. Regardless, with reference to FIGS. 3A, 3B, 4 and 5A-5D, four MAC processors will take in eight real input values D[u+7:u] and use four real filter values F[3:0] to produce four real output values Y[u+7:u:4] in eight pipeline cycles. The real input values D[u+7:u] may be stored in an external memory and provided to the MAC pipeline via the D_I and DI_I ports, and electrical connection therebetween (input data ports and data path). The real filter values F[3:0] are stored in "local" memory (L0 memory—e.g., SRAM) illustrated at the top of each MAC of the pipeline. The initial values of the real output Y[u+7:u] (prior to initiation of the multiply and accumulate operations) may also be stored in external memory and may be provided to the MACs of the MAC pipeline via the MAC_SI port (input port and input path). Notably, if the initial values are zero, this input and/or process may be a special instruction which clears the initial output values or loads zero in the circuitry of the MACs of the MAC pipeline prior to initiation of the multiply and accumulate operations.

With continued reference to FIGS. 2E, 2F, 3A, 3B, 4 and 5A-5D, in operation, the four real output Y[u+7:u] values circulate twice through the MAC processing pipeline (wherein the MAC or MAC processors perform multiply and accumulate operations). That is, the four real output Y[u+7:u] values are processed, via the MAC processors of the MAC pipeline, twice through the accumulation ring of the MAC pipeline via the accumulation data port/path in the NLINKS circuit (see MAC_O/MAC_I ports/path of the NLINKS circuit and the accumulation data path in the MAC pipeline (see AP in FIGS. 2E and 2F). Here, the signals on the accumulation data path in the NLINKS circuit and execution pipeline denote the accumulating, ongoing or partial MAC accumulation values generated during operation or performance of an execution sequence (e.g., prior to completion of the sequence). After completion of the processing or execution sequence, the real output values Y[u+7:u+4] may be read from the MAC pipeline (see ODP in FIGS. 2E and 2F) and, via the MAC_SO port, NLINKS circuit (see output data port/path in the NLINKS(upper), e.g., in FIG. 5C). In one embodiment, the filtered output data are output to circuitry external to the filter circuitry and, for example, are stored in external memory (see FIG. 5A).

With reference to FIG. 6, exemplary sequencing details for the simplified 4-tap/4-MAC processor embodiment include three sets of blocks (having alternating gray and white color backgrounds (except those blocks that have white text)), with each block consuming 8 pipeline cycles. The accumulation of the Y[8] output is shown highlighted by white text on a black background in the second block.

The real input values D[u+7:u] are read from an external memory and provided to the DI_I port (see "DI_I" column) at the left side of FIG. 6. These inputs are serially shifted onto the D_SI[p] bus (see "D_SI[p]" column heading) across the four MAC processors (which may have index p={0,1,2,3}). Four of the input values are parallel-loaded onto the D_i[p] bus (see "D_i[p]" column heading) across the four MAC processors with the control signal LD_D (see "LD_D" column heading) at four-cycle intervals.

During this four cycle interval there are 16 products MULT_r[p] generated using the four static D_i[p] values (see "D_i[p]" column heading) and 16 values from the L0 memory D_R[p]. The D_R[p] values include filter values F[3:0] and zero values—half the values are zero because the accumulation values will need to circle the four-MAC processors twice. During the eight-cycle block there are 32 products MULT_r[p] (see "MULT_r[p]" column heading) generated and added to the MAC_r[p] accumulation values that are circulating (see "MAC_r[p]" column heading). The MAC_r[p] accumulation values are parallel-loaded onto the MAC_SO[p] bus (see "MAC_SO[p]" column heading) across the four MACs with the control signal LD_Y (see "LD_D" column heading) at eight-cycle intervals. These accumulation values are the real output values Y[u+7:u:4]. They are serially shifted onto the MAC_SO port (see "MAC_SO" column heading) and written to, for example, an external memory. Notably that the four output values appear twice on the MAC_SO port; four of the values are redundant and will/may not be used.

With continued reference to FIG. 6, focusing on the Y[8] output generation (highlighted by white text on a black background), it will start with the block of D[11:4] inputs highlighted by white text on a black background and white text on gray background—the inputs highlighted by white text on a gray background are not used in this embodiment (and, in one embodiment, they are multiplied by zero). The D[7:5] inputs are processed in the first four-cycle interval, and the D[4] input is processed in the second four-cycle interval of the eight-cycle block. The four products of D[7:4] and F[3:0] are formed on the MULT_r[p] bus, and are accumulated on the MAC_r[p] bus on the Y[8] diagonal (highlighted by white text on a black background).

With reference to FIGS. 1B, 1C and 7A, in another embodiment, the integrated circuit includes a plurality of control/configure circuits or NLINKS circuits, each connected (and, in one embodiment, dedicated) to an associated pipeline of multiplier-accumulator circuits to perform, for example, real FIR filtering techniques via a plurality of multiply-accumulate operations using real input data and real FIR filter weights (in this illustrative embodiment, the filter weights are stored in a memory local and dedicated to the MAC pipeline (see L0 memory)). Here, each NLINKS circuit and associated MAC pipeline of multiplier-accumulator circuits may perform separate and/or independent real FIR filtering operations on input data applied to the MAC pipeline via the D_I input port wherein each NLINK-MAC pipeline pair may be configured into and employed as a separate and/or independent FIR filter to filter input data (e.g., image data). Each FIR filter (NLINKS circuit-MAC pipeline pair (e.g., NLINKS 1 and MAC pipeline 1) of the plurality of FIR filters (i.e., the plurality of NLINKS circuit-MAC pipeline pairs) of this embodiment may include the same or different filtering characteristics. In one embodiment, each NLINKS circuit is connected to the associated pipeline of multiplier-accumulator circuits in the manner illustrated in FIG. 5B and each NLINKS circuit is configurable to connect to one or more other NLINKS circuits, for example, to provide a linear MAC execution or processing pipeline configured to perform, for example, multiply-accumulate processing according to certain aspects of the present inventions. In the illustrative example, each NLINKS circuit includes MAC_I/MAC_O ports of the linear MAC execution pipeline (which includes a plurality of the connected (e.g., serially) multiplier-accumulator circuits (labeled "MAC pipeline" and illustrated in block diagram depicting exemplary multiplier-accumulator circuitry (including, e.g., 64 MACs). Notably, certain of the connections and signal lines in the NLINKS circuit have been omitted for purposes of clarity.

With reference to FIGS. 1B, 1C, 2B and 7B-7D, in one embodiment, of a plurality of interconnected control/configure circuits or NLINKS circuits, each connected (and, in one embodiment, dedicated) to a plurality of multiplier-accumulator circuits (e.g., rows of multiplier-accumulator circuits wherein each row includes a plurality of multiplier-accumulator circuits—in the illustrative/exemplary embodiment, 32). Here, the two pluralities of multiplier-accumulator circuits (i.e., MAC Processors 1 and MAC processors 2) are interconnected via each NLINKS circuit associated therewith (NLINKS 1 and NLINKS 2, respectively) to form one linear MAC pipeline (which includes the MACs of MAC Processors 1 and MAC processors 2) to perform real FIR filtering using real input data and real FIR filter weights (which may be stored in the local memory L0 memory associated with each pipeline). In one embodiment, each plurality of multiplier-accumulator circuits are serial connected as a row of multiplier-accumulator circuits (see, e.g., FIG. 2B) wherein the rows of multiplier-accumulator circuits are interconnected via the associated NLINKS circuits to form one linear MAC pipeline to perform real FIR filtering using real input data and real FIR filter weights using an architecture and techniques similar to those described above in connection with FIGS. 5A and 5B. Here, however, the number of MAC processors of the MAC pipeline is greater (e.g., twice as many as multiplier-accumulator circuits of the exemplary embodiments of FIGS. 5A and 5B) wherein the plurality of multiplier-accumulator circuits associated with MAC processors 1 and MAC processors 2 are connected into one ring (MAC_I/MAC_O) and the values (Y) rotate through the ring once.

Briefly, with reference to FIGS. 7B-7D, the MAC_I/MAC_O ports of the NLINKS circuits connect the plurality of multiplier-accumulator circuits of MAC processors 1 and the plurality of multiplier-accumulator circuits of MAC processors 2 to form the linear MAC execution pipeline and an accumulation ring for the data processing pipeline in connection with performance of the FIR filtering operations (multiply and accumulate operations) implemented by the MAC pipeline. For example, where MAC processors 1 and MAC processors 2 each include four MAC processors, the accumulation ring of the single MAC pipeline includes eight MAC processors implementing an eight cycle accumulation time.

With continued reference to FIG. 7B-7D, in one embodiment, input data (e.g., image data) is read from memory (e.g., external memory such as L2) and input into the MAC pipeline via DI_I and MAC_SI ports of the NLINKS 1 (see input data port/path in NLINKS 1 in FIG. 7C). The values (Y) rotate through the accumulation ring (i.e., MACs of MAC processors 1 and MAC processors 2—see accumulation data paths in NLINKS 1 and NLINKS 2 and the associated MACs of the entire pipeline—see FIGS. 7C and 7D). In one embodiment, the partial accumulation values rotate through the accumulation ring of the MAC pipeline once and, thereafter, the processed/filtered output data (final accumulation data or values) are read from the MAC pipeline via the MAC_SO port/path of the NLINKS 2 (see output data port/path in NLINKS 2 in FIG. 7D). The data output at the MAC_SO port are in a real number data format. Notably, certain of the connections and signal lines between the control/configure or NLINKS circuits have been omitted for purposes of clarity.

In another embodiment, the FIR filter includes a plurality of MAC pipelines, each MAC pipeline performing separate and/or independent multiply and accumulate operations, wherein the accumulation output of a first MAC pipeline (i.e., partial accumulation data or sums) is applied to the accumulation input of a second MAC pipeline to generate final accumulation data, totals or values, which may be output therefrom to circuitry external to the filter circuitry (e.g., written into external memory). Here, the MAC pipelines (each pipeline including a plurality of MAC processors) are configured to perform separate and/or independent multiply and accumulate operations such that a first MAC pipeline, performing multiply and accumulation operations, generates partial accumulation values which are provided to a second MAC pipeline to generate final accumulation data or values, via performing separate and/or independent multiply and accumulation operations, from or using the partial accumulation values generated by the first MAC pipeline. For example, with reference to FIG. 8A, in one embodiment, the number of MAC processors employed in the FIR filter circuit is eight (i.e., M=8; each MAC pipeline is 4 wherein the total is 8) and the number of taps is four (i.e., N=4). Notably, this exemplary configuration and exemplary characteristics of the filter are convenient for the purposes of explaining/describing the operation and processing of the NLINKS circuit and MAC processing pipeline, as well as exemplary sequencing details of the FIR filtering process. It is not intended to limit the present inventions in any way.

With that in mind, and with reference to FIGS. 3A, 3B and 8A-8C, the eight MAC processors are configured or arranged so that all the partial sums may be accumulated in a single circulation of a first MAC pipeline having four MACs. (See, FIGS. 8A and 8B). Here, four partial sums are accumulated by the four MAC processors (see accumulation data path, accumulation data port, and AD in the row connects in FIG. 8B) of MAC pipeline 1. The partial sums generated by the MACs of the MAC pipeline 1 are parallel-unloaded to the serial output path (output data path and output data port (MAC_SO) NLINKS(upper) in FIG. 8B) and transferred or provided to MAC processors of MAC pipeline 2 and (MAC_SI and input path in NLINKS(lower) in FIG. 8C). The partial sums or accumulations are input into the MACs of MAC pipeline 2 as initial values. The additional summation operations, using the partial sums, are performed by the MACs of the MAC processors of MAC pipeline 2 (see accumulation data path, accumulation data port, and AD in the row connects in FIG. 8C). The final accumulation data or sums are output (parallel-loaded), for example, via the serial output path (output data path and output data port in NLINKS(upper) in FIG. 8C). Thereafter, the filtered/processed data may be transferred to external circuitry (e.g., written into external memory (see, e.g., FIG. 8A)).

Notably, in one embodiment, the partial sums generated by the MACs of the first MAC pipeline (MAC pipeline 1) may be transferred and written to memory (external to the pipeline), and thereafter read from external memory and input into the MACs of the second MAC pipeline. (See, e.g., FIG. 7B wherein two MAC pipelines perform operations to implement FIR filtering on a common set of input data wherein a first MAC pipeline (which is associated with a first NLINKS circuit) generates the partial sums, which are written to memory, and a second MAC pipeline (which is associated with a second NLINKS circuit), using the partial sums, generates the final sums). This type of architecture decouples the shifting paths of the MACs of the two pipelines.

With reference to FIGS. 9A and 9B, exemplary sequencing details for the simplified 4-tap/8-MAC processor embodiment of FIGS. 8A-8C. There are three sets of blocks (having alternating gray and white color backgrounds), with each block consuming 4 pipeline cycles. The accumulation of the Y[8] output is highlighted by white text on a black background in the second block. FIG. 9A illustrates sequencing of the four MAC processors of the first MAC pipeline. Here, the real input values D[u+7:u+4] are read from external memory via the DI_I port (see "DI_I" column heading) at the left side (note that u=0 for this block of data). These data inputs are serially shifted onto the D_S[p] bus (see "D_S[p]" column heading) across the four MAC processors with index p={0,1,2,3}. The input values are parallel-loaded onto the D_i[p] bus (see "D_i[p]" column heading) across the four MAC processors with the control signal LD_D (see "LD_D" column heading) at four-cycle intervals.

During this four cycle interval, there are 16 products MULT_r[p] generated using the four static D_i[p] values ("D_i[p]" column heading) and 16 values from the L0 memory D_R[p]. The D_R[p] values include filter values F[3:0] and zero values—half the values are zero because the accumulation values use additional sums from the four MAC processors of the second MAC pipeline. During the four-cycle block there are 16 products MULT_r[p] (see "MULT_r[p]" column heading) generated and added to the MAC_r[p] accumulation values that are circulating (see "MAC_r[p]" column heading e). These MAC_r[p] accumulation values ("MAC_r[p]" column heading) are parallel-loaded onto the MAC_SO[p] bus (see "MAC_SO[p]" column heading) across the four processors with the control signal LD_Y (see "LD_D" column heading) at eight-cycle intervals. These partial accumulation values are the real output values Y[u+11:u+8] and are serially shifted onto the MAC_SO port (see "MAC_SO" column heading) and output to the four MAC processors of the second MAC pipeline.

With reference to FIG. 9B, the sequencing of the four MAC processors of the second MAC pipeline includes the real input values D[u+11:u+8] that are read from an external memory via the DI_I port (see "DI_I" column heading) at the left side of the sequencing illustration (note that u=0 for this block of data). These data inputs are serially shifted onto the D_S[p] bus (see "D_SI[p]" column heading) across the four MAC processors of the second MAC pipeline with index p={4,5,6,7}. The input values are parallel-loaded onto the D_i[p] bus (see "D_i[p]" column heading) across the four MAC processors with the control signal LD_D (see "LD_[D]" column heading) at four-cycle intervals. Simultaneously, the four partial sums (from the four MAC processors of the first MAC pipeline) are shifted in on the MAC_SI port and parallel-loaded to the MAC processors of the second MAC pipeline from the MAC_SI[p] nodes (see "MAC_SI[p]" column heading). The parallel-load action is handled by the UNLD_Y control signal (see "UNLD_Y"

column heading). The additional sums will be accumulated by the four MAC processors of the second MAC pipeline (see "MAC_r[p]" column heading).

During this four cycle interval there are 16 products MULT_r[p] (see "MULT_r[p]" column heading) generated using the four static D_i[p] values ("D_i[p]" heading) and 16 values from the L0 memory D_R[p]. The D_R[p] values include filter values F[3:0] and zero values—half the values are zero because some of the accumulation values were generated in the four MAC processors of the first MAC pipeline. During the four-cycle block there are 16 products MULT_r[p] ("MULT_r[p]" column heading) generated and added to the MAC_r[p] accumulation values that are circulating (see "MAC_r[p]" column heading). The MAC_r[p] accumulation values ("MAC_r[p]" column heading) will be parallel-loaded onto the MAC_SO[p] bus ("MAC_SO[p]" column heading) across the four processors with the control signal LD_Y ("LD_D" column heading) at four-cycle intervals. This is not shown in the sequencing illustration, but will be similar to what was shown for unloading the four processors of the first MAC pipeline onto MAC_SO port. These final accumulation values are the real output values Y[u+11:u+8] and are serially shifted onto the MAC_SO port ("MAC_SO[p]" column heading) and, in one embodiment, written into external memory.

As noted above, this exemplary configuration is convenient for the purposes of explaining/describing certain exemplary sequencing details of an embodiment of FIR filtering process of the operation and processing of the FIR filter configuration employing a plurality of MAC pipelines, each pipeline performing separate accumulation operations. It merely an exemplary embodiment and not intended to limit the present inventions in any way. Indeed, each MAC pipeline may have more than four MACs or MAC processors (e.g., such MAC pipelines may each have 64 MACs or MAC processors).

In another embodiment, the FIR filter includes a plurality of MAC pipelines, each MAC pipeline performing separate multiply and accumulate operations, wherein the accumulation output of a first MAC pipeline (i.e., partial sums) is applied to the accumulation input of a second MAC pipeline to generate final sums, which may be output therefrom and written into external memory. Here, the MAC pipelines (each pipeline including a plurality of MAC processors) are configured to perform separate multiply and accumulate operations such that a first MAC pipeline, performing multiply and accumulation operations, generates partial accumulation totals or values which are provided to a second MAC pipeline to generate final accumulation totals or values via performing multiply and accumulation operations. For example, with reference to FIGS. 8A-8C, in one embodiment, the number of MAC processors employed in the FIR filter circuit is eight (i.e., M=8) and the number of taps is four (i.e., N=4). This exemplary configuration is convenient for the purposes of describing the operation and processing of the NLINKS circuit and MAC processing pipeline as well as exemplary sequencing details of the FIR filtering process. It is not intended to limit the present inventions in any way.

With that in mind and with reference to FIGS. 2E, 2F, 3A, 3B and 8A-8C, the MACs or MAC processors are configured or arranged so that all the partial sums may be accumulated in a single circulation of a first MAC pipeline having four MACs. (See, FIGS. 8A and 8B). Here, the partial sums (in this example, four) are accumulated by the MAC processors (see accumulation data port and accumulation data path in the NLINKS and the accumulation data path (ADP) in the pipeline), and row interconnects AD in FIG. 8B) of a first MAC pipeline. The partial sums generated by the MACs of the first MAC pipeline (MAC pipeline 1) are output (e.g., parallel-unloaded) to the serial output path (see output data port, output data path of NLINKS 1(upper) in FIG. 8B) and transferred or provided, via the output data port and path of NLINKS 1 to the input port and input path of NLINKS 2, and thereafter to the MAC processors of a second MAC pipeline. (See, FIGS. 8A and 8C). The additional summation operations, using the partial sums, are performed by the four MAC processors of a second MAC pipeline (MAC pipeline 2) are accumulated (see accumulation data port and accumulation data path in the NLINKS and the accumulation data path (ADP) in the pipeline), and row interconnects AD in FIG. 8C). The final accumulations or sums are output (parallel-loaded), for example, via the serial output path (output data path and output data port in NLINKS(upper) in FIG. 8C). Thereafter, the filtered/processed data may be transferred to external circuitry (e.g., written into external memory (see, e.g., FIG. 8A)).

With reference to FIG. 10A, in another embodiment, the control/configure or NLINKS circuit configures the real FIR filter by routing/re-routing the accumulation data path (MAC_I and MAC_O ports), via control of multiplexer Mux 1, between a data load mode and an accumulation mode whereby in the data load mode initial values or accumulations are loaded-in or input into the MACs or MAC processors of the pipeline and in the accumulation mode, the MACs or MAC processors of the pipeline perform multiply and accumulation operations in the filtering operations.

In addition thereto, or in lieu thereof, in another embodiment, the control/configure or NLINKS circuit configures the real FIR filter by routing/re-routing the accumulation data path (MAC_I and MAC_O ports), via control of multiplexer Mux 2, between an accumulation mode and an output data mode whereby in the output data mode the final accumulations values (i.e., the final values generated via the filtering operations) are output from the accumulation data path in the pipeline, via the accumulation port of the NLINKS circuit (see NLINKS(upper) in FIG. 10B) and the multiplexer Mux 2 to the output data port of the NLINKS circuit (see NLINKS(upper) in FIG. 10B). Here, in one embodiment, the real output values (final accumulation values) may be serially unloaded directly from the MAC_O accumulation data path, via the multiplexer Mux 2, to the output data port (MAC_SO) of the NLINKS circuit to thereby improve processing efficiency.

For example, with reference to FIGS. 10B-10F, where the number of MAC processors employed in the FIR filter circuit is four (i.e., M=4) and the number of taps is four (i.e., N=4), the four MAC processors receive four real input values D[u+7:u+4] and use four real filter values F[3:0] to filter and generate four real output values Y[u+7:u:4] in four pipeline cycles. Here, the input values D[u+7:u+4], in a real number data format, are read from an external memory via the DI_I port (input data port and input data path—see NLINKS(lower) in FIG. 10B). In this embodiment, the initial accumulation values of the real output Y[u+7:u+4] are input into the execution pipeline of the FIR filter (e.g., read from external memory) via the MAC_SI port, MAC_I port and multiplexer mux1 (see accumulation data port, accumulation data path and Mux 1 in NLINKS(lower) in FIGS. 10B and 10D) and input into the MACs of the MAC pipeline via Mux 1. Here, the input of Mux 1 is configured to connect to the accumulation data path/port from NLNK_MAC_SI port to NMAX_MAC_I port by selecting the input associated with the input path to connect to the output of Mux 1. In this way, the initial values may be input into the MACs or MAC processors of the MAC pipeline, for example, prior to initiation of the multiply and accumulate operations of the execution sequence (the sequence that performs the FIR filter operations) via the input path/port and the connection (NLNK_MAC_SI and NMAX_MAC_I). (See FIGS. 10B and 10D). Notably, if the initial values are zero, a special instruction may be applied to clear the initial output values to thereby initialize or clear the data in the MAC processors prior to initiation of the multiply and accumulate operations.

With reference to FIG. 10E, in one embodiment, the real filter values F[3:0] are stored in the L0 memory in each MAC of the pipeline (illustrated at the top of each MAC processor block diagram). During the multiply and accumulation operations of the MAC processor, the NLINKS circuit is configured in an accumulation mode whereby the multiplexer Mux 1 is configured to provide an accumulation data path for the partial accumulation values to circulate through the MAC processing pipeline (compare the embodiment of FIG. 5B). That is, the four real output Y[u+7:u] values are processed once through the accumulation ring of the MAC pipeline via through the MAC_O/MAC_I ports/path of the NLINKS circuit (accumulation data path) and Mux 1. In addition, the multiplexer Mux 2 is configured to not select the input thereto that is connected to the accumulation data port (NMAX_MAC_O).

Upon completion of the processing, the final accumulation values are output from the MAC execution pipeline and the NLINKS circuit. Here, the NLINKS circuit is configured in an output data mode whereby the accumulation data path of the MAC pipeline is connected, via accumulation data port (NMAX_MAC_O) multiplexer Mux 2, to the output data port of the NLINKS circuit. With reference to FIG. 10F, thereafter, the real output values Y[u+7:u+4] are output from the MAC_O port, via Mux 2, on the output data path (see NLINKS(upper) in FIG. 10B and 10F). In one embodiment, such data may be written to external circuitry (e.g., an external memory—see FIG. 10A). In this mode, the input of Mux 2 that is connected to MAC_O port (NMAX_MAC_O) is enabled or selected in order to connect the accumulation data port to the output data path to output the final accumulation values from the MACs of the MAC pipeline directly from the MAC_O port (see FIG. 10F). Thus, in this embodiment, the real output Y[u+7:u+4] values circulate once through the accumulation ring (see accumulation data path in FIG. 10E) and through the MAC_O/MAC_I ports and, upon completion of the execution sequence, through the output data path (via Mux 2) and output data port (see FIG. 10F). As such, this embodiment may provide additional execution efficiency relative to the efficiency processing associated with the embodiment of FIG. 5B.

Notably, the MAC_SI paths/ports of the NLINKS circuit at the interface of the MAC pipeline (see FIGS. 10B, 10D-10F) and MAC_SO at the interface of the MAC pipeline (see, e.g., FIG. 10C) are not used in this embodiment. Moreover, the circuitry in the MAC processors connected to the MAC_SI and MAC_SO ports in the NLINKS (and the OD of the row interconnects) are also not used in this embodiment and such circuitry may be disabled. (See, e.g., FIGS. 2E and 2F).

With reference to FIG. 11, exemplary sequencing details for the simplified 4-tap/4-MAC processor embodiment of FIGS. 10B-10E include four sets of blocks (having alternating gray and white color backgrounds (except those blocks that have white text)), with each block consuming 4 pipeline cycles. The accumulation of the Y[4] output is shown highlighted by white text on a black background in the second block.

The real input values D[u+7:u] are read from an external memory and provided to the DI_I port (see "DIU" column heading) at the left side of the sequencing illustration of FIG. 11. These inputs are serially shifted onto the D_S[p] bus (see "D_S[p]" column heading) across the four MAC processors (which may have index p={0,1,2,3}). Four of the input values are parallel-loaded onto the D_i[p] bus (see "D_i[p]" column heading) across the four MAC processors with the control signal LD_D (see "LD_D" column heading) at four-cycle intervals.

During this four cycle interval there are 16 products MULT_r[p] (see "MULT_r[p]" column heading) generated using four static D_i[p] values ("D_i[p]" column heading) and 16 values from the L0 memory D_R[p]. The D_R[p] values include real filter values F[3:0] and no zero values are employed (compare the sequencing embodiment of FIG. 6). During the four-cycle block there are 16 products MULT_r[p] (see "MULT_r[p]" column heading) generated and added to the MAC_r[p] accumulation values that are circulating (see "MULT_r[p]" column heading). The MAC_r[p] accumulation values (see "MAC_r[p]" column heading) are not parallel-loaded onto the MAC_SO[p] bus—rather, the four output values Y[u+7:u+4] are serially shifted out on the MAC_O port, via appropriate control of Mux 2, to the MAC_SO output port of the NLINKS circuit (see, FIGS. 10B and 10C—see accumulation data port and accumulation data path).

With continued reference to FIG. 11, focusing on the Y[8] output generation (highlighted by white text on a black background), it will start with the block of D[4:1] inputs highlighted by white text on a black background. The D[3:1] inputs are processed in the first four-cycle interval, and the D[4] input is processed in the second four-cycle interval of the eight-cycle block. The four products of D[4:1] and F[3:0] are formed on the MULT_r[p] bus, and are accumulated on the MAC_r[p] bus on the Y[4] diagonal (highlighted by white text on a black background).

Notably, as with other exemplary embodiments, the discussion above where the MAC pipeline includes four MACs or MAC processors is convenient for the purposes of describing/explaining the operation and processing of the NLINKS circuit and MAC processing pipeline as well as exemplary sequencing details of the FIR filtering process of this embodiment. It is not intended to limit the present inventions in any way. Indeed, the MAC processing pipeline may include many more MACs or MAC processors (e.g., 8, 16, 32, 64, 128, etc.).

As mentioned above, the present inventions may implement complex FIR filtering using complex number data format and complex filter weights (based on values having both real and imaginary number values—generally expressed as "a+bi", where "a" and "b" are real numbers, and "i" satisfies the equation $i^2=-1$). Here, the circuitry and technique employs complex FIR filtering techniques, based on complex number data format, a stream of complex input data/values D[u]+i*E[u] is provided or supplied to the MAC execution circuitry of the FIR filter ("i" is the square root of negative one). (See FIG. 3C). The complex input data/values D[u]+i*E[u] (e.g., image data) are processed by the MAC execution pipeline (e.g., 4, 8, 16, 32, 64, 128, 256, etc. MACs or MAC processors), using a set of complex filter values/weights F[v]+i*G[v], to generate or produce a stream of complex output values/data Y[u]+i*Z[u]. The data processing operation of the circuitry and technique employing complex FIR filtering techniques involves generating or forming the complex products of input values/data D[u]+i*E[u] and complex filter values/weights F[v]+i*G[v].

Moreover, there is one complex output value Y[u]+i*Z[u] generated or produced for each complex input value D[u]+i*E[u]. FIG. 3D illustrates a simplified expression for the FIR filter, employing complex FIR filtering techniques, having 2-taps (i.e., vmax=1 in this exemplary embodiment). The value (vmax+1) is the number of taps for the filter. However, each complex output value includes 4*(vmax+1) real multiplies and 4*(vmax+1) real additions to be performed by the MAC execution circuitry of the FIR filter implementing complex FIR filtering techniques.

With reference to FIGS. 4 and 5A-5D, in one embodiment of the present inventions, FIR filter configuration circuitry (which includes the NLINKS circuit) controls and configures the MAC processing pipeline (which includes a plurality of multiplier-accumulator circuits connected in a data processing pipeline (here, a linear pipeline of M multiplier-accumulator circuits)) to perform complex FIR filtering operations (including multiply and accumulate operations), based on a complex number data format, using predetermined filter characteristics (e.g., filter characteristics that are stored in configuration memory). In this embodiment, the MAC_SI port/path of the NLINKS circuit (input port and input data path) are employed to provide initial values, having a complex number data format, to the MACs of the processing pipeline prior to initiation of the multiply and accumulate operations. The D_I port/path and DI_I port/path of the NLINKS circuit (i.e., the input data path in the NLINKS circuit and MAC execution pipeline, respectively) are employed to provide input data (e.g., image data), having a complex number data format, to the MACs or the MAC processing pipeline. Moreover, the FIR filter weights or coefficients, employed by the multiplier circuit of each MAC in connection with the multiply operations, are also values in a complex number data format and, in one embodiment, are stored in "local" memory (L0 memory) associated with each particular MAC. The MAC_I and MAC_O ports/path of the NLINKS circuit (accumulation data ports/path in FIGS. 5B-5D) and the MACs or MAC processors of the pipeline (accumulation path (AP) in the pipeline illustrated in FIGS. 2E and 2F) provide an accumulation ring for the data processing pipeline in connection with performance of the FIR filtering operations (multiply and accumulate operations) implemented by the MAC pipeline. Finally, the MAC_SO port/path of the NLINKS circuit (output data port/path in FIG. 5C) are employed to output the data (final accumulation values) processed by the MACs of the MAC pipeline to, for example, memory (e.g., L2 memory). Here, the data output (final accumulation values) at NMAX_MAC_SO port and NLNK_MAC_SO port (output data ports in FIG. 5C) are in a complex number data format.

With reference to FIG. 12, exemplary sequencing details for the simplified 2-tap/4-MAC processor embodiment include three sets of blocks (having alternating gray and white color backgrounds (except those blocks that have white text)), with each block consuming 8 pipeline cycles. The accumulation of the Y[4] output is shown highlighted by white text on a black background in the second block. Again, the discussion where the MAC pipeline includes four MACs or MAC processors is convenient for the purposes of describing/explaining the operation and processing of the NLINKS circuit and MAC processing pipeline as well as exemplary sequencing details of the FIR filtering process of this embodiment. It is not intended to limit the present inventions in any way. Indeed, the MAC processing pipeline may include many more MACs or MAC processors (e.g., 8, 16, 32, 64, 128, etc.).

With continued reference to FIG. 12, the complex input values D[u+3:u] and E[u+3:u] are read from an external memory and provided to the data input of the MAC processors, via the input data port (DI_I port) and the input data path (the input data path in the NLINKS circuit and MAC execution pipeline). (See the left side of the sequence illustrated in FIG. 12 (u=2 for the block with the Y[4] output)). These inputs are serially shifted onto the D_SI[p] bus (see "D_SI[p]" column heading) across the MAC processors (which may have index p={0,1,2,3}). Four of the input values are parallel-loaded onto the D_i[p] bus (see "D_i[p]" column heading) across the MAC processors with the control signal LD_D (see "LD_D" column heading) at four-cycle intervals.

During the four cycle interval, there are 16 products MULT_r[p] generated using the four static D_i[p] values (see "D_i[p]" column heading) and 16 values from the L0 memory D_R[p]. The D_R[p] values include filter values F[1:0] and G[1:0] and zero values—half the values are zero because the accumulation values will need to circle or rotate through the MAC processors twice. During the eight-cycle block there are 32 products MULT_r[p] (see "MULT_r[p]" column heading) generated and added to the MAC_r[p] accumulation values that are circulating or rotating through the MAC processors (see "MAC_r[p]" column heading). The MAC_r[p] accumulation values (see "MAC_r[p]" column heading) are parallel-loaded onto the MAC_SO[p] bus (see "MAC_SO[p]" column heading) across the MACs with the control signal LD_Y (see "LD_Y" column heading) at eight-cycle intervals. These accumulation totals/values are the complex output values Y[u+3:u+2] and Z[u+3:u+2]. At the completion of the processing, the final accumulation values are serially shifted onto the MAC_SO port (see "MAC_SO[p] and MAC_SO" column headings) and, in one embodiment, provided to circuitry external to the FIR filter, for example, written to an external memory. Notably that the four output values appear twice on the MAC_SO port; four of the values are redundant and will not be used.

With continued reference to FIG. 12, focusing on the Y[4] output generation (highlighted by white text on a black background), it will start with the block of D[5:2] and E[5:2] inputs highlighted by white text on a black background and white text on a gray background—the inputs highlighted by white text on a gray background are not used (and, in one embodiment, they are multiplied by zero). The D[3] and E[3] inputs are processed in the first four-cycle interval, and the D[4] and E[4] inputs are processed in the second four-cycle interval of the eight-cycle block. The four products of D[5:2]/E[5:2] and F[1:0]/G[1:0] are formed on the MULT_r[p] bus, and are accumulated on the MAC_r[p] bus on the Y[4] diagonal (highlighted by white text on a black background).

With reference to FIG. 13A, in another embodiment, the control/configure or NLINKS circuit configures the complex FIR filter to employ the route/re-route the MAC_I and MAC_O ports, via multiplexers (Mux 1 and Mux 2), between an accumulation mode (i.e., MAC accumulation generated by an execution sequence) and a data load mode (loading initial values into the MAC pipeline and reading partial accumulations of the MAC operations). In this embodiment, the complex output values (final accumulation values) may be output (e.g., serially unloaded) directly from the MAC_O accumulation data path thereby improving processing efficiency. For example, with reference to FIGS. 13B-13H, in one embodiment, the number of MAC processors employed in the FIR filter circuit is four (i.e., M=4) and the number of taps is two (i.e., N=2). This exemplary configuration is convenient for the purposes of describing the operation and processing of the NLINKS circuit and MAC processing pipeline as well as exemplary sequencing details of the FIR filtering process, employing the complex number data format, of this embodiment; and, it is not intended to be limiting.

With reference to FIGS. 13B-13H, in this embodiment, the initial accumulation values may be input into the MAC processors, via the accumulation ports, accumulation data path and multiplexer Mux 1, (e.g., preloaded via serially loading directly to the NMAX_MAC_I port, via the accumulation data port and accumulation data path—see NLINKS(lower) in FIGS. 13B and 13D). Here, in a data load mode, the multiplexer Mux 1 is configured to connect the input thereof that is connected to the NLNK_MAC_SI (via the input path—see, e.g., FIG. 13D) to its output and subsequently to the NMAX_MAC_I port at the interface with the MAC pipeline. In addition, in an output data mode, the final accumulation values are output via (i) the multiplexer Mux 2 which is configured to connect the input thereof that is connected to the NMAX_MAC_O (accumulation data port—see, e.g., FIG. 13C) to its output and (ii) the output data path (connected to the output of Mux 2) to the NLNK_MAC_SO port at the interface of the NLINKS circuit. The processed output data (final accumulation values) are in a complex number format (Y[u+3:u+2]/Z[u+3:u+2]). In this embodiment, the final accumulation values are output (e.g., serially unloaded) directly from the MAC_O port, via multiplexer Mux 2 (which is properly configured via control signal(s)), output data path and the output data port, i.e., NLNK_MAC_SO port, (see NLINKS(upper) in FIGS. 13B and 13C).

With continued reference to FIGS. 13B-13H, in this illustrative embodiment, the four MAC processors receive four two complex input values D[u+3:u+2]/E[u+3:u+2] and use two complex filter values F[1:0]/G[1:0] to filter and generate two complex output values Y[u+3:u+2]/Z[u+3:u+2] in four pipeline cycles. The input values D[u+3:u+2]/E[u+3:u+2], in a complex number data format, are read from an external memory via the DI_I port (see input data port and input data path of NLINKS(lower) in FIGS. 13B and 13D). The initial values of the complex output values Y[u+3:u+2]/Z[u+3:u+2] are read from external memory via the MAC_I port (see accumulation data port and accumulation data path NLINKS(lower)) and input into the MACs of the MAC pipeline via Mux 1. Here, the MAC_I port of the input-output of Mux 1 is enabled or selected so that the multiplexer Mux 1 is properly configured to allow the initial values to be input into the MACs of the MAC pipeline. Notably, if the initial values are zero, a special instruction may be applied to clears the initial output values to thereby initialize or clear the data in the MAC processors prior to initiation of the multiply and accumulate operations.

The complex filter values F[1:0]/G[1:0] are stored in the memory (see memory banks illustrated at the top of each MAC processor circuit block diagram—see FIGS. 13G and 13H). With reference to FIG. 13E, after the initial values are input into the MAC processors of the pipeline, the NLINKS circuit is configured in an accumulation mode whereby multiplexer Mux 1 is configured to form an accumulation ring during the multiply and accumulation operations of execution sequence. Here, the MAC processors process the data wherein the partial accumulation values circulate once through the MAC processing pipeline (compare the embodiment of FIG. 5B). That is, complex output values Y[u+3:u+2]/Z[u+3:u+2] values are processed once through the accumulation ring of the MAC pipeline via through the MAC_O/MAC_I ports/path of the NLINKS circuit (see accumulation data path in FIG. 13E). Notably, the multiplexer Mux 2 may be configured to not select the output of the accumulation data port.

With reference to FIG. 13B and 13F, after the FIR filter processing is complete, the final accumulation values (i.e., complex output values Y[u+3:u+2]/Z[u+3:u+2]) may be output from the MAC pipeline directly from the accumulation data port (i.e., NMAX_MAC_O port) via Mux 2 (see accumulation data port (at the output of the pipeline), output data path and output data port in NLINKS(upper)) and, in one embodiment, such data may be output to circuitry external to the FIR filter circuit (e.g., written into an external memory such as L2 memory). Here, the Mux 2 responsively connects, via a control signal, the MAC_O port, which is connected accumulation data port (i.e., NMAX_MAC_O port), to the output data path and subsequently to the output data port (i.e., NLNK_MAC_SO) at the interface of the NLINKS circuit. In this way, the final accumulation values may be output from the MACs or MAC processors of the MAC pipeline, via Mux 2, directly from the MAC_O port (i.e., the accumulation data port which is connected to the MAC pipeline—specifically the accumulation data path thereof) to the output data port at the external interface of the NLINKS circuit (via the output data path in the NLINKS circuit—see FIGS. 13B and 13F).

Thus, in this embodiment, the complex output values Y[u+3:u+2]/Z[u+3:u+2] circulate through (e.g., once through) the accumulation ring (see accumulation data path in FIG. 13E), in the accumulation mode, through the MAC_O/MAC_I ports connected to the MAC pipeline and, upon completion of the FIR filter operation (execution sequence) in the output data mode to the output data port (i.e., NLNK_MAC_SO) at the interface of the NLINKS circuit via multiplexer Mux 2 (see output data path in FIG. 13F). As such, this embodiment may provide additional execution efficiency relative to the efficiency of the processing associated with the embodiment of FIG. 5B. Notably, the MAC_SI/MAC_SO paths/ports of the NLINKS circuit (after loading of initial data via the MAC_SI port—see NLINKS(lower) in FIG. 13B and 13D) are not used/employed during the filter processing operation. The MAC_SI/MAC_SO paths/ports at the interfaces of the MAC pipeline and the associated data path in the pipeline are also not used/employed at any time in this embodiment (see, e.g., FIGS. 13B and 14A).

With reference to FIGS. 14A and 14B, in one embodiment, the MAC processor includes a one-cycle delay circuit which may be configured (via the multiplexer) to selectively delay the input data into the multiplier circuit of the associated MAC processor. In operation, the multiplexer of the one-cycle delay circuit may responsively select between input 1 or input 2, a one-cycle delay of input 1 (see FIG. 14B). In one embodiment, the multiplexer may be controlled to select input 2 (incorporating a one-cycle delay into the FIR filtering operations) where the FIR filter and filtering techniques employ complex number data format and complex filter weights (based on values having both real and imaginary number values). Here, in operation, the D_i[p] operand input into the MAC processor includes a one-cycle delay option in the input data path via the D flip/flip and multiplexer. This one-cycle delay circuit may be advantageous to incorporate a one cycle of time delay to D_i[p] for odd processing elements, in the illustrative embodiment p={1,3} which are employed to process the imaginary part of the complex input data value. In this way, the processing of the real and imaginary parts of the complex number are temporally synchronized. Thus, in one embodiment, the one-cycle delay circuit may be configured (via the multiplexer) to selectively delay the input data to temporally synchronize processing of the real and imaginary parts of the complex numbers.

In another embodiment, the multiplexer (mux) of the one-cycle delay circuit of each MAC of the pipeline of the FIR filter may be configured/controlled to select input 1 where the FIR filter and filtering techniques employ real number data format and real filter weights (based on values having only real number values). In this embodiment, the one-cycle delay circuit may be configured (via control of the multiplexer) to only output input 1 (see output of D flip/flop 1) and thereby not employ the one-cycle delayed signal (input 2) introduced by the D flip/flop 2. This configuration may be more appropriate for an FIR filter and filtering techniques employing real number data format and real filter weights (based on values having only real number values) wherein the one cycle of time delay of the D_i[p] for odd processing elements may be employed to process the imaginary part of the complex input data value.

Notably, different or longer delays (relative to a one-cycle delay) may be implemented via, for example, employing one or more additional D flip/flop circuits; as discussed above, in one embodiment, the MAC may include one or more (here, two are illustrated) dedicated memory banks to store at least two different sets of filter weights—each set of filter weights associated with and used in processing a set of data) wherein each memory bank may be alternately read for use in processing a given set of associated data and alternately written after processing the given set of associated data With reference to FIG. 15, exemplary sequencing details for the simplified 2-tap/4-MAC processor embodiment of FIGS. 13B-13H include four sets of blocks (having alternating gray and white color backgrounds (except those blocks that have white text)), with each block consumes or uses 4 pipeline cycles. The accumulation of the Y[3] output is highlighted by white text on a black background in the second block (i.e., the first white block).

The complex input values D[u+3:u+2]/E[u+3:u+2] are read from an external memory and provided to the DI_I port (see "DI_I" column heading) at the left side of the sequencing illustration of FIG. 15. These inputs are serially shifted onto the D_SI[p] bus (see "D_SI[p]" column heading; see also, FIGS. 13H and 13G) across the MAC processors (which may have index p={0,1,2,3}). The two complex input values are parallel-loaded onto the D_i[p] bus (see "D_i[p]" column heading; see also, FIGS. 13H and 13G) across the MAC processors with the control signal LD_D (see "LD_D" column heading) at four-cycle intervals.

During this four cycle interval, the multiplier circuits generates 16 products MULTr[p] (see "MULT_r[p]" column heading) using four static D_i[p] values ("D_i[p]" column heading) and 16 values (filter weights) from the L0 memory D_R[p]. The D_R[p] values include complex filter values F[3:0] and no zero values are employed (compare the sequencing embodiment illustrated in FIG. 12). The accumulation values rotate, traverse or circle the four-processor-element block only once. During the four-cycle block, the multiplier circuits generates 16 products MULT_r[p] ("MULT_r[p]" column heading) generated which are added, via the accumulator circuit, to the MAC_r[p] accumulation values that are rotating or circulating (see "MAC_r[p]" column heading).

The MAC_r[p] accumulation values ("MAC_r[p]" column heading), in this embodiment, are not parallel-loaded onto the MAC_SO[p] bus—rather, the two complex output values Y[u+3:u+2]/Z[u+3:u+2] are output (serially shifted out) on the NMAX_MAC_O port at the interface with the NLINKS circuit. The output data is provided to the output data path, via appropriate control of Mux 2, to the output data port (NLINKS_MAC_SO) of the NLINKS circuit (see, FIGS. 13B and 13F—output data path).

With continued reference to FIG. 15, focusing on the Y[3] output generation (highlighted by white text on a black background), the filter operations start with the block of D[u+3:u+2]/E[u+3:u+2] inputs highlighted by white text on a black background (here, u=0). The D[u+3:u+2]/E[u+3:u+2] inputs are processed in the first four-cycle interval. The four products of D[u+3:u+2]/E[u+3:u+2] and F[1:0]/G[1:0] are formed on the MULT_r[p] bus, and are accumulated on the MAC_r[p] bus on the Y[4] diagonal (highlighted by white text on a black background).

Notably, the D_i[p] nodes that the complex pairs (D[3] and E[3] for example) are offset by one cycle because of the cycle delay introduced by the one-cycle register delay circuit (see FIGS. 14A and 14B). D[3] is static from cycle 9 through 12, and E[3] is static from cycle 10 through 13. This is a consequence of the imaginary value E[3] being transferred before the real value D[3] on the DI_I input bus. Here, the one cycle delay (of the one-cycle delay circuit—see FIGS. 13G, 13H, 14A and 14B) is employed to synchronize the process because both Y[4] and Z[4] diagonals both access the same D[3] and E[3] values. Again, the exemplary configuration of four MAC processors is convenient for the purposes of describing the operation and processing of the NLINKS circuit and MAC processing pipeline as well as exemplary sequencing details of the real FIR filtering process. The present inventions are in no way limited thereto or thereby.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, although many of the embodiments of the present inventions have been described and/or illustrated in the context of the MACs interconnected into a linear processing pipeline wherein the accumulation data values are rotated, transferred or moved through the MACs of the pipeline (see, e.g., FIGS. 1B and 1C), in another set of embodiments, the present inventions may be employed in MACs that are interconnected into a linear processing pipeline wherein the input data values are rotated, transferred or moved through the MACs of the pipeline (before, during or at the completion of an execution cycle of a execution sequence). With reference to FIGS. 17A-17C, in this embodiment, the accumulation values generated by the accumulator circuit of each MAC are maintained, stored or held in the associated MAC, during each execution cycle of the execution sequence (i.e., set of associated execution cycles), of the processing pipeline and used in the accumulation operation of the accumulator circuit of the associated MAC. In this regard, in operation, after input or loading of the initial data input values into the MACs of the linear pipeline, the input data values are rotated, transferred or moved, on a cycle-by-cycle basis, from one MAC of the linear pipeline to the immediately following MAC of the pipeline and employed in the multiply operation of the multiplier circuit of that next MAC of the processing pipeline. As noted above, however, the accumulation values generated by each MAC are maintained, stored or held, during each execution cycle of the execution sequence, in respective MAC and used in the accumulation operation of the associated accumulator circuit (which includes a floating point adder circuit having a single or one stage pipeline) thereof. Thus, in this embodiment, the input data are rotated, transferred or moved, on a cycle-by-cycle basis, from one MAC of the linear pipeline to the immediately following MAC (of the pipeline) whereas, during processing, the accumulation values generated by accumulator circuit of each MAC are not rotated, transferred or moved from one MAC of to the immediately following MAC but are maintained, held or stored in the MAC for use in subsequent processing during the associated execution cycles of the set of execution cycles (i.e., execution sequence). This linear processing pipeline configuration and operation is described and illustrated in U.S. Provisional Patent Application No. 63/156,263 (filed Mar. 3, 2021), which is hereby incorporated by reference herein. For the avoidance of doubt, all of the embodiments described and/or illustrated herein may be employed in the connection with the MAC processor configured in a linear processing pipeline configuration whereby the input values (D) are rotated among the MAC processors.

In addition, as noted above, the embodiment of FIG. 8A may be expanded to more than two NLINKS circuit—MAC pipeline pairs. For example, where the embodiment includes three NLINKS circuits (and associated pipelines), the NLINKS circuits may be configured as in FIGS. 8B, 8C and 18 wherein the NLINKS circuit illustrated in FIG. 18 may be disposed between the NLINKS circuits illustrated in FIG. 8B and FIG. 8C. (See FIG. 5C in U.S. Non-Provisional application Ser. No. 17/212,411). In operation, the final accumulation data generated by the MAC pipeline of FIG. 8B may be provided or output, as initial data or initial accumulation data, to the MAC pipeline (i.e., MAC pipeline 3) of FIG. 18, via the output data port and output data path of NLINKS circuit of FIG. 8B (see, NLINKS(upper)) and input ports and input path of NLINKS circuit (NLINKS 3) of FIG. 18 (see NLINKS(lower)). Similarly, the final accumulation data generated by the MAC pipeline of FIG. 18 may be provided or output, as initial data or initial accumulation data, to the MAC pipeline of FIG. 8C, via the output data port and output data path of NLINKS circuit of FIG. 18 (see NLINKS(upper)) and input ports and input path of NLINKS circuit of FIG. 8C (see NLINKS(lower)). In this way, the NLINKS circuit—MAC pipeline pair of FIG. 18 is disposed or sandwiched between the NLINKS circuit—MAC pipeline pairs of FIGS. 8B and 8C. Of course, this embodiment may be extended or expanded to more than three NLINKS circuit—MAC pipeline pairs (e.g., 4, 5, 6, 7, 8, etc. NLINKS circuit—MAC pipeline pairs).

Further, the exemplary MAC or MAC processor, including a delay circuit (e.g., a one-cycle delay circuit), illustrated in FIGS. 14A and 14B may be implemented in any of the pipelines/architectures described and/or illustrated herein. For the sake of brevity, such embodiments are not separately discussed, separately illustrated herein and/or separately restated in the context of MACs and MAC processors as illustrated in FIGS. 14A and 14B. As mentioned above, the multiplexer of the one-cycle delay circuit may responsively select between input 1 or input 2, a one-cycle delay of input 1 (see FIG. 14B). In one embodiment, the multiplexer (mux) of the one-cycle delay circuit of each MAC of the pipeline of the FIR filter may be configured/controlled to select input 1 where the FIR filter and filtering techniques employ real number data format and real filter weights (based on values having only real number values) and, in contrast, select input 2 (incorporating a one-cycle delay into the FIR filtering operations) where the FIR filter and filtering techniques employ complex number data format and complex filter weights (based on values having both real and imaginary number values). Notably, certain of the signal/control lines between the control/configure or NLINKS circuit and the MAC pipeline have been omitted for purposes of clarity.

Further, the size or length of the overall, complete or combined MAC pipeline is configurable via configuring the NLINKS circuits to incorporate or connect each of the associated plurality of multiplier-accumulator circuits into an overall, larger, combined or composite pipeline (which is a combination of all of the pipelines associated with the connected NLINKS circuits). That is, the MAC processing or execution pipeline may be any size or length (e.g., 16, 32, 64, 96 or 128 multiplier-accumulator circuits). Indeed, the size or length of the pipeline may be configurable or programmable (e.g., one-time or multiple times—such as, in situ (i.e., during operation of the integrated circuit) and/or at or during power-up, start-up, initialization, re-initialization, configuration, re-configuration or the like). For example, the multiplier-accumulator circuits may be interconnected into execution or processing pipelines as described and/or illustrated in U.S. Non-Provisional application Ser. No. 17/212,411 and U.S. Provisional Application No. 63/012,111; as noted above, these applications are incorporated by reference herein in their entirety. In one embodiment, the circuitry configures and controls a plurality of separate multiplier-accumulator circuits or rows/banks of interconnected (in series) multiplier-accumulator circuits (referred to, at times, as clusters) to pipeline multiply and accumulate operations.

Moreover, the interconnection of the pipeline or pipelines are configurable or programmable to provide different forms of pipelining. (See, e.g., the '411 and '111 applications). Here, the pipelining architecture provided by the interconnection of the plurality of multiplier-accumulator circuits may be controllable or programmable. In this way, a plurality of multiplier-accumulator circuits may be configured and/or re-configured to form or provide the desired processing pipeline(s) to FIR filter process data (e.g., image data). For example, with reference to the '411 and '111 applications, in one embodiment, control/configure circuitry may configure or determine the multiplier-accumulator circuits, or rows/banks of interconnected multiplier-accumulator circuits are connected (in series) to perform the multiply and accumulate operations and/or the linear pipelining architecture or configuration implemented via connection of multiplier-accumulator circuits (or rows/banks of interconnected multiplier-accumulator circuits). Thus, in one embodiment, the control/configure circuitry configures or implements an architecture of the execution or processing pipeline by controlling or providing connection(s) between multiplier-accumulator circuits and/or rows of interconnected multiplier-accumulator circuits.

In one embodiment, all of the MAC pipelines of a given cluster are incorporated in the circular-shifting-path or ring architecture via configuration of the associated NLINKS circuits. Thus, the extent of the filtering and the number of filter taps (e.g., number of multiplier-accumulator circuits interconnected to implement or perform the multiply and accumulate operations) may be adjusted (i.e., increased or decreased), for example, in situ (i.e., during operation of the integrated circuit), for example, to meet FIR filtering design, requirements or constraints (e.g., temporal-based requirements of system performance) via configuration of the NLINKS circuits. Indeed, in one embodiment, the rows of multiplier-accumulator circuits may be connected or disconnected to adjust the extent or length of the concatenation (i.e., increase or decrease the number of multiplier-accumulator circuits interconnected to perform the multiply and accumulate operations in, e.g., the execution or processing pipeline) via control of circuitry (e.g., multiplexers) in NLINKS circuits associated with rows of multiplier-accumulator circuits. (See, e.g., U.S. patent application Ser. No. 16/545,345 (FIGS. 7A-7C, and the text associated therewith) and U.S. Provisional Patent Application No. 62/725,306 (FIGS. 6A-6C, and the text associated therewith).

Notably, although many of the embodiments described and illustrated herein connect or configure adjacent NLINKS circuits in relation to forming or providing a larger execution pipeline (relative to the pipeline associated with one NLINKS circuit), the embodiments may connect non-adjacent NLINKS circuits (and, by extension non-adjacent rows of multiplier-accumulator circuits) to facilitate pipelining processing and provide a concatenation architecture; for example, route selection circuitry (e.g., multiplexer(s)) of the NLINKS interface connector may be configured to connect the output of last multiplier-accumulator circuit of a row of multiplier-accumulator circuits to an input of a first multiplier-accumulator circuit of one or more different rows (adjacent and/or non-adjacent) of multiplier-accumulator circuits. For the avoidance of doubt, all of the embodiments described and illustrated herein may be implemented via non-adjacent NLINKS circuits (and, by extension non-adjacent rows of multiplier-accumulator circuits)—however, for the sake of brevity, such embodiments will not be illustrated or separately restated in the context of non-adjacent NLINKS circuits and non-adjacent rows of multiplier-accumulator circuits.

Notably, the MAC processing pipelines or architectures, and circuitry to configure and control such pipelines/architectures, of the present inventions may employ or implement the concurrent and/or parallel processing techniques, architectures, pipelines, and configurations described and/or illustrated in U.S. patent application Ser. No. 16/816,164, entitled "Multiplier-Accumulator Processing Pipelines and Processing Component, and Methods of Operating Same", filed Mar. 11, 2020) and U.S. Provisional Patent Application No. 62/831,413, entitled "Multiplier-Accumulator Circuitry and System having Processing Pipeline and Methods of Operating and Using Same", filed Apr. 9, 2019). Here, the control/configure circuitry may be programmed to configure the pipelines to implement the concurrent and/or parallel processing techniques to, for example, increase the throughput of the FIR filtering; such applications are hereby incorporated by reference herein in their entirety.

Moreover, the MAC processing pipelines or architectures, and circuitry to configure and control such pipelines/architectures, of the present inventions may employ or implement the circuitry to configure the granularity of the processing and/or output of the multiplier-accumulator circuitry (and methods of operating and configuring such circuitry) including one or more multiplier-accumulator circuit execution or processing pipelines (e.g., pipeline(s) having linear architectures) described and/or illustrated in U.S. patent application Ser. No. 17/376,415, entitled "MAC Processing Pipelines having Programmable Granularity, and Methods of Operating Same", filed Jul. 15, 2021). Here, the granularity of the processing and/or output may be programmed to, for example, implement predetermined FIR filtering techniques and characteristics. The '415 application is hereby incorporated by reference herein in its entirety.

Importantly, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Further, although the memory cells in certain embodiments are illustrated as static memory cells or storage elements, the present inventions may employ dynamic or static memory cells or storage elements. Indeed, as stated above, such memory cells may be latches, flip/flops or any other static/dynamic memory cell or memory cell circuit or storage element now known or later developed.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

The terms "comprises," "comprising," "includes," "including," "have," and "having" or any other variation thereof, are intended to cover a non-exclusive inclusion, such that a process, method, circuit, article, or apparatus that comprises a list of parts or elements does not include only those parts or elements but may include other parts or elements not expressly listed or inherent to such process, method, article, or apparatus. Further, use of the terms "connect", "connected", "connecting" or "connection" herein should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "a" and "an" herein do not denote a limitation of quantity, but rather denote the presence of at least one of the referenced item. Further, the terms "first," "second," and the like, herein do not denote any order, quantity, or importance, but rather are used to distinguish one element/circuit/feature from another.

In addition, the term "integrated circuit" means, among other things, any integrated circuit including, for example, a generic or non-specific integrated circuit, processor, controller, state machine, gate array, SoC, PGA and/or FPGA. The term "integrated circuit" also means, for example, a processor, controller, state machine and SoC—including an embedded FPGA. Further, as noted above, the term "port" is a physical point of entry to/exit; all physical forms of entry to or exit from, for example, the control/configure or NLINKS circuit, are intended to fall within the scope of the present invention (for example, a conductor or metal routing in/of an integrated circuit).

Further, the term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Notably, the term "MAC circuit" means a multiplier-accumulator circuit of the multiplier-accumulator circuitry of the multiplier-accumulator pipeline. For example, a multiplier-accumulator circuit is described and illustrated in the exemplary embodiment of FIGS. 1A-1C of U.S. patent application Ser. No. 16/545,345, and the text associated therewith. In the claims, the term "MAC circuit" means a multiply-accumulator circuit, for example, like that described and illustrated in the exemplary embodiment of FIGS. 1A-1C, and the text associated therewith, of U.S. patent application Ser. No. 16/545,345. Notably, however, the term "MAC circuit" is not limited to the particular circuit, logical, block, functional and/or physical diagrams, block/data width, data path width, bandwidths, and processes illustrated and/or described in accordance with, for example, the exemplary embodiment of FIGS. 1A-1C of U.S. patent application Ser. No. 16/545,345.

In the claims, "row" means row, column, and/or row and column. For example, in the claims, a "row of MAC circuits" means (i) a row of MAC circuits, (ii) a column of MAC circuits and/or (iii) a row of MAC circuits and a column of MAC circuits—all of which are intended to fall within the meaning of row of MAC circuits in connection with the scope of the claim. In the claims, "column" means column, row, and/or column and row. For example, in the claims, a "column of control/configure circuits" means (i) a column of control/configure circuits, (ii) a row of control/configure circuits and/or (iii) a column of control/configure circuits and a row of control/configure circuits—all of which are intended to fall within the meaning of column of control/configure circuits in connection with the scope of the claim.

Notably, the limitations of the claims are not written in means-plus-function format or step-plus-function format. It is applicant's intention that none of the limitations be interpreted pursuant to 35 USC §112, ¶6 or §112(f), unless such claim limitations expressly use the phrase "means for" or "step for" followed by a statement of function and is void of any specific structure.

Again, there are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations.

What is claimed is:

1. An integrated circuit comprising:
a plurality MAC pipelines wherein each MAC pipeline includes: (i) a plurality of multiplier-accumulator circuits connected in series to perform a plurality of concatenated multiply and accumulate operations and (ii) a plurality of data paths including an accumulation data path, and wherein each multiplier-accumulator circuit of the plurality of multiplier-accumulator circuits of each MAC pipeline includes:
  a multiplier to multiply first data by multiplier weight data and generate product data, and
  an accumulator, coupled to the multiplier of the associated multiplier-accumulator circuit, to add second data and the product data of the associated multiplier to generate sum data;
a plurality of control/configure circuits, wherein each control/configure circuit connects directly to and is associated with one of the MAC pipelines, wherein each control/configure circuit includes a plurality of configurable data paths including:
  an accumulation data path which is configurable to directly connect to an input and an output of the accumulation data path of the associated MAC pipeline to form an accumulation ring when the associated control/configure circuit is configured in an accumulation mode, and
  an output data path which is configurable to directly connect to the output of the accumulation data path of the associated MAC pipeline to receive final accumulation data from the associated MAC pipeline when the associated control/configure circuit is configured in an output data mode.

2. The integrated circuit of claim 1 wherein:
each control/configure circuit includes: (a) a first output data port disposed at a first interface of the associated control/configure circuit, (b) a second output data port disposed at a second interface of the associated control/configure circuit wherein the second interface is an interface with the associated MAC pipeline, and (c) a first multiplexer having:
  a first input directly connected to the second output data port,
  a second input connected to the output of the accumulation data path of the associated MAC pipeline, and
  and an output connected to the output data path of the associated control/configure circuit; and
the first multiplexer responsively connects the second input of the first multiplexer, and the output of the accumulation data path of the associated MAC pipeline, to the output of the first multiplexer when the associated control/configure circuit is configured in the output data mode.

3. The integrated circuit of claim 2 wherein:
the plurality of configurable data paths of each control/configure circuit further includes an input path configurable to connect to the accumulation data path of the associated MAC pipeline to input initial values into the plurality of multiplier-accumulator circuits of the associated MAC pipeline when the associated control/configure circuit is configured in a data load mode.

4. The integrated circuit of claim 3 wherein:
each control/configure circuit includes: (a) an input port disposed at the first interface of the associated control/configure circuit, (b) a first accumulation data port connected to an input of the accumulation data path of the associated MAC pipeline and disposed at the second interface of the associated control/configure circuit, and (c) a second multiplexer having:
  a first input connected to the accumulation data path of the control/configure circuit,
  a second input connected to an input path of the control/configure circuit, and
  an output connected to the input of the accumulation data path of the associated MAC pipeline; and
the second multiplexer responsively connects the second input of the second multiplexer, and the input path of the associated MAC pipeline, to the output of the second multiplexer when the associated control/configure circuit is configured in the data load mode.

5. The integrated circuit of claim 4 wherein:
the second multiplexer responsively connects the first input, and the accumulation data path of the associated MAC pipeline, to the output of the second multiplexer when the associated control/configure circuit is configured in the accumulation mode.

6. The integrated circuit of claim 5 wherein:
the first multiplexer responsively connects the first input, and the accumulation data path of the associated MAC pipeline, to the output of the second multiplexer when the associated control/configure circuit is configured in an accumulation mode.

7. The integrated circuit of claim 1 further including:
configurable processing circuitry, coupled to the output data path of at least one control/configure circuit, wherein the configurable processing circuitry is programmable to receive and post-process the final accumulation data from the MAC pipeline which is associated with the at least one control/configure circuit.

8. An integrated circuit comprising:
a plurality MAC pipelines wherein each MAC pipeline includes: (i) a plurality of multiplier-accumulator circuits connected in series to perform a plurality of concatenated multiply and accumulate operations and (ii) a plurality of data paths including an accumulation data path, and wherein each multiplier-accumulator circuit of the plurality of multiplier- accumulator circuits of each MAC pipeline includes:
  a multiplier to multiply first data by multiplier weight data and generate product data, and
  an accumulator, coupled to the multiplier of the associated multiplier-accumulator circuit, to add second data and the product data of the associated multiplier to generate sum data;
a plurality of control/configure circuits, wherein each control/configure circuit connects directly to and is associated with one of the MAC pipelines, wherein each control/configure circuit includes a plurality of configurable data paths including:
  an input path configurable to connect to the accumulation data path of the associated MAC pipeline when the associated control/configure circuit is configured in a data load mode, and
  an accumulation data path configurable to connect to an input and an output of the accumulation data path of the associated MAC pipeline to form an accumulation ring when the associated control/configure circuit is configured in an accumulation mode.

9. The integrated circuit of claim 8 wherein:
each control/configure circuit further includes a first multiplexer having:
  a first input connected to the accumulation data path of the control/configure circuit, a second input connected to the input path of the control/configure circuit, and an output connected to the input of the accumulation data path of the associated MAC pipeline; and the first multiplexer responsively connects the second input, and the input path of the associated control/configure circuit, to the output of the first multiplexer when the associated control/configure circuit is configured in the data load mode.

10. The integrated circuit of claim 9 wherein:
when the control/configure circuit is configured in the data load mode, the associated MAC pipeline receives initial values via the input path of the associated control/configure circuit.

11. The integrated circuit of claim 10 wherein:
the initial values are partial accumulation values.

12. The integrated circuit of claim 9 wherein:
the first multiplexer responsively connects the first input of the first multiplexer, and the accumulation data path of the associated control/configure circuit, to the output of the first multiplexer when the associated control/configure circuit is configured in an accumulation mode.

13. The integrated circuit of claim 8 wherein:
the plurality of configurable data paths of each control/configure circuit further includes:
an output data path is configurable to directly connect to the output of the accumulation data path of the associated MAC pipeline to receive final accumulation data from the associated MAC pipeline when the associated control/configure circuit is configured in an output data mode.

14. The integrated circuit of claim 13 further including:
configurable processing circuitry, coupled to the output data path of at least one control/configure circuit, wherein the configurable processing circuitry is programmable to receive and post-process the final accumulation data from the MAC pipeline which is associated with the at least one control/configure circuit.

* * * * *